United States Patent
Sugizaki et al.

(10) Patent No.: US 9,419,192 B2
(45) Date of Patent: Aug. 16, 2016

(54) COMPOSITE RESIN AND ELECTRONIC DEVICE

(71) Applicant: Kabushiki Kaisha Toshiba, Minato-ku (JP)

(72) Inventors: Yoshiaki Sugizaki, Fujisawa (JP); Akihiro Kojima, Nonoichi (JP); Hideto Furuyama, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/482,451

(22) Filed: Sep. 10, 2014

(65) Prior Publication Data

US 2015/0097208 A1     Apr. 9, 2015

(30) Foreign Application Priority Data

Oct. 3, 2013   (JP) .................... 2013-208576
Sep. 5, 2014   (JP) .................... 2014-181657

(51) Int. Cl.
*H01L 23/60*       (2006.01)
*H01L 33/56*       (2010.01)
(Continued)

(52) U.S. Cl.
CPC . *H01L 33/56* (2013.01); *C08K 3/22* (2013.01); *H01C 7/105* (2013.01); *H01C 7/112* (2013.01); *H01L 23/60* (2013.01); *H01L 24/19* (2013.01); *H01L 24/96* (2013.01); *H01L 27/15* (2013.01); *H01L 33/26* (2013.01); *H01L 33/382* (2013.01); *H01L 33/62* (2013.01); *C08K 2003/2296* (2013.01); *H01L 25/167* (2013.01); *H01L 33/486* (2013.01); *H01L 2224/32245* (2013.01); *H01L 2224/48091* (2013.01); *H01L 2224/48247* (2013.01); *H01L 2224/49107* (2013.01); *H01L 2224/73265* (2013.01);
(Continued)

(58) Field of Classification Search
CPC ....................... H01L 23/60; H01L 27/0248
See application file for complete search history.

(56) References Cited

U.S. PATENT DOCUMENTS

| 6,469,611 B1 | 10/2002 | Kluge-Weiss et al. |
| 2003/0010960 A1 | 1/2003 | Greuter et al. |

(Continued)

FOREIGN PATENT DOCUMENTS

| CA | 1 096 051 A1 | 2/1981 |
| EP | 1 585 146 A1 | 10/2005 |

(Continued)

OTHER PUBLICATIONS

Partial European Search Report issued Feb. 5, 2015 in Patent Application No. 14184230.2.

(Continued)

*Primary Examiner* — Thao X Le
*Assistant Examiner* — Laura Dykes
(74) *Attorney, Agent, or Firm* — Oblon, McClelland, Maier & Neustadt, L.L.P.

(57) ABSTRACT

According to one embodiment, a composite resin includes a resin component; and a plurality of first powder bodies dispersed in the resin component. Each of the first powder bodies has a nonlinear current-voltage characteristic having a decreasing resistance as a voltage increases. The first powder body is a polycrystalline powder body including a plurality of primary particles bound via a grain boundary. A component different from a major component of the primary particles exists in a higher concentration in the grain boundary than in an interior of the primary particles.

16 Claims, 44 Drawing Sheets

(51) Int. Cl.
    *C08K 3/22*     (2006.01)
    *H01C 7/112*     (2006.01)
    *H01L 33/26*     (2010.01)
    *H01L 33/38*     (2010.01)
    *H01L 33/62*     (2010.01)
    *H01L 27/15*     (2006.01)
    *H01L 23/00*     (2006.01)
    *H01C 7/105*     (2006.01)
    *H01L 25/16*     (2006.01)
    *H01L 33/48*     (2010.01)

(52) U.S. Cl.
    CPC ............... *H01L 2924/12035* (2013.01); *H01L 2924/12042* (2013.01); *H01L 2924/181* (2013.01)

(56) References Cited

U.S. PATENT DOCUMENTS

| | | |
|---|---|---|
| 2004/0125838 A1 | 7/2004 | Liu et al. |
| 2005/0141166 A1* | 6/2005 | Katsumura .......... H01C 7/1006 361/118 |
| 2005/0184387 A1 | 8/2005 | Collins, III et al. |
| 2007/0297108 A1 | 12/2007 | Collins, III et al. |
| 2008/0210911 A1* | 9/2008 | Yoshida et al. ............... 252/513 |
| 2009/0212319 A1* | 8/2009 | Muraki et al. ................ 257/103 |
| 2009/0256669 A1 | 10/2009 | Kosowsky et al. |
| 2011/0298001 A1 | 12/2011 | Akimoto et al. |
| 2012/0140375 A1* | 6/2012 | Kim .......................... H01B 1/22 361/301.4 |
| 2013/0313590 A1 | 11/2013 | Akimoto et al. |

FOREIGN PATENT DOCUMENTS

| | | |
|---|---|---|
| EP | 2 124 233 A1 | 11/2009 |
| EP | 2 667 424 A1 | 11/2013 |
| JP | 2004-119840 A | 4/2004 |
| JP | 2011-159951 A | 8/2011 |
| JP | 2012-23328 A | 2/2012 |
| KR | 10-2011-0086047 A | 7/2011 |
| TW | 200541108 A | 12/2005 |
| TW | 200901237 A | 1/2009 |
| TW | I377692 B | 11/2012 |
| WO | WO 97/26693 A1 | 7/1997 |
| WO | WO 2008/054308 A1 | 5/2008 |

OTHER PUBLICATIONS

D. Fernandez-Hevia, et al., "Wide range dielectric spectroscopy of ZnO-based varistors as a function of sintering time" Journal of the European Ceramic Society, vol. 24. No. 6, XP004485349, 2004, pp. 1205-1208.

Extended European Search Report issued May 6, 2015 in Patent Application No. 14184230.2.

Office Action issued Dec. 8, 2015, in Taiwanese Patent Application No. 103132615, w/English-language Translation.

Korean Office Action issued in Korean Patent Application No. 10-2014-0131303 on Nov. 17, 2015 with English Translation.

* cited by examiner

```
MIX SOURCE
MATERIAL POWDERS
      ↓
     DRY
      ↓
     FORM
      ↓
   PULVERIZE
      ↓
FIRE BY SCATTERING IN VAPOR
      ↓
   SURFACE
   CLEANING
```

FIG. 7

COMPOSITE RESIN AND ELECTRONIC DEVICE

CROSS-REFERENCE TO RELATED APPLICATION

This application is based upon and claims the benefit of priority from Japanese Patent Application No. 2013-208576, filed on Oct. 3, 2013, and Japanese patent Application No. 2014-181657, filed on Sep. 5, 2014; the entire contents of which are incorporated herein by reference.

FIELD

Embodiments described herein relate generally to a composite resin and an electronic device.

BACKGROUND

Although various structures for protecting electronic devices such as, for example, LEDs (Light Emitting Diodes), etc., from ESD (Electro Static Discharge) have been proposed, it is particularly desirable to provide ESD immunity without impeding the downsizing for electronic devices having chip size package structures.

BRIEF DESCRIPTION OF THE DRAWINGS

FIG. 6 to FIG. 8 are flowcharts showing a method for manufacturing first powder bodies.

DETAILED DESCRIPTION

Figure 1A:
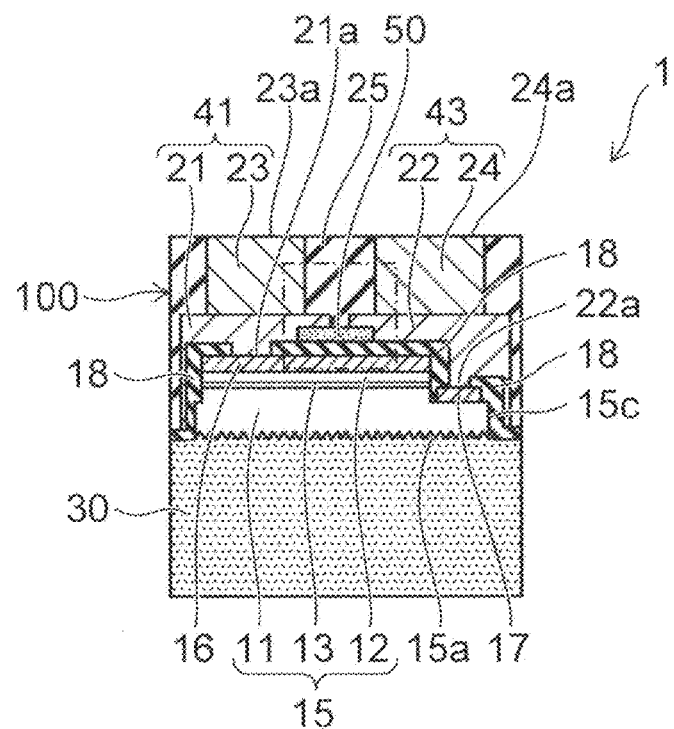
FIG. 1A to FIG. 5 are schematic cross-sectional views of a semiconductor light emitting device of a first embodiment.

According to one embodiment, a composite resin includes a resin component; and a plurality of first powder bodies dispersed in the resin component. The first powder bodies have a nonlinear current-voltage characteristic having a decreasing resistance as a voltage increases. Each of the first powder bodies is a polycrystalline powder body including a plurality of primary particles bound via a grain boundary. A component different from a major component of the primary particles exists in a higher concentration in the grain boundary than in an interior of the primary particles.

Embodiments will now be described with reference to the drawings. Similar components in the drawings are marked with like reference numerals.

First Embodiment

In a first embodiment, a semiconductor light emitting device (an LED device) is described as an example of an electronic device.

FIG. 1A is a schematic cross-sectional view of the semiconductor light emitting device 1 of the first embodiment.

The semiconductor light emitting device 1 includes a semiconductor layer 15 that includes a light emitting layer 13. The semiconductor layer 15 has a first surface 15a, and a second surface on the side opposite to the first surface 15a. The second surface side is patterned into a mesa configuration.

The second surface of the semiconductor layer 15 includes a portion (a light emitting region) including the light emitting layer 13 and a portion (a non-light emitting region) not including the light emitting layer 13. The portion including the light emitting layer 13 is a portion of the semiconductor layer 15 in which the light emitting layer 13 is stacked. The portion not including the light emitting layer 13 is a portion of the semiconductor layer 15 in which the light emitting layer 13 is not stacked. The portion including the light emitting layer 13 is the light emitting region and is a region that has a stacked structure including the light emitting layer 13 and is configured such that the light emitted by the light emitting layer 13 can be extracted to the outside.

Figure 10A:
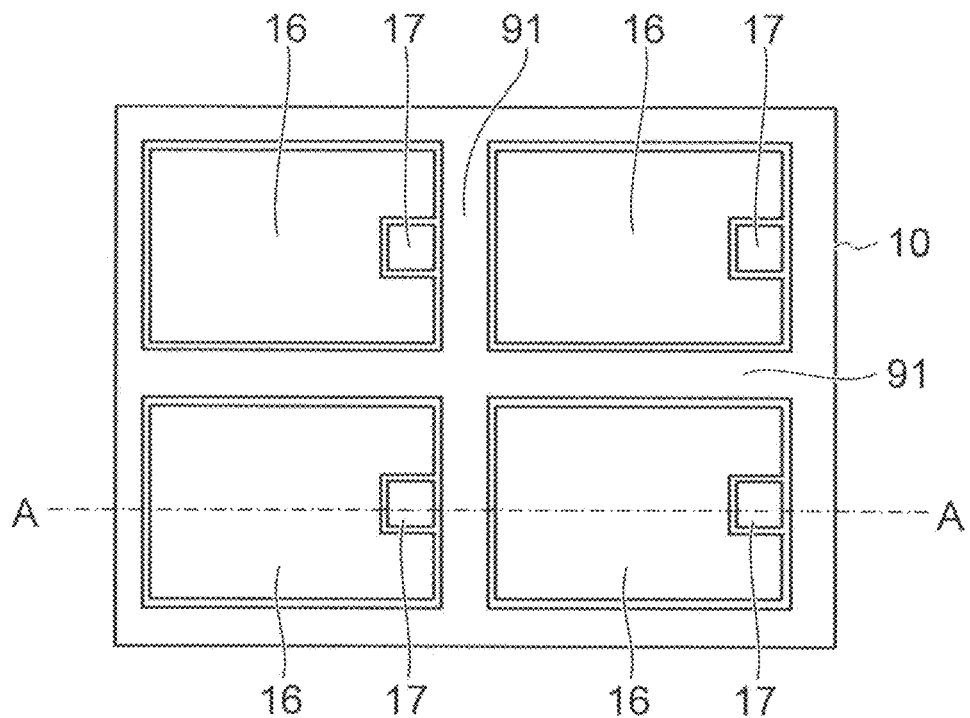

On the second surface side, a p-side electrode 16 is provided as a first electrode on the portion including the light emitting layer 13; and an n-side electrode 17 is provided as a second electrode on the portion not including the light emitting layer. For example, when viewed in plan as shown in FIG. 10A, the n-side electrode 17 has a quadrilateral configuration and is surrounded on three sides with the p-side electrode 16. The planar layout of the p-side electrode 16 and the n-side electrode 17 is not limited to the example shown in FIG. 10A.

The light emitting layer 13 emits light by a current being supplied to the light emitting layer 13 via the p-side electrode 16 and the n-side electrode 17. Then, the light that is radiated from the light emitting layer 13 is emitted outside the semiconductor light emitting device 1 from the first surface 15a side.

As shown in FIG. 1A, a support body 100 is provided on the second surface side of the semiconductor layer 15. The LED chip that includes the semiconductor layer 15, the p-side electrode 16, and the n-side electrode 17 is supported by the support body 100 provided on the second surface side.

For example, a fluorescer layer 30 is provided on the first surface 15a side of the semiconductor layer 15 as an optical layer that provides the desired optical characteristics to the light emitted by the semiconductor light emitting device 1. The fluorescer layer 30 includes multiple fluorescers. The fluorescers are excited by the radiated light of the light emitting layer 13 to radiate light of a wavelength different from that of the radiated light of the light emitting layer 13.

The multiple fluorescers are formed in a single body with a binder. The binder transmits the radiated light of the light emitting layer 13 and the radiated light of the fluorescers. Herein, "transmitting" is not limited to the transmittance being 100% and includes the case where a portion of the light is absorbed.

The semiconductor layer 15 includes a first semiconductor layer 11, a second semiconductor layer 12, and the light emitting layer 13. The first semiconductor layer 11 and the second semiconductor layer 12 include, for example, gallium nitride (GaN).

The first semiconductor layer 11 includes, for example, a foundation buffer layer and an n-type GaN layer. The second semiconductor layer 12 includes, for example, a p-type GaN layer. The light emitting layer 13 includes a material that emits blue light, violet light, bluish-violet light, ultraviolet light, etc. The light emission peak wavelength of the light emitting layer 13 is, for example, 430 to 470 nm.

The second surface of the semiconductor layer 15 is patterned into an uneven configuration. The protruding portion of the uneven configuration is the portion including the light emitting layer 13; and the recessed portion of the uneven configuration is the portion not including the light emitting layer 13. The surface of the portion including the light emitting layer 13 is the surface of the second semiconductor layer 12; and the p-side electrode 16 is provided on the surface of the second semiconductor layer 12. The surface of the portion not including the light emitting layer 13 is the surface of the first semiconductor layer 11; and the n-side electrode 17 is provided on the surface of the first semiconductor layer 11.

For example, at the second surface of the semiconductor layer 15, the surface area of the portion including the light emitting layer 13 is greater than the surface area of the portion not including the light emitting layer 13. Also, the surface area of the p-side electrode 16 provided on the surface of the portion including the light emitting layer 13 is greater than the surface area of the n-side electrode 17 provided on the surface of the portion not including the light emitting layer 13. Thereby, a wide light emitting surface is obtained; and the light output can be high.

An insulating film 18 is provided as a first insulating film on the second surface side of the semiconductor layer 15. The insulating film 18 covers and protects the second surface of the semiconductor layer 15, the p-side electrode 16, and the n-side electrode 17. The insulating film 18 is, for example, an inorganic insulating film such as a silicon oxide film, etc.

The insulating film 18 is provided also on the side surface of the light emitting layer 13 and the side surface of the second semiconductor layer 12 to cover and protect the side surface of the light emitting layer 13 and the side surface of the second semiconductor layer 12.

The insulating film 18 is provided also on a side surface 15c of the semiconductor layer 15 (the side surface of the first semiconductor layer 11) continuing from the first surface 15a to cover and protect the side surface 15c.

The insulating film 18 is provided also in the region around the side surface 15c of the semiconductor layer 15. The insulating film 18 that is provided in the region around the side surface 15c at the first surface 15a side extends away from the side surface 15c (toward the outside of the semiconductor light emitting device 1).

A p-side interconnect layer 21 is provided as a first interconnect layer on the insulating film 18, and an n-side interconnect layer 22 is provided as a second interconnect layer on the insulating film 18 such that the p-side interconnect layer 21 and the n-side interconnect layer 22 are separated from each other.

Figure 11A:
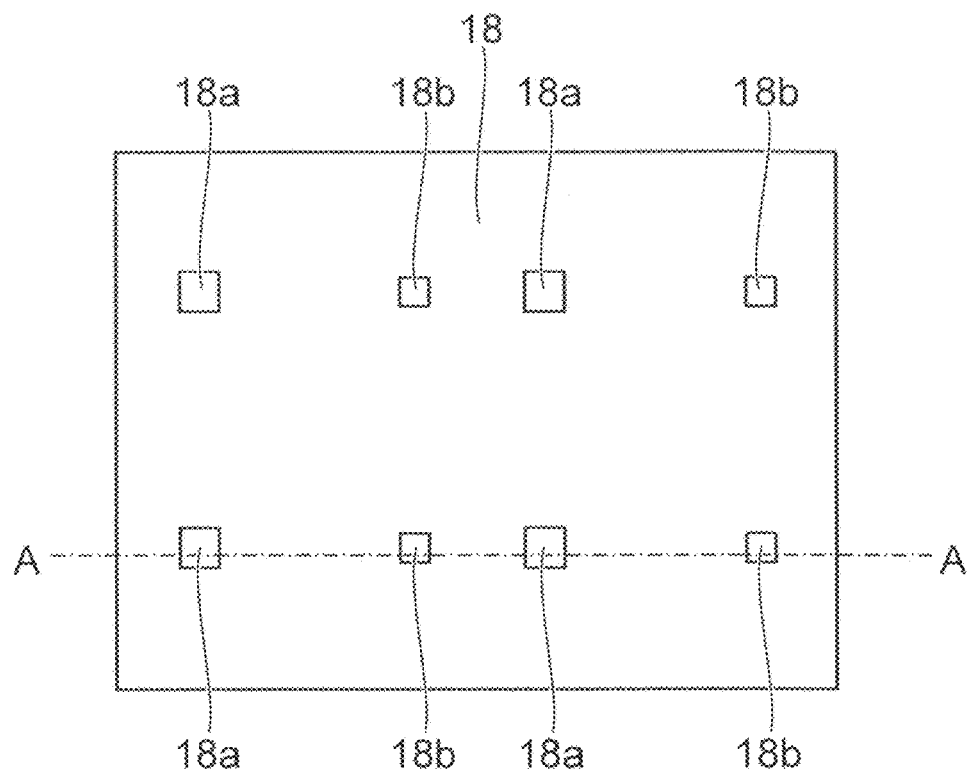
Figure 11B:
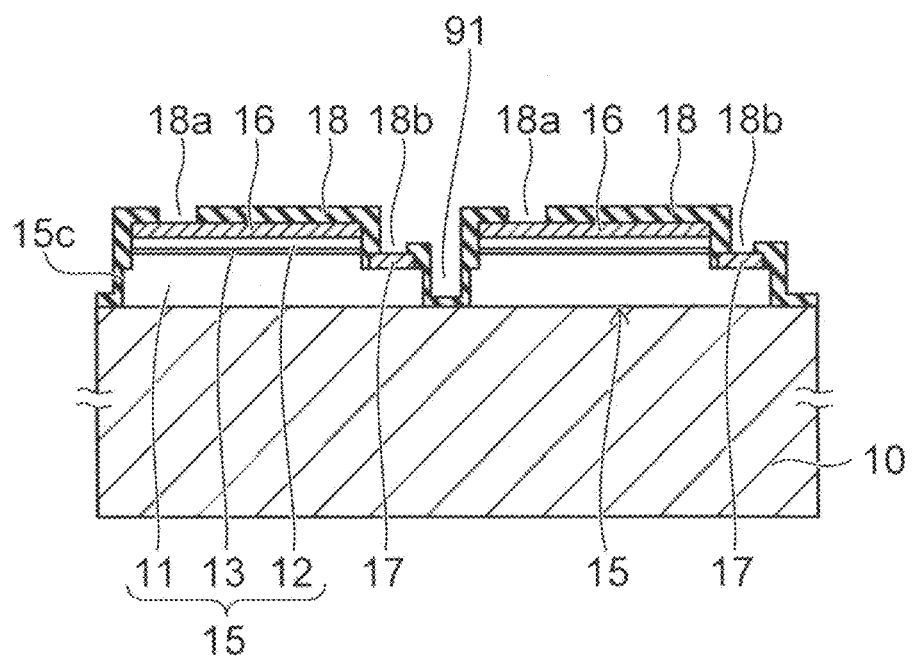

As shown in FIGS. 11A and 11B, a first opening 18a that communicates with the p-side electrode 16 and a second opening 18b that communicates with the n-side electrode 17 are made in the insulating film 18. The first opening 18a may be multiply made.

The p-side interconnect layer 21 is provided on the insulating film 18 and in the interior of the first opening 18a. The p-side interconnect layer 21 is electrically connected to the p-side electrode 16 by a via 21a provided inside the first opening 18a. The n-side interconnect layer 22 is provided on the insulating film 18 and in the interior of the second opening 18b. The n-side interconnect layer 22 is electrically connected to the n-side electrode 17 by a via 22a provided inside the second opening 18b.

The p-side interconnect layer 21 and the n-side interconnect layer 22 include copper films formed simultaneously by, for example, plating on a common foundation metal film.

Figure 14A:
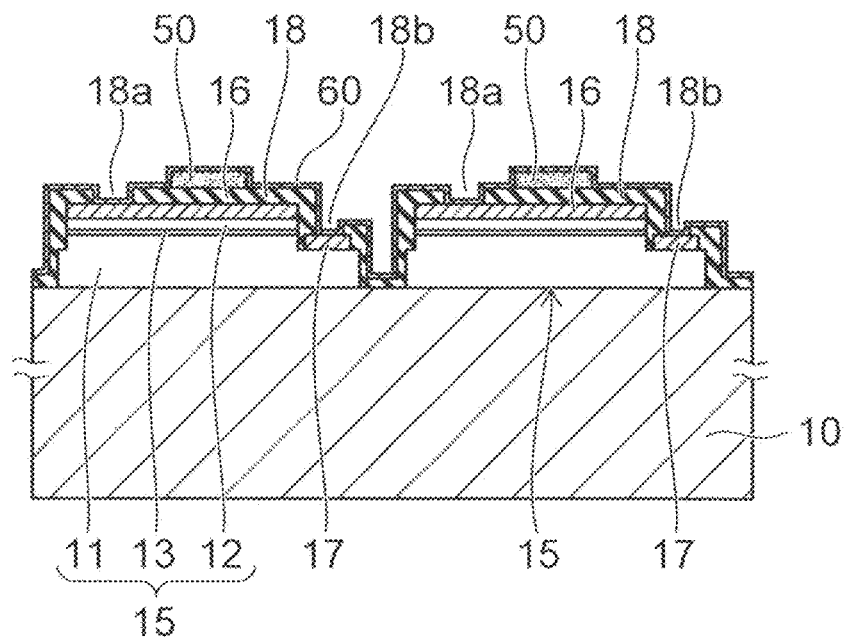
Figure 14B:
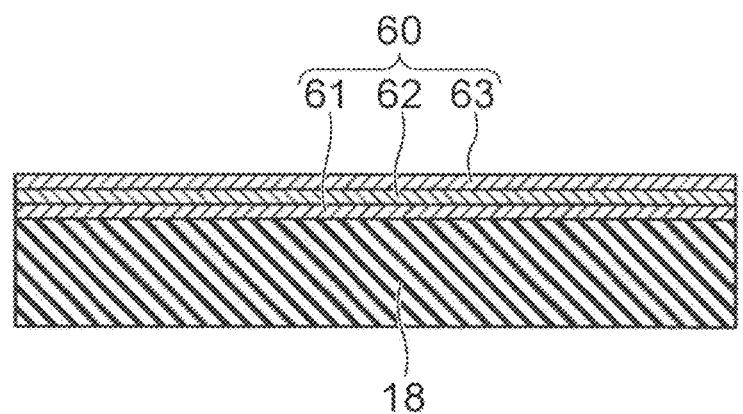

FIG. 14B is a schematic cross-sectional view of a foundation metal film 60.

For example, the copper films of the p-side interconnect layer 21 and the n-side interconnect layer 22 are formed by plating on the foundation metal film 60 formed on the insulating film 18. The p-side interconnect layer 21 and the n-side interconnect layer 22 also include the foundation metal film 60.

The foundation metal film 60 includes an aluminum (Al) film 61, a titanium (Ti) film 62, and a copper (Cu) film 63 stacked in order from the insulating film 18 side.

The aluminum film 61 functions as a reflective film; and the copper film 63 functions as a seed layer of the plating. The titanium film 62, which has excellent wettability for both aluminum and copper, functions as an adhesion layer.

Figure 15A:
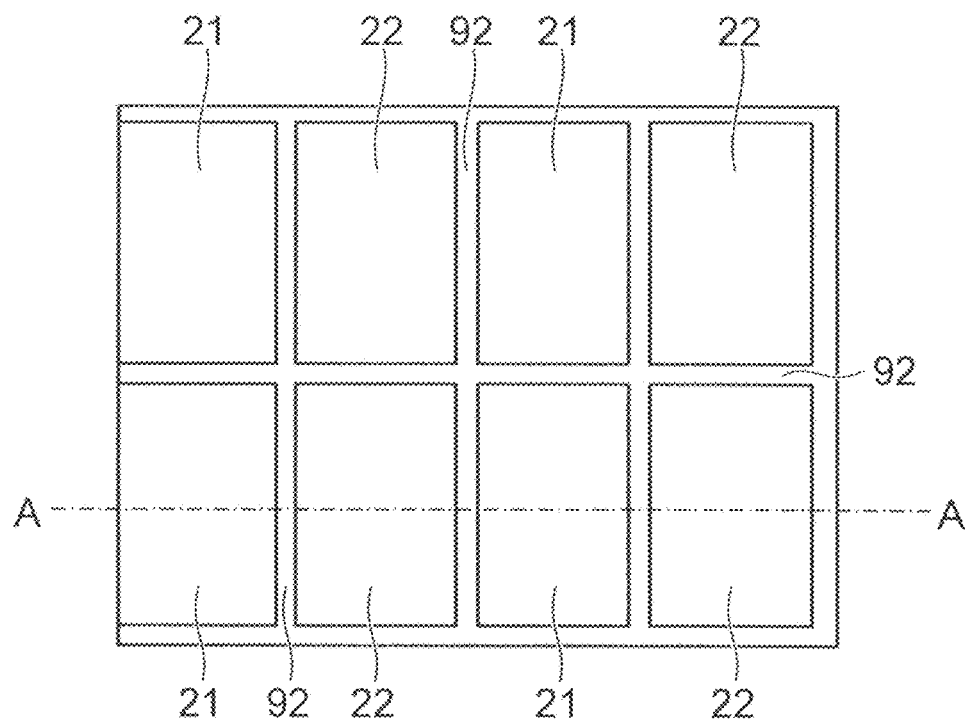

FIG. 15A shows an example of the planar layout of the p-side interconnect layer 21 and the n-side interconnect layer 22.

The p-side interconnect layer 21 and the n-side interconnect layer 22 occupy the greater part of the region on the second surface side.

Because the aluminum film 61 is provided under the p-side interconnect layer 21 and the n-side interconnect layer 22, the aluminum film (the reflective film) 61 is formed over the greater part of the region on the second surface side. Thereby, the amount of the light traveling toward the fluorescer layer 30 side can be increased.

As shown in FIG. 1A, a composite resin 50 that has a varistor characteristic is provided on the region of a portion of the insulating film 18. The composite resin 50 is described below in detail.

A portion (on the n-side interconnect layer 22 side) of the p-side interconnect layer 21 extends onto the upper surface of the composite resin 50 to cover the stepped portion between the insulating film 18 and the composite resin 50.

Similarly, a portion (on the p-side interconnect layer 21 side) of the n-side interconnect layer 22 extends onto the upper surface of the composite resin 50 to cover the stepped portion between the insulating film 18 and the composite resin 50. The p-side interconnect layer 21 and the n-side interconnect layer 22 are separated from each other on the upper surface of the composite resin 50 and are not bound to each other.

A portion of the p-side interconnect layer 21 and a portion of the n-side interconnect layer 22 cover the side surface of the semiconductor layer 15 with the insulating film 18 interposed. In other words, as shown in FIG. 14A, the foundation metal film 60 that includes the aluminum film 61 which is a reflective film is formed also on the surface of the insulating film 18 covering the side surface of the semiconductor layer 15. Accordingly, the leakage in the horizontal direction of the light (the excitation light) that does not pass through the fluorescer layer 30 can be prevented; and color breakup and color fluctuation can be suppressed.

A p-type metal pillar (a first metal pillar) 23 is provided on the p-side interconnect layer 21. A p-side interconnect unit (a first interconnect unit) 41 is formed of the p-side interconnect layer 21 and the p-type metal pillar 23.

An n-side metal pillar (a second metal pillar) 24 is provided on the n-side interconnect layer 22. An n-side interconnect unit (a second interconnect unit) 43 is formed of the n-side interconnect layer 22 and the n-side metal pillar 24.

A resin layer 25 is provided as a second insulating film between the p-side interconnect unit 41 and the n-side interconnect unit 43. The resin layer 25 is provided between the p-type metal pillar 23 and the n-side metal pillar 24 to contact the side surface of the p-type metal pillar 23 and the side surface of the n-side metal pillar 24. In other words, the resin layer 25 is filled between the p-type metal pillar 23 and the n-side metal pillar 24.

The resin layer 25 is provided also between the p-side interconnect layer 21 and the n-side interconnect layer 22 on the composite resin 50. The resin layer 25 is provided around the p-type metal pillar 23 and around the n-side metal pillar 24 to cover the side surface of the p-type metal pillar 23 and the side surface of the n-side metal pillar 24.

The resin layer 25 is provided also in the region around the side surface of the semiconductor layer 15 to cover the side surface of the semiconductor layer 15 with the insulating film 18 and the p-side interconnect layer 21 interposed or with the insulating film 18 and the n-side interconnect layer 22 interposed.

The end portion (the surface) of the p-type metal pillar 23 on the side opposite to the p-side interconnect layer 21 is exposed from the resin layer 25 to function as a p-side external terminal 23a that is connectable to an external circuit such as a mounting substrate, etc. The end portion (the surface) of the n-side metal pillar 24 on the side opposite to the n-side interconnect layer 22 is exposed from the resin layer 25 to function as an n-side external terminal 24a that is connectable to the external circuit such as the mounting substrate, etc. The p-side external terminal 23a and the n-side external terminal 24a are bonded to a land pattern of the mounting substrate via, for example, solder or a bonding agent that is conductive.

Figure 20A:
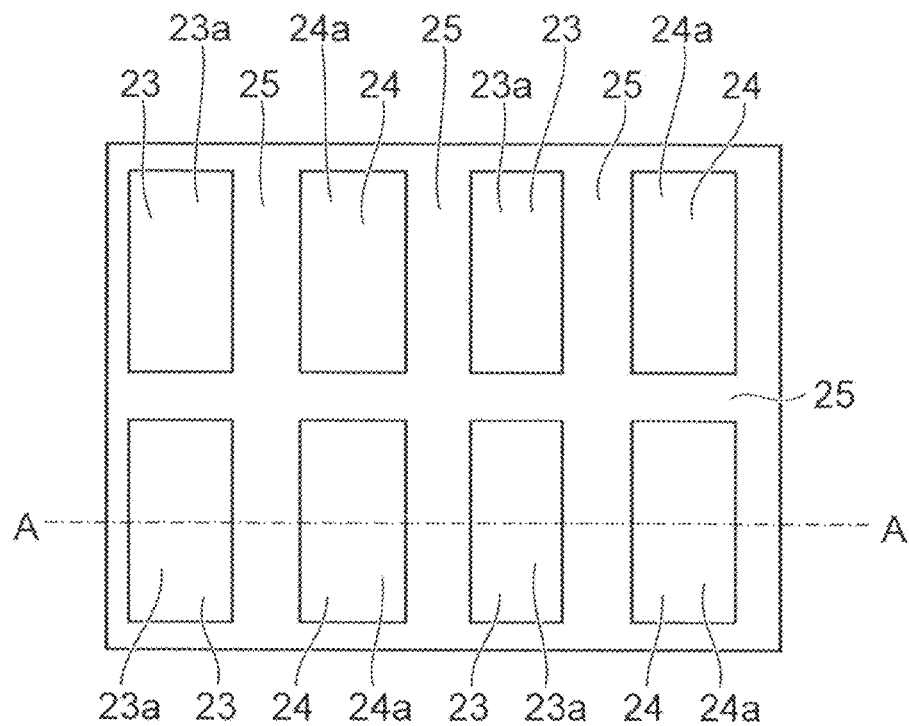
Figure 20B:
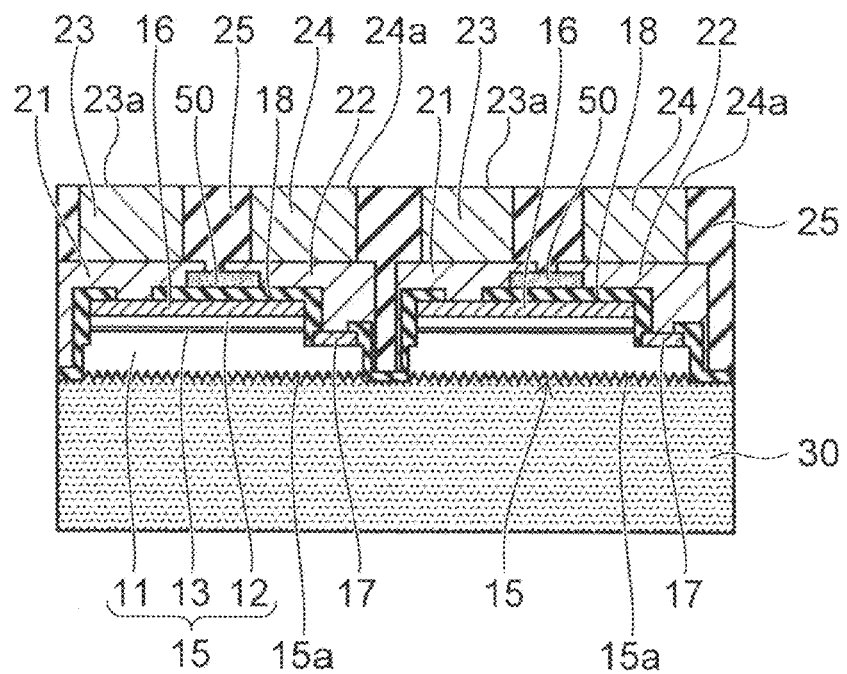

As shown in FIGS. 20A and 20B, the p-side external terminal 23a and the n-side external terminal 24a are formed to be arranged in the same surface of the resin layer 25 to be separated from each other. The spacing between the p-side external terminal 23a and the n-side external terminal 24a is wider than the spacing between the p-side interconnect layer 21 and the n-side interconnect layer 22 on the insulating film 18 or at the composite resin 50.

The spacing between the p-side external terminal 23a and the n-side external terminal 24a is set to be larger than the spread of the solder in the mounting. Thereby, shorts between the p-side external terminal 23a and the n-side external terminal 24a via the solder can be prevented.

Conversely, the spacing between the p-side interconnect layer 21 and the n-side interconnect layer 22 can be reduced to the process limits. Therefore, the surface area of the p-side interconnect layer 21 and the contact surface area between the p-side interconnect layer 21 and the p-type metal pillar 23 can be increased. Thereby, dissipation of the heat of the light emitting layer 13 can be promoted.

The surface area of the n-side interconnect layer 22 on the insulating film 18 can be greater than the surface area of the n-side electrode 17. Then, the surface area of the n-side metal pillar 24 provided on the n-side interconnect layer 22 (the surface area of the n-side external terminal 24a) can be greater than the surface area of the n-side electrode 17. Thereby, it is possible to reduce the surface area of the n-side electrode 17 while ensuring a surface area of the n-side external terminal 24a that is sufficient to provide mounting having high reliability. In other words, it is possible to increase the light output by reducing the surface area of the portion (the non-light emitting region) of the semiconductor layer 15 not including the light emitting layer 13 and by increasing the surface area of the portion (the light emitting region) including the light emitting layer 13.

The first semiconductor layer 11 is electrically connected to the n-side metal pillar 24 via the n-side electrode 17 and the n-side interconnect layer 22. The second semiconductor layer 12 is electrically connected to the p-type metal pillar 23 via the p-side electrode 16 and the p-side interconnect layer 21.

The thickness (the thickness in the direction connecting the p-side interconnect layer 21 and the p-side external terminal 23a) of the p-type metal pillar 23 is thicker than the thickness of the p-side interconnect layer 21. The thickness (the thickness in the direction connecting the n-side interconnect layer 22 and the n-side external terminal 24a) of the n-side metal pillar 24 is thicker than the thickness of the n-side interconnect layer 22. The thicknesses of the p-type metal pillar 23, the n-side metal pillar 24, and the resin layer 25 are thicker than the semiconductor layer 15.

The aspect ratio (the ratio of the thickness to the planar size) may be 1, more than 1, or less than 1 for the metal pillars 23 and 24. In other words, the metal pillars 23 and 24 may be thicker or thinner than their planar sizes.

The thickness of the support body 100 that includes the p-side interconnect layer 21, the n-side interconnect layer 22, the p-type metal pillar 23, the n-side metal pillar 24, and the resin layer 25 is thicker than the thickness of the LED chip that includes the semiconductor layer 15, the p-side electrode 16, and the n-side electrode 17.

As described below, the semiconductor layer 15 is formed by epitaxial growth on the substrate. The substrate is removed after forming the support body 100; and the semiconductor layer 15 does not include a substrate on the first surface 15a side. The semiconductor layer 15 is supported not by a substrate that is rigid and has a plate configuration but by the support body 100 which is a compound body including the metal pillars and the resin layer 25.

For example, copper, gold, nickel, silver, etc., may be used as the material of the p-side interconnect unit 41 and the n-side interconnect unit 43. Among these, good thermal conductivity, high migration resistance, and better adhesion with insulating materials can be obtained when copper is used.

The resin layer 25 reinforces the p-type metal pillar 23 and the n-side metal pillar 24. It is desirable for the resin layer 25 to have a coefficient of thermal expansion near to or the same as that of the mounting substrate. Such a resin layer 25 may include, for example, a resin including mainly an epoxy resin, a resin including mainly a silicone resin, or a resin including mainly a fluorocarbon resin.

The resin layer 25 may have light-shielding to the light emitted by the light emitting layer 13 by including a powder body that is light-absorbing such as carbon black, etc., or a powder body that is light-reflective such as titanium oxide, etc., in the resin that is used as the base of the resin layer 25. Thereby, light leakage from the side surface and mounting surface side of the support body 100 can be suppressed.

Stress that is caused by the solder, etc., that bonds the p-side external terminal 23a and the n-side external terminal 24a to the lands of the mounting substrate is applied to the semiconductor layer 15 by the thermal cycles in the mounting of the semiconductor light emitting device 1. The stress is absorbed and relaxed by the p-type metal pillar 23, the n-side metal pillar 24, and the resin layer 25. In particular, the stress relieving effect can be increased by using the resin layer 25 that is more flexible than the semiconductor layer 15 as a portion of the support body 100.

As described below, the substrate that is used to form (grow) the semiconductor layer 15 is removed from the semiconductor layer 15. Thereby, the semiconductor light emitting device 1 is thinner. Further, the first surface 15a of the semiconductor layer 15 can be surface-roughened by removing the substrate; and the light extraction efficiency can be increased.

For example, when wet etching of the first surface 15a using an alkaline solution is performed, a micro unevenness is formed due to the crystal anisotropy. Thereby, it is possible to extract the radiated light of the light emitting layer 13 from the first surface 15a to the outside without the radiated light of the light emitting layer 13 undergoing total internal reflection.

Or, the micro unevenness may be formed in the first surface 15a by etching using a mask formed by lithography.

After the substrate is removed, the fluorescer layer 30 is formed on the first surface 15a. It is more favorable for a not-shown insulating film to be provided between the first surface 15a and the fluorescer layer 30. The insulating film increases the adhesion between the semiconductor layer 15 and the fluorescer layer 30 and is, for example, a silicon oxide film or a silicon nitride film.

The fluorescer layer 30 has a structure in which, for example, fluorescers having multiple particle configurations are dispersed in a transparent resin such as a silicone resin, etc. The fluorescers include, for example, a green fluorescer that radiates green light by being excited by the radiated light of the light emitting layer 13 and, for example, a red fluorescer that radiates red light by being excited by the radiated light of the light emitting layer 13. The fluorescer layer 30 is not limited to a configuration including two types of fluorescers (the green fluorescer and the red fluorescer) and may have a configuration including one type of fluorescer (for example, a yellow fluorescer that radiates yellow light by being excited by the radiated light of the light emitting layer 13).

The fluorescer layer 30 also is formed on the insulating film 18 of the region around the side surface 15c of the semiconductor layer 15. Accordingly, the planar size of the fluorescer layer 30 is larger than the planar size of the semiconductor layer 15.

The fluorescer layer 30 is limited to being provided on the first surface 15a of the semiconductor layer 15 and on the region around the side surface 15c of the semiconductor layer 15 and is not formed to extend around to the second surface side of the semiconductor layer 15, around the metal pillars 23 and 24, or around to the side surface of the support body 100. The side surface of the fluorescer layer 30 and the side surface of the support body 100 (the side surface of the resin layer 25) are aligned.

In other words, the semiconductor light emitting device 1 of the embodiment is an extremely small semiconductor light emitting device having a chip size package structure. Therefore, the degrees of freedom of, for example, light fixture designs are higher in applications for light fixtures for illumination, etc.

Also, the fluorescer layer 30 is not formed unnecessarily on the mounting surface side where the light is not extracted to the outside; and the cost can be reduced. Further, the heat of the light emitting layer 13 can be dissipated to the mounting substrate side via the p-side interconnect layer 21 and the n-side interconnect layer 22 that are provided over the second surface side even without a substrate on the first surface 15a side; and the heat dissipation is excellent even though the package is small.

In general flip chip mounting, the LED chip is mounted to the mounting substrate via bumps, etc.; and subsequently, the fluorescer layer is formed to cover the entire chip. Or, a resin is under-filled between the bumps.

Conversely, according to the embodiment, the resin layer 25, which is different from the fluorescer layer 30, is provided around the p-type metal pillar 23 and around the n-side metal pillar 24 in the state prior to mounting and can provide characteristics suited to stress relief on the mounting surface side. Also, because the resin layer 25 is provided already on the mounting surface side, the under-fill after the mounting is unnecessary.

Layers that are designed with priority on the light extraction efficiency, color conversion efficiency, light distribution characteristics, etc., are provided on the first surface 15a side; and layers having priority on the stress relief in the mounting and characteristics as a support body to replace the substrate are provided on the mounting surface side. For example, the resin layer 25 has a structure in which a filler such as silica particles, etc., is filled at a high density in the resin that is used as the base; and the hardness is adjusted to be appropriate as a support body.

The light radiated from the light emitting layer 13 to the first surface 15a side is incident on the fluorescer layer 30; a portion of the light excites the fluorescers; and, for example, white light is obtained as mixed light of the light of the light emitting layer 13 and the light of the fluorescers.

Here, in the case where there is a substrate on the first surface 15a, light may leak to the outside from the side surface of the substrate without being incident on the fluorescer layer 30. In other words, light of the light emitting layer 13 that has a strong tint leaks from the side surface of the substrate which may cause color breakup and uneven color such as a phenomenon in which a ring of blue light is viewed at the outer edge side when illuminating an object from the fluorescer layer 30 side, etc.

Conversely, according to the embodiment, because there is no substrate between the first surface 15a and the fluorescer layer 30, color breakup and uneven color due to the light of the light emitting layer 13 that has a strong tint leaking from the substrate side surface can be prevented.

Further, according to the embodiment, the light that is traveling from the light emitting layer 13 toward the side surface 15c of the semiconductor layer 15 does not leak to the outside because the reflective metal (the aluminum film 61) and the light-shielding resin layer 25 described above are provided at the side surface 15c of the semiconductor layer 15. Therefore, color breakup and uneven color due to the light leakage from the side surface of the semiconductor light emitting device 1 can be prevented in addition to the feature of having no substrate on the first surface 15a side.

The composite resin 50 will now be described.

Figure 2:
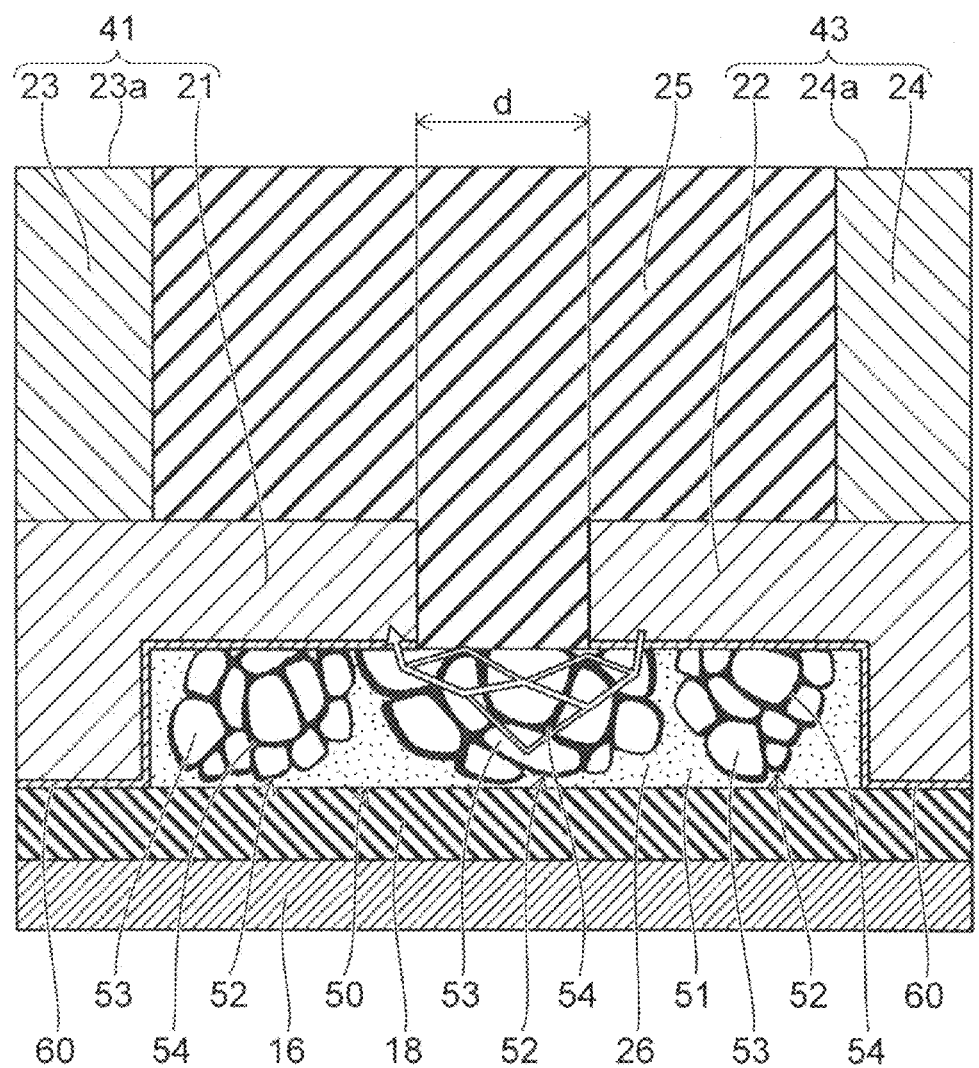

FIG. 2 is a schematic enlarged cross-sectional view of the portion of FIG. 1A surrounded with the double dot-dash line.

The composite resin 50 is provided in a film configuration on the insulating film 18 in the region where the p-side interconnect layer 21 is proximal to the n-side interconnect layer 22.

The composite resin 50 includes a resin component 51 that is insulative, and multiple first powder bodies 52 that are dispersed in the resin component 51. The first powder body 52 is a polycrystalline powder body in which multiple primary particles 53 are bound via a grain boundary 54.

The primary particle 53 includes, for example, zinc oxide as a major component. A component that is different from the major component of the primary particle 53 exists in a higher concentration at the grain boundary 54 than in the primary particle 53 interior. For example, one element selected from bismuth, praseodymium, and strontium exists in a higher concentration in the grain boundary 54 and at the vicinity of the grain boundary 54 than in the primary particle 53 interior.

Figure 38:
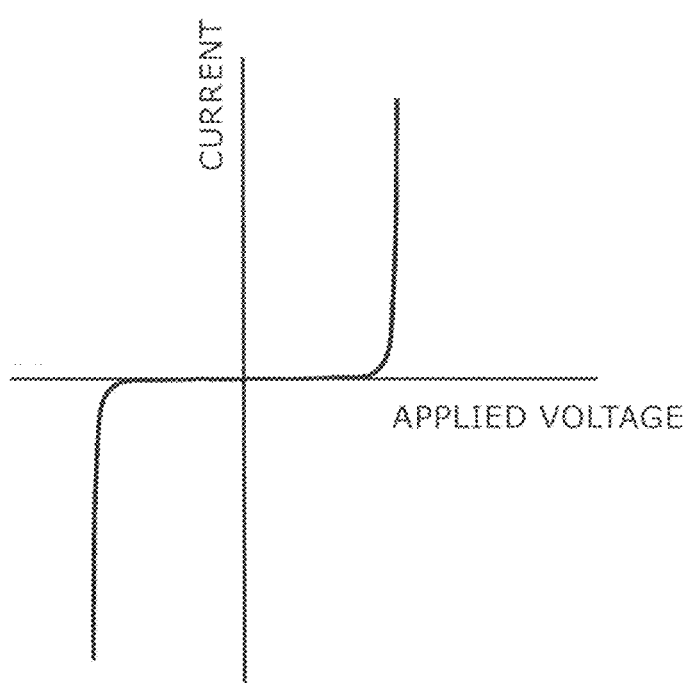
FIG. 38 is a current-voltage characteristic chart of the first powder bodies.

As shown in FIG. 38, the first powder body 52 has a nonlinear current-voltage characteristic in which the resistance decreases as the applied voltage increases, i.e., a varistor characteristic.

Also, at least one element selected from cobalt, manganese, chrome, antimony, strontium, lead, barium, and magnesium is added to the first powder body 52. These additives can cause the resistance change to be abrupt.

Figure 6:
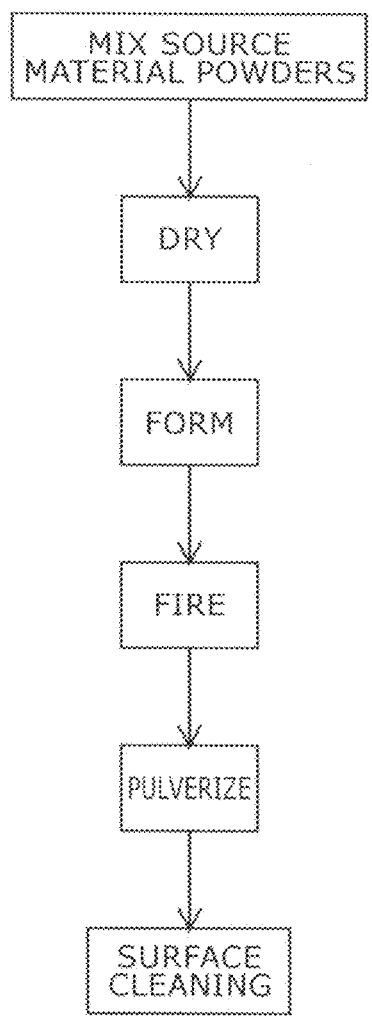

FIG. 6 is a flowchart showing a method for manufacturing the first powder bodies 52.

First, source material powders of zinc oxide, bismuth oxide, cobalt oxide, manganese oxide, antimony oxide, a binder (an organic substance), etc., are mixed.

Then, the multiple first powder bodies 52 are obtained by drying, forming, and firing the mixture and subsequently pulverizing the mixture.

Subsequently, if necessary, the surfaces of the first powder bodies 52 are cleaned. Such cleaning can expose the surfaces of the primary particles 53 by removing the segregated component, which is the same as the grain boundary 54, that covers the surfaces of the primary particles 53.

FIG. 7 is a flowchart showing another method for manufacturing the first powder bodies 52.

First, source material powders of zinc oxide, bismuth oxide, cobalt oxide, manganese oxide, antimony oxide, a binder (an organic substance), etc., are mixed.

Then, the multiple first powder bodies 52 are obtained by drying and forming the mixture and subsequently pulverizing the mixture.

Subsequently, the multiple powder bodies are fired by scattering in a vapor. Subsequently, if necessary, the surfaces of the first powder bodies 52 are cleaned.

Figure 8:
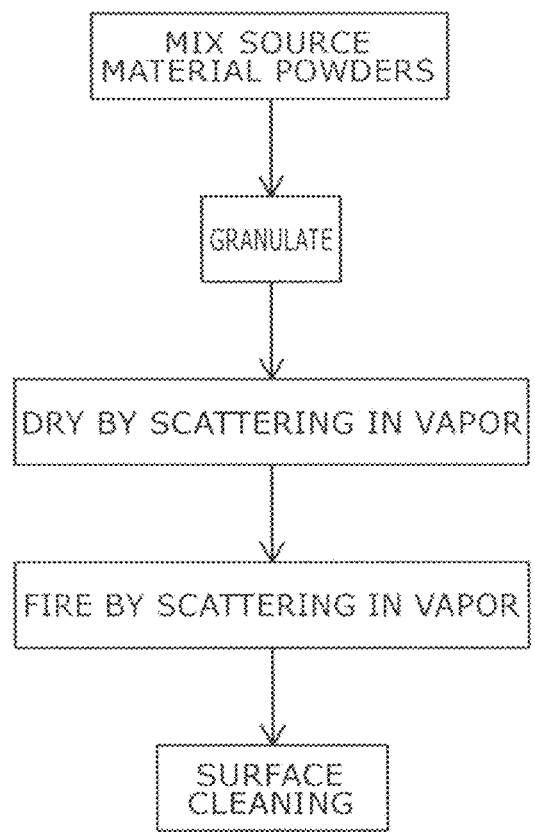

FIG. 8 is a flowchart showing another method for manufacturing the first powder bodies 52.

First, source material powders of zinc oxide, bismuth oxide, cobalt oxide, manganese oxide, antimony oxide, a binder (an organic substance), etc., are mixed.

Then, the multiple first powder bodies 52 are obtained by granulating the mixture. The granulation method may include cutting after extruding using an extruder; or spray drying may be used.

Subsequently, the multiple powder bodies are dried and fired by scattering in a vapor. Subsequently, if necessary, the surfaces of the first powder bodies 52 are cleaned.

For example, bismuth oxide segregates into the grain boundary 54 as a sintering aid because bismuth oxide forms a solid solution less easily than zinc oxide and has a low melting point. A thin high resistance layer is formed in the grain boundary 54 because a high energy barrier that is presumed to be a Schottky barrier is formed in the grain boundary 54 vicinity where the bismuth oxide segregates. Herein, such an energy barrier is referred to as a Schottky barrier for convenience.

It is considered that the occurrence of the varistor operation is caused by the Schottky barrier formed at the grain boundary 54 vicinity. In other words, a tunneling current starts to flow through the Schottky barrier and the resistance decreases abruptly when a high voltage such as a surge voltage is applied to the grain boundary 54.

In other words, the first powder body 52 is an insulator at or below the rated voltage; but when a high voltage such as a surge, etc., is applied, the resistance of the first powder body 52 decreases; and a path (a short-circuit path) that releases the surge is formed in the first powder body 52. In FIG. 2 to FIG. 5, the path of the surge is schematically illustrated by the white arrows with black outlines. The voltage (the breakdown voltage) at which the resistance decreases abruptly is proportional to the number of the grain boundaries 54 existing in series in the surge path.

Praseodymium oxide may be used instead of bismuth oxide. In such a case as well, it is known that a similar varistor characteristic is obtained. It is known that the size of the primary particle is smaller for praseodymium oxide than for bismuth oxide. Accordingly, it is more favorable to use praseodymium oxide in the case where a finer structure is desirable, that is, in the case where it is desirable for the gap between the p-side interconnect unit and the n-side interconnect unit to be narrow. The component segregated at the vicinity of the boundary 54 in a higher concentration is not needed to be limited to bismuth oxide and praseodymium oxide. In short, similar effects can be expected if a composition is used in which a varistor characteristic occurs via the grain boundaries of the primary particles. It is not always necessary for an oxide to be used as the source material powder of the powder body 52; and, for example, a source material powder of bismuth, praseodymium, etc., may be oxidized when sintering.

The foundation metal film 60 of the p-side interconnect unit 41 and the foundation metal film 60 of the n-side interconnect unit 43 directly contact the first powder body 52 without the resin component 51 interposed. Therefore, the contact resistance between the p-side interconnect unit 41 and the first powder body 52 and the contact resistance between the n-side interconnect unit 43 and the first powder body 52 can be low; and a path that has low resistance when releasing the surge is obtained.

Also, by the surface cleaning of the first powder body 52 described above, the surfaces of the primary particles 53 can be exposed. Then, because the surfaces of the primary particles 53 can directly contact the foundation metal film 60, the contact resistance can be lower than in the case where the grain boundary 54 is interposed between the primary particle 53 and the foundation metal film 60.

According to the first embodiment, the foundation metal films 60 of the p-side interconnect unit 41 and the n-side interconnect unit 43 have surface contact with the surface of the composite resin 50 having the film configuration. In other words, the foundation metal films 60 can have surface contact with the multiple primary particles 53. Therefore, the multiple primary particles 53 are connected in parallel between the foundation metal films 60; and the surge immunity of the path itself is improved.

According to the first embodiment, the semiconductor layer 15 and the first powder body 52 are connected in parallel between the p-side external terminal 23a and the n-side external terminal 24a exposed to the outside in the state prior to mounting; and the first powder body 52 functions as a protection element that protects the semiconductor layer 15 from the surge voltage. The surge current can flow between the p-side external terminal 23a and the n-side external terminal 24a via the first powder body 52 without passing through the semiconductor layer 15.

In the normal operation in which a power supply voltage of the rated voltage or less is applied between the p-side external terminal 23a and the n-side external terminal 24a, the first powder body 52 is in a high resistance state due to the Schottky barrier of the grain boundary 54 vicinity; and the p-side interconnect unit 41 and the n-side interconnect unit 43 are not shorted via the first powder body 52.

The sizes of the primary particles 53 are less than the minimum distance between the p-side interconnect layer 21 and the n-side interconnect layer 22 on the composite resin 50. Therefore, a bridge is not formed between the p-side interconnect layer 21 and the n-side interconnect layer 22 by only one primary particle 53.

In the specification, the size of the powder body (the particle) is the average particle size of multiple powder bodies (particles), or the peak particle diameter or maximum particle diameter of the particle diameter distribution.

As shown in FIG. 2, because the size of the first powder body 52 is greater than the minimum distance d between the p-side interconnect layer 21 and the n-side interconnect layer 22, a surge path can be formed of the first powder body 52 to directly bridge the minimum distance d.

There is always at least one grain boundary 54 having a Schottky barrier characteristic that exists in the path between the p-side interconnect layer 21 and the n-side interconnect layer 22 bridged by the polycrystalline first powder body 52 in which the multiple primary particles 53 are bound via the grain boundary 54. Accordingly, in the normal operation, the p-side interconnect layer 21 and the n-side interconnect layer 22 are not shorted.

As shown in FIG. 15A, the spacing between the p-side interconnect layer 21 and the n-side interconnect layer 22 that extend onto the composite resin 50 can be constant due to the patterning of a resist film 92.

Multiple first powder bodies 52 can exist along the longitudinal direction (in FIG. 2, the direction piercing the page surface) in the region of the constant spacing to bridge the spacing recited above. By adjusting the particle diameters of the primary particles 53 of the first powder body 52 to have little fluctuation, multiple paths having equal numbers of the grain boundaries 54 in series are formed; and the surge immunity of the path itself improves.

According to the embodiment, the composite resin 50 having the varistor characteristic is built-into the semiconductor light emitting device 1 in a film configuration. Accordingly, it is unnecessary to connect an external static electricity protection circuit to the semiconductor light emitting device 1. In other words, it is unnecessary to mount a Zener diode as an ESD protection element of the LED. Accordingly, according to the embodiment, the semiconductor light emitting device 1 having excellent electrostatic immunity can be provided without impeding the downsizing of the semiconductor light emitting device 1 in a chip size package structure.

A powder body 26 that is light-shielding such as a powder body that is light-absorbing such as carbon black, a powder body that is light-reflective such as metal, alloy, etc., may be included inside the resin component 51 of the composite resin 50. In other words, the composite resin 50 is light-shielding to the light emitted by the light emitting layer 13. Thereby, it is possible to protect the first powder body 52 from the light emitted by the light emitting layer 13; and misoperations, etc., of the first powder body 52 can be suppressed. Here, "misoperations" are, for example, when the electrons in the interior of the powder body 52 are excited by the incident light, the current-voltage characteristic undesirably fluctuates, or light of a longer wavelength is undesirably emitted.

Figure 3:
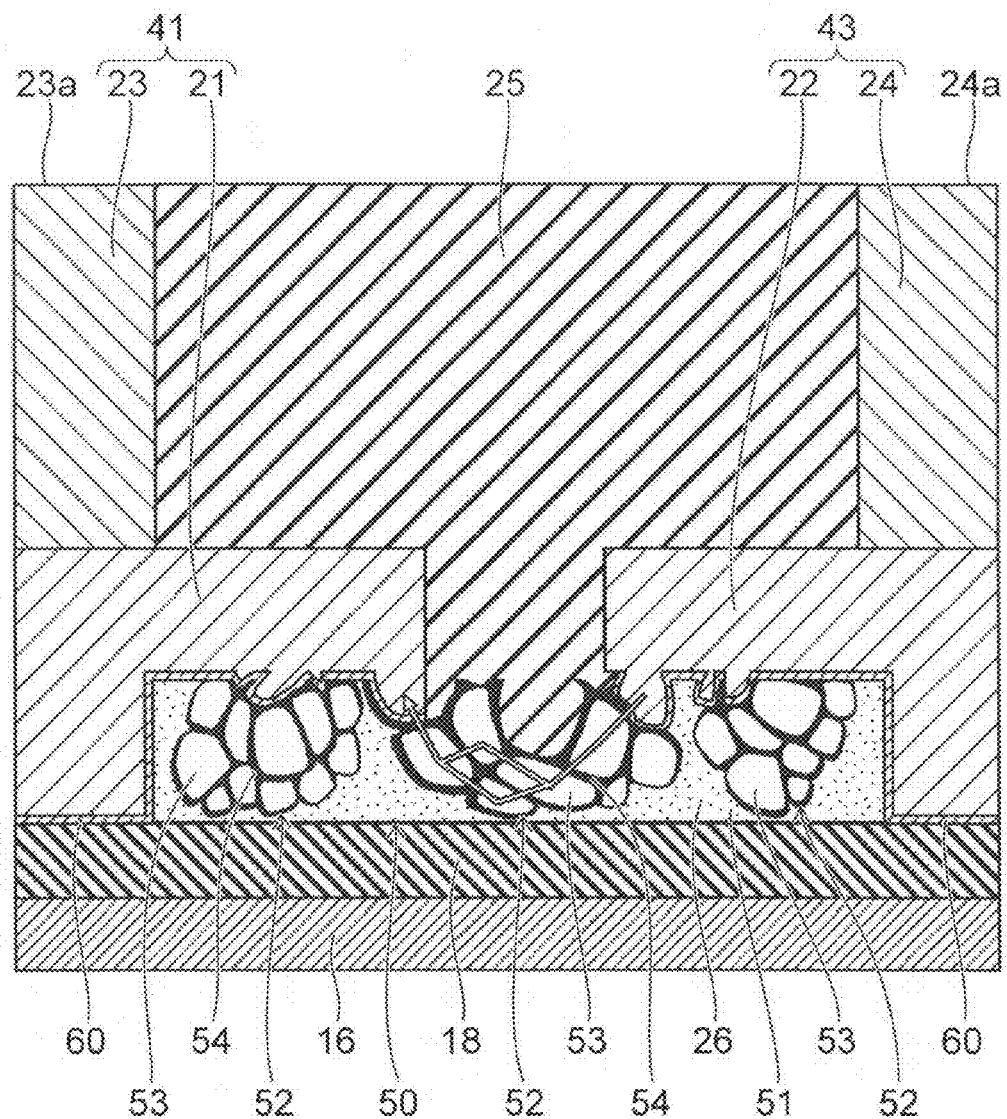

Leak current can be suppressed by performing etching as shown in FIG. 3 to selectively remove the primary particles 53 exposed at the surface after forming the composite resin 50 because the surfaces of the primary particles 53 are not exposed in the short-circuit path of the surface of the composite resin 50.

In the region where the p-side interconnect layer 21 is proximal to the n-side interconnect layer 22 as shown in FIG. 3, the resin layer 25 is filled into the portions from which the primary particles 53 were removed by the etching.

Figure 4:
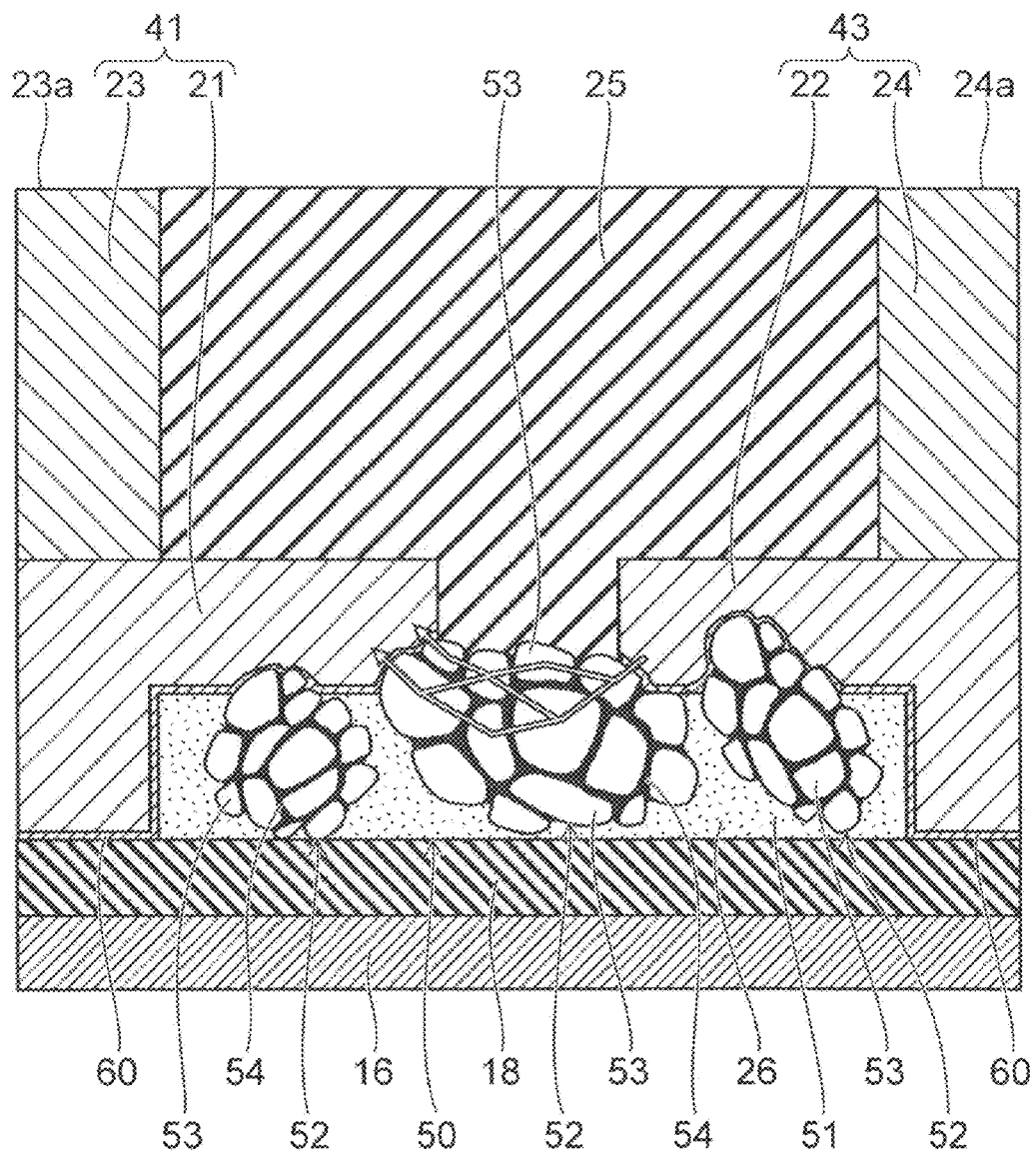

After forming the composite resin 50, for example, the resin component 51 at the surface may be removed by etching by ashing, etc. Subsequently, when the foundation metal film 60 is formed as shown in FIG. 4, the foundation metal film 60 can contact the surfaces of the powder bodies 52 that are exposed by the etching of the resin component 51.

Accordingly, the contact resistance can be lower because the foundation metal film 60 directly contacts the surfaces of the powder bodies 52 without the resin component 51 interposed. Further, if the grain boundary component at the surface is removed by the surface cleaning when manufacturing the powder bodies 52, the contact resistance can be even lower because the foundation metal film 60 directly contacts the surfaces of the primary particles 53.

A method for manufacturing the semiconductor light emitting device 1 will now be described with reference to FIG. 9A to FIG. 21B.

FIG. 9B, FIG. 10B, FIG. 11B, FIG. 12B, FIG. 13B, FIG. 15B, FIG. 16B, FIG. 17B, FIG. 18B, FIG. 20B, and FIG. 21B correspond to the A-A cross sections of FIG. 9A, FIG. 10A, FIG. 11A, FIG. 12A, FIG. 13A, FIG. 15A, FIG. 16A, FIG. 17A, FIG. 18A, FIG. 20A, and FIG. 21A, respectively.

Namely, FIG. 9A, FIG. 10A, FIG. 11A, FIG. 12A, FIG. 13A, FIG. 15A, FIG. 16A, FIG. 17A, FIG. 18A, FIG. 20A, and FIG. 21A are top views of FIG. 9B, FIG. 10B, FIG. 11B, FIG. 12B, FIG. 13B, FIG. 15B, FIG. 16B, FIG. 17B, FIG. 18B, FIG. 20B, and FIG. 21B, respectively. These top views show partial regions of a circular wafer.

Figure 9A:
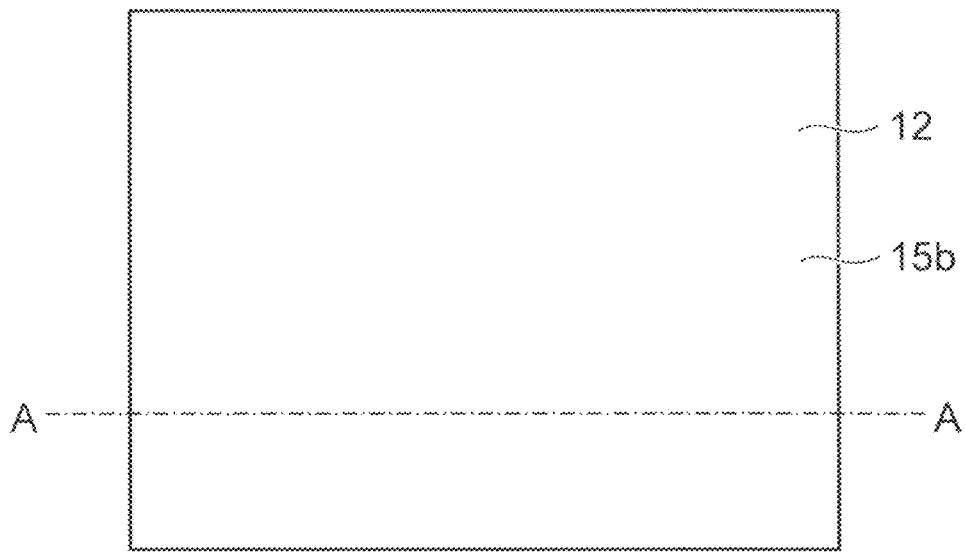
FIG. 9A to FIG. 21B are schematic views showing a method for manufacturing the semiconductor light emitting device of the first embodiment.
Figure 9B:
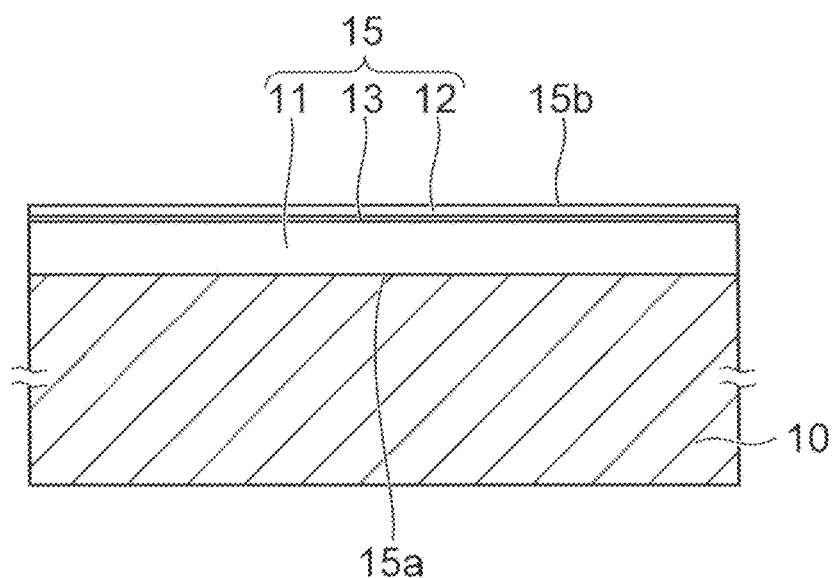

FIG. 9B is a cross-sectional view showing the semiconductor layer 15 formed on a major surface of a substrate 10. The first semiconductor layer 11, the light emitting layer 13, and the second semiconductor layer 12 are epitaxially grown in order on the major surface of the substrate 10 by, for example, MOCVD (metal organic chemical vapor deposition).

The surface of the semiconductor layer 15 on the substrate 10 side is the first surface 15a; and the surface of the semiconductor layer 15 on the side opposite to the substrate 10 is the second surface 15b.

The substrate 10 is, for example, a silicon substrate. Or, the substrate 10 may be a sapphire substrate or a SiC substrate. The semiconductor layer 15 is, for example, a nitride semiconductor layer including gallium nitride (GaN).

The first semiconductor layer 11 includes, for example, a buffer layer provided on the major surface of the substrate 10, and an n-type GaN layer provided on the buffer layer. The second semiconductor layer 12 includes, for example, a p-type AlGaN layer provided on the light emitting layer 13, and a p-type GaN layer provided on the p-type AlGaN layer. The light emitting layer 13 has, for example, a MQW (Multiple Quantum Well) structure.

Figure 10B:
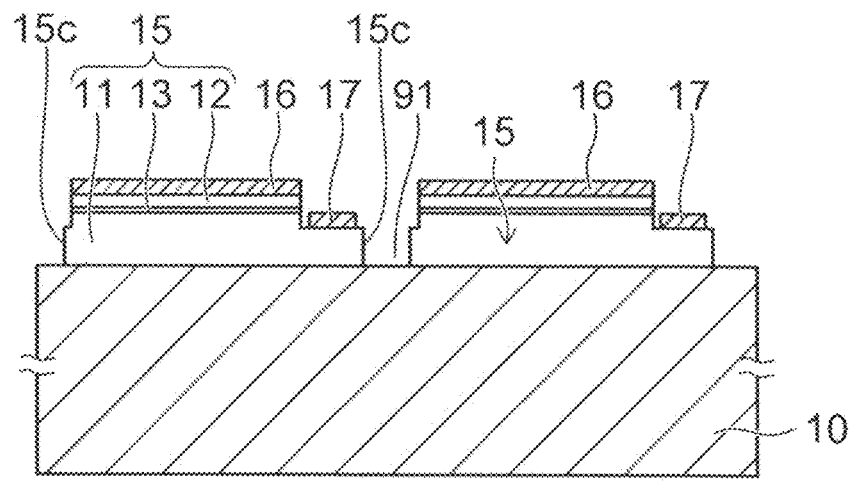

The second semiconductor layer 12 and the light emitting layer 13 are selectively removed as shown in FIG. 10B by, for example, RIE (Reactive Ion Etching). The first semiconductor layer 11 is exposed by the selective etching of the second semiconductor layer 12 and the light emitting layer 13.

Then, as shown in FIGS. 10A and 10B, a trench 91 is made by selectively removing the first semiconductor layer 11. The semiconductor layer 15 is divided by the trench 91 into a plurality on the major surface of the substrate 10. The trench 91 pierces the semiconductor layer 15 to reach the substrate 10. According to the etching conditions, there are cases where the major surface of the substrate 10 also is etched slightly such that the bottom surface of the trench 91 recedes to be lower than the interface between the substrate 10 and the semiconductor layer 15. The trench 91 may be made after forming the p-side electrode 16 and the n-side electrode 17.

The p-side electrode 16 is formed on the surface of the second semiconductor layer 12. The n-side electrode 17 is formed on the surface of the first semiconductor layer 11 in the region where the second semiconductor layer 12 and the light emitting layer 13 are selectively removed.

The p-side electrode 16 and the n-side electrode 17 are formed by, for example, sputtering, vapor deposition, etc. Either one of the p-side electrode 16 and the n-side electrode 17 may be formed first; or the p-side electrode 16 and the n-side electrode 17 may be formed simultaneously from the same material.

The p-side electrode 16 that is formed in the region where the light emitting layer 13 is stacked includes a reflective film that reflects the radiated light of the light emitting layer 13. For example, the p-side electrode 16 includes silver, a silver alloy, aluminum, an aluminum alloy, etc. The p-side electrode 16 includes a metal protective film (a barrier metal) to prevent sulfidization and oxidization of the reflective film.

Then, as shown in FIGS. 11A and 11B, the insulating film 18 is formed to cover the structural body provided on the substrate 10. The insulating film 18 covers the second surface of the semiconductor layer 15, the p-side electrode 16, and the n-side electrode 17. Also, the insulating film 18 covers the side surface 15c continuing from the first surface 15a of the semiconductor layer 15. The insulating film 18 also is formed on the surface of the substrate 10 at the bottom surface of the trench 91.

The insulating film 18 is a silicon oxide film or a silicon nitride film formed by, for example, CVD (Chemical Vapor Deposition). The first opening 18a and the second opening 18b are made in the insulating film 18 by, for example, wet etching using a resist mask. The first opening 18a reaches the p-side electrode 16; and the second opening 18b reaches the n-side electrode 17.

Figure 12A:
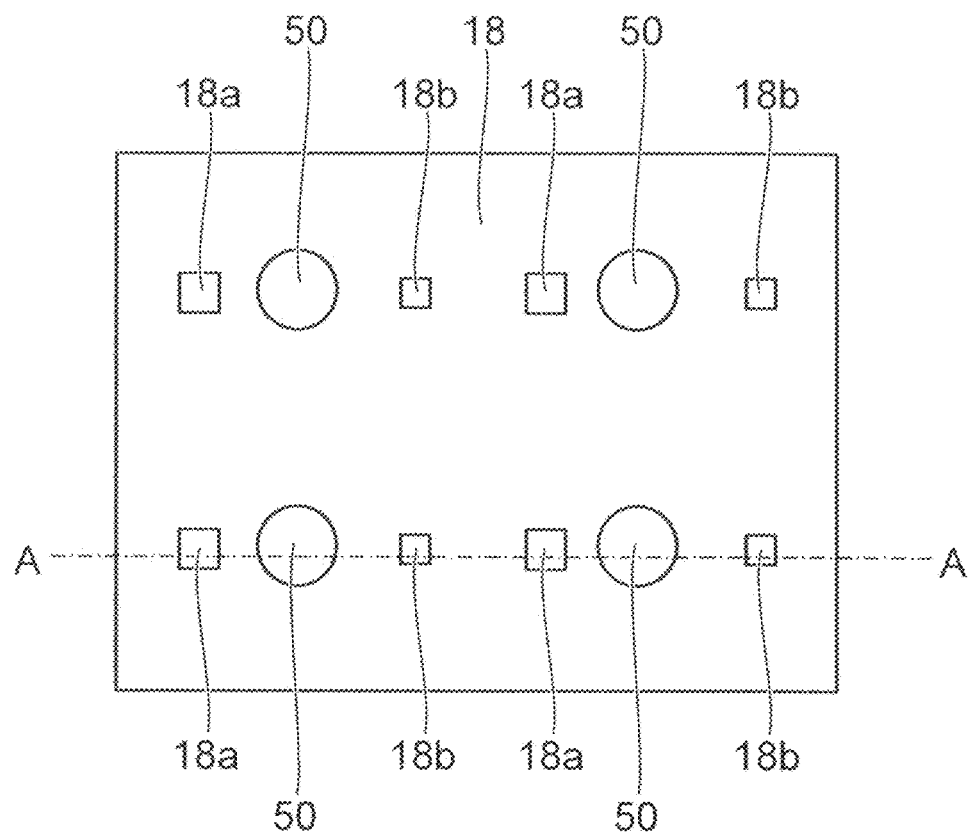
Figure 12B:
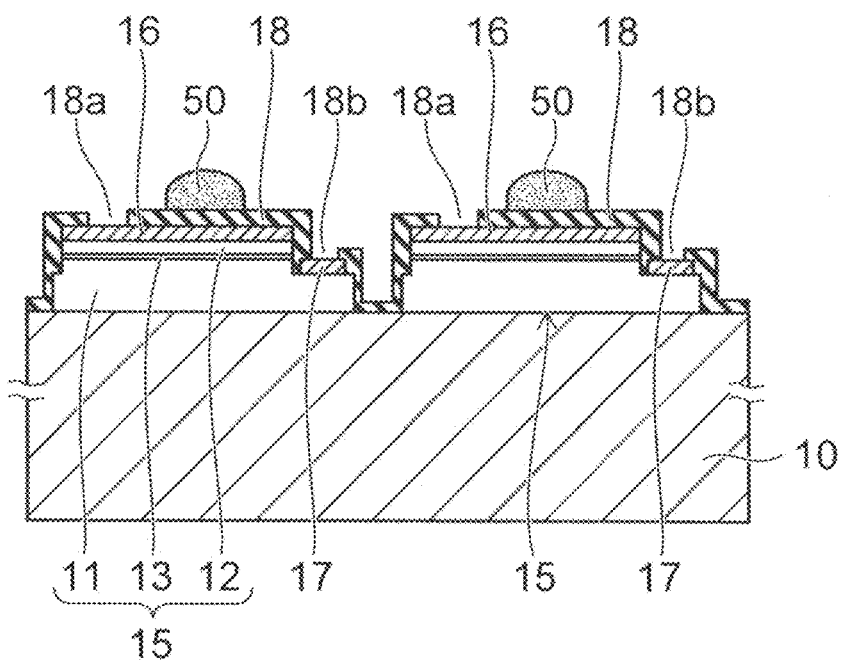

Then, as shown in FIGS. 12A and 12B, the composite resin 50 is supplied onto the insulating film 18 by, for example, dispensing. The composite resin 50 is supplied onto the insulating film 18 that is on the p-side electrode 16.

Figure 13A:
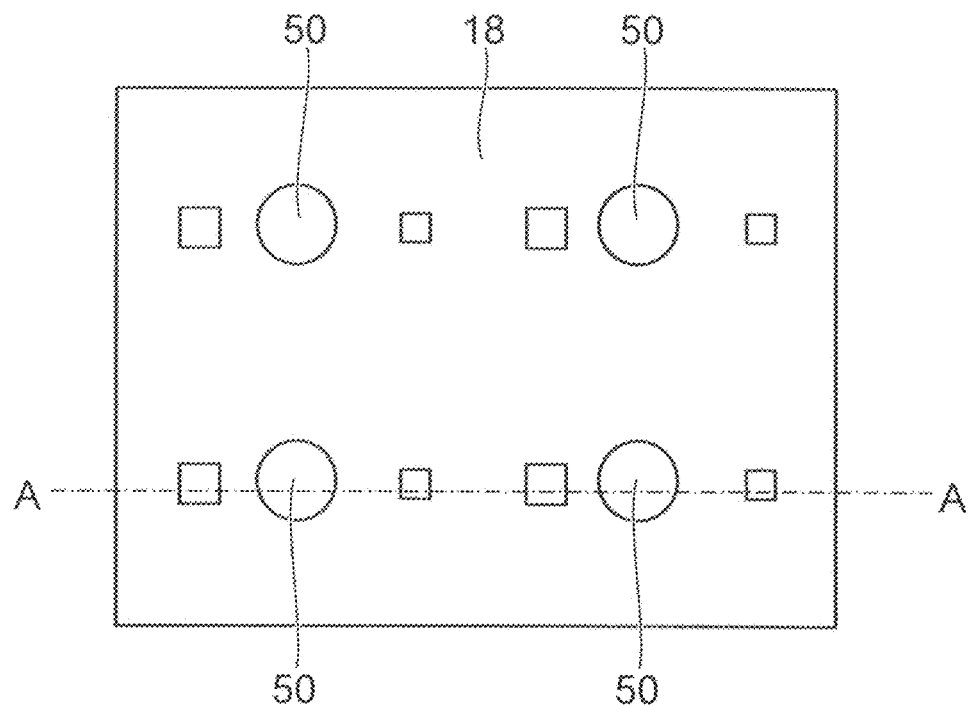
Figure 13B:
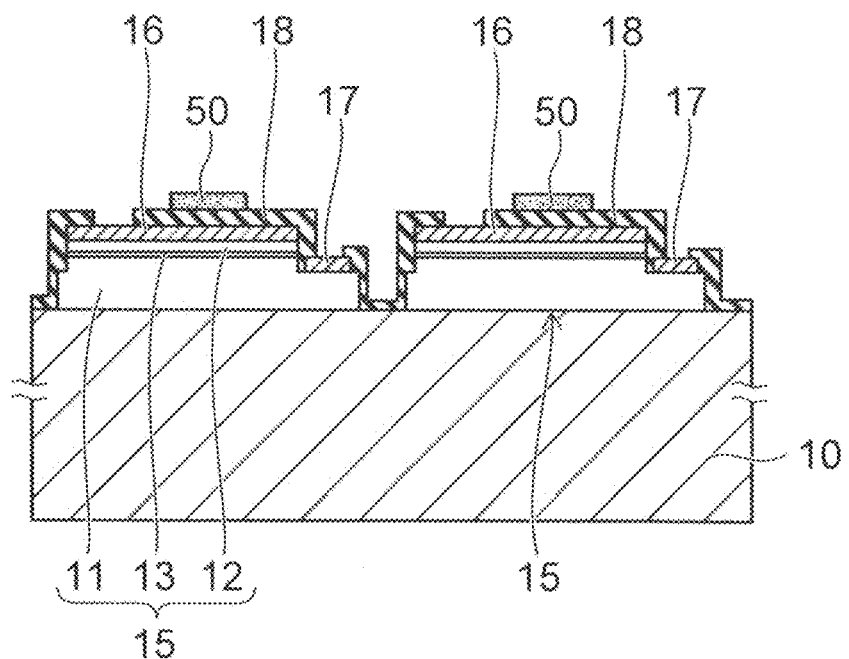

The composite resin 50 is polished as shown in FIGS. 13A and 13B to expose the first powder bodies 52 at the surface of the composite resin 50. The composite resin 50 is mechanically polished by, for example, a back side grinder, a blade dicer, etc.

Or, the first powder bodies 52 may be exposed by removing the resin component 51 that is at the surface of the composite resin 50 by ashing, reverse sputtering, etc.

Then, as shown in FIG. 14A, the foundation metal film 60 is formed conformally on the surface of the insulating film 18, the surface of the composite resin 50, the inner walls (the side wall and the bottom surface) of the first opening 18a, and the inner walls (the side wall and the bottom surface) of the second opening 18b.

As described above referring to FIG. 14B, the foundation metal film 60 includes the aluminum film 61, the titanium film 62, and the copper film 63. The foundation metal film 60 is formed by, for example, sputtering.

In the views of processes hereinafter, the foundation metal film 60 is not shown.

Figure 15B:
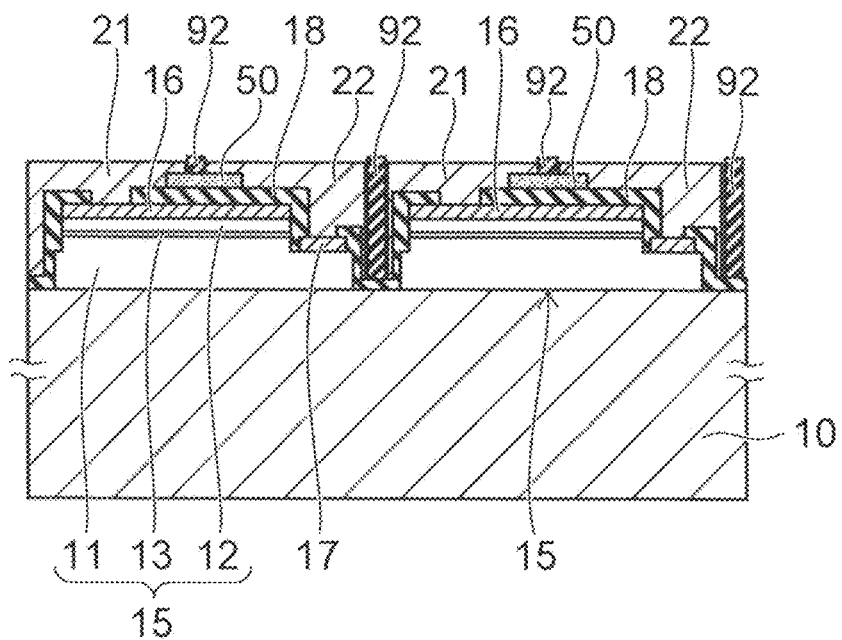

As shown in FIGS. 15A and 15B, the resist mask 92 is formed selectively on the foundation metal film 60. Then, the p-side interconnect layer 21 and the n-side interconnect layer 22 are formed by copper electroplating using the copper film 63 of the foundation metal film 60 as a seed layer.

The p-side interconnect layer 21 also is formed inside the first opening 18a and is electrically connected to the p-side electrode 16. The n-side interconnect layer 22 also is formed inside the second opening 18b and is electrically connected to the n-side electrode 17.

Figure 16A:
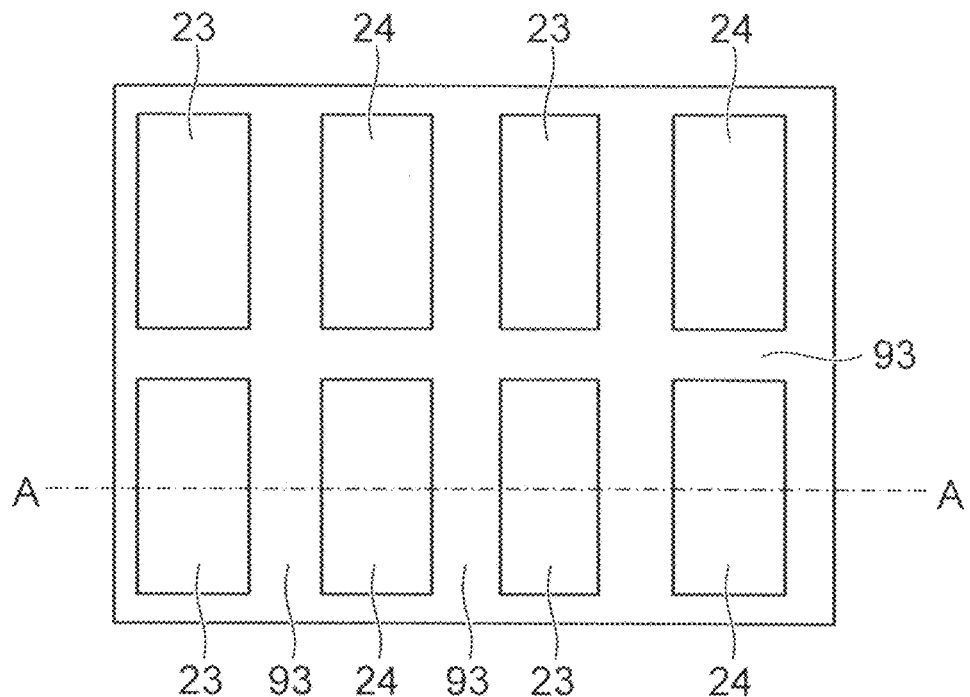
Figure 16B:
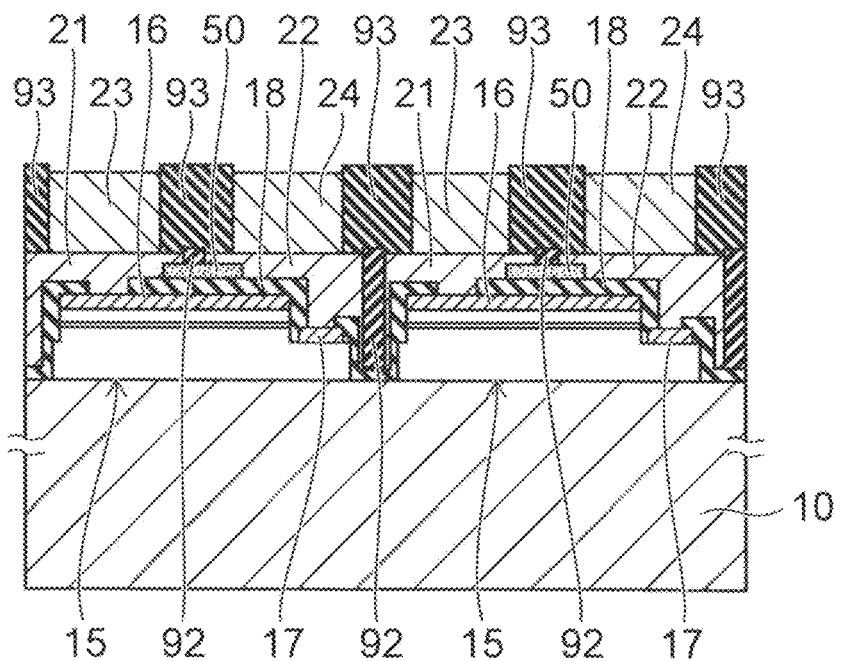

Then, as shown in FIGS. 16A and 16B, after selectively forming a resist mask 93 on the interconnect layers 21 and 22, the p-type metal pillar 23 and the n-side metal pillar 24 are formed by copper electroplating using the p-side interconnect layer 21 and the n-side interconnect layer 22 as a seed layer.

The p-type metal pillar 23 is formed on the p-side interconnect layer 21. The p-side interconnect layer 21 and the p-type metal pillar 23 are formed in a single body of the same copper material. The n-side metal pillar 24 is formed on the n-side interconnect layer 22. The n-side interconnect layer 22 and the n-side metal pillar 24 are formed in a single body of the same copper material.

The resist masks 92 and 93 are removed using, for example, a solvent or oxygen plasma.

At this point in time, the p-side interconnect layer 21 and the n-side interconnect layer 22 are bound to each other via the foundation metal film 60. Therefore, the foundation metal film 60 that is between the p-side interconnect layer 21 and the n-side interconnect layer 22 is removed by etching. Thereby, the electrical connection between the p-side interconnect layer 21 and the n-side interconnect layer 22 is broken.

Figure 17A:
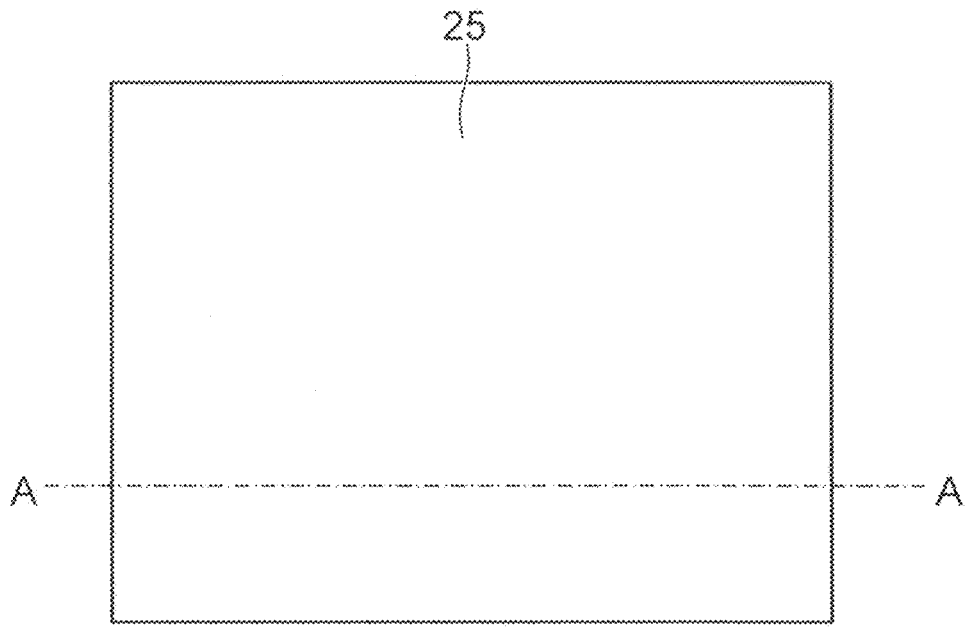
Figure 17B:
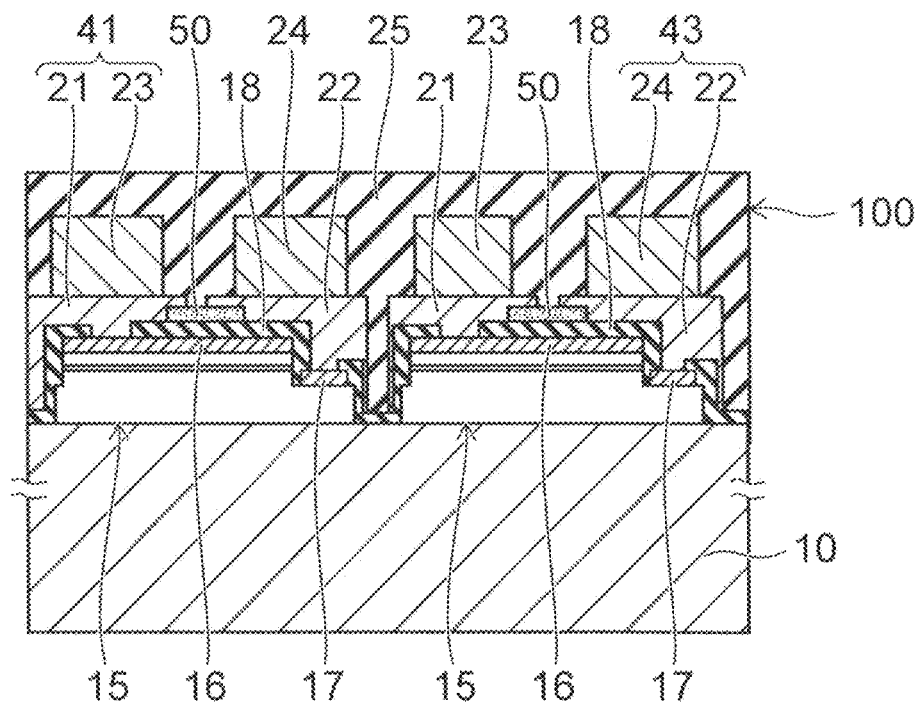

Then, as shown in FIGS. 17A and 17B, the resin layer 25 is formed on the structural body obtained in the processes described above. The resin layer 25 covers the p-side interconnect unit 41 and the n-side interconnect unit 43. The resin layer 25 is formed by, for example, screen printing, compression molding, etc.

Figure 18A:
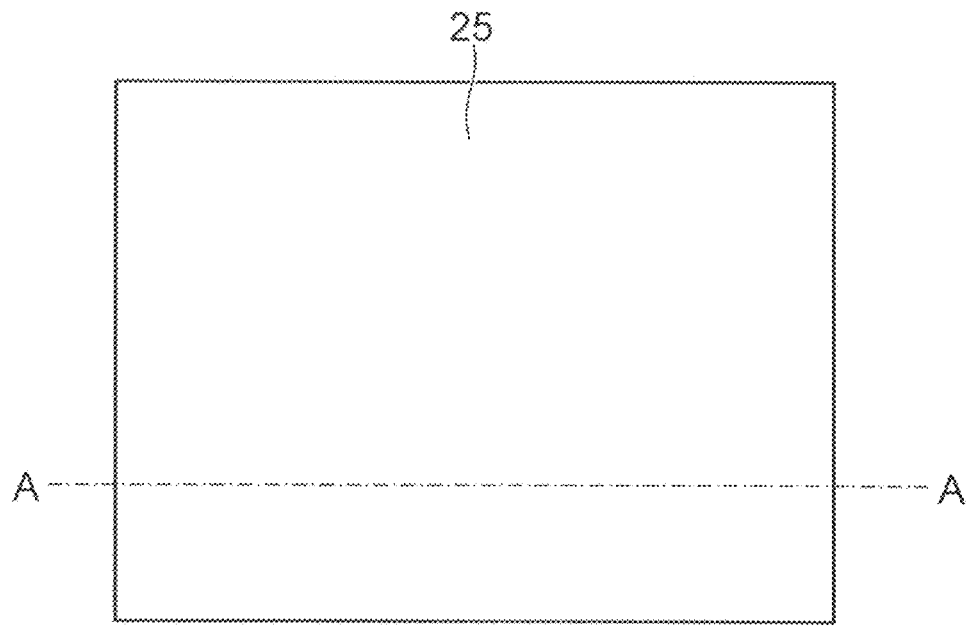
Figure 18B:
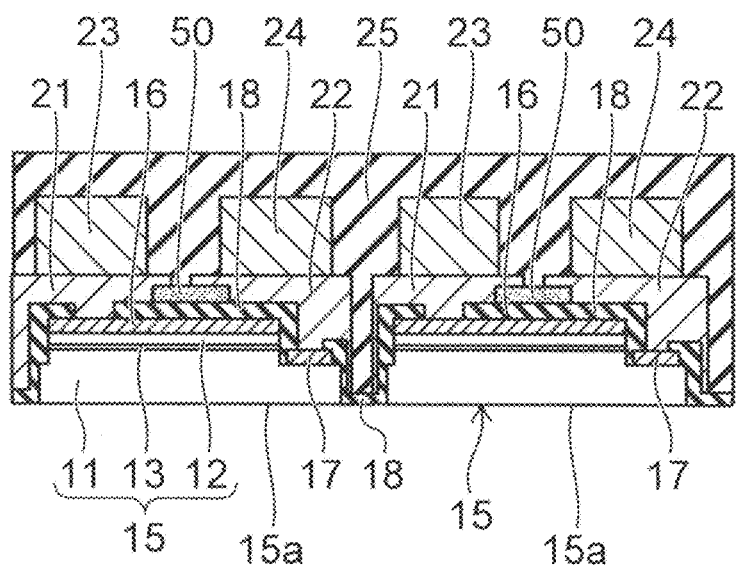

The support body 100 includes the resin layer 25, the p-side interconnect unit 41, and the n-side interconnect unit 43. As shown in FIGS. 18A and 18B, the substrate 10 is removed in the state in which the semiconductor layer 15 is supported by the support body 100.

For example, the substrate 10 which is a silicon substrate is removed by wet etching. Or, in the case where the substrate 10 is a sapphire substrate, the substrate 10 can be removed by laser lift-off.

There are cases where the semiconductor layer 15 that is epitaxially grown on the substrate 10 has a large internal stress. The p-type metal pillar 23, the n-side metal pillar 24, and the resin layer 25 are materials that are more flexible than the semiconductor layer 15 that is made of, for example, a GaN-based material. Accordingly, even in the case where the internal stress of the epitaxial growth is relieved all at once when peeling the substrate 10, the stress is absorbed by the p-type metal pillar 23, the n-side metal pillar 24, and the resin layer 25. Therefore, damage of the semiconductor layer 15 in the process of removing the substrate 10 can be avoided.

Figure 19A:
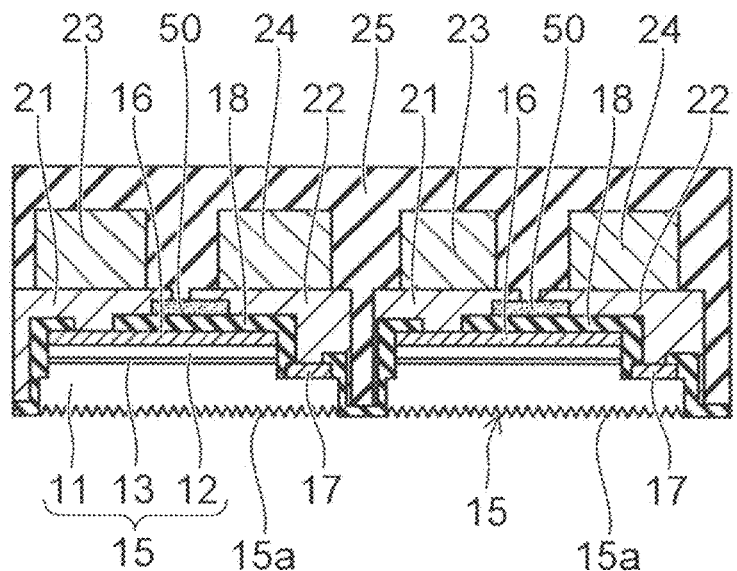

The first surface 15a of the semiconductor layer 15 is exposed by the removal of the substrate 10. As shown in FIG. 19A, a fine unevenness is formed in the first surface 15a that is exposed. For example, wet etching of the first surface 15a is performed using a KOH (potassium hydroxide) aqueous solution, TMAH (tetramethyl ammonium hydroxide), etc. Different etching rates that depend on the crystal plane orientation occur in the etching. Therefore, the unevenness can be formed in the first surface 15a. The extraction efficiency of the radiated light of the light emitting layer 13 can be increased by forming the unevenness in the first surface 15a.

Or, the fine unevenness may be formed in the first surface 15a by etching using a resist film formed by lithography as a mask.

Figure 19B:
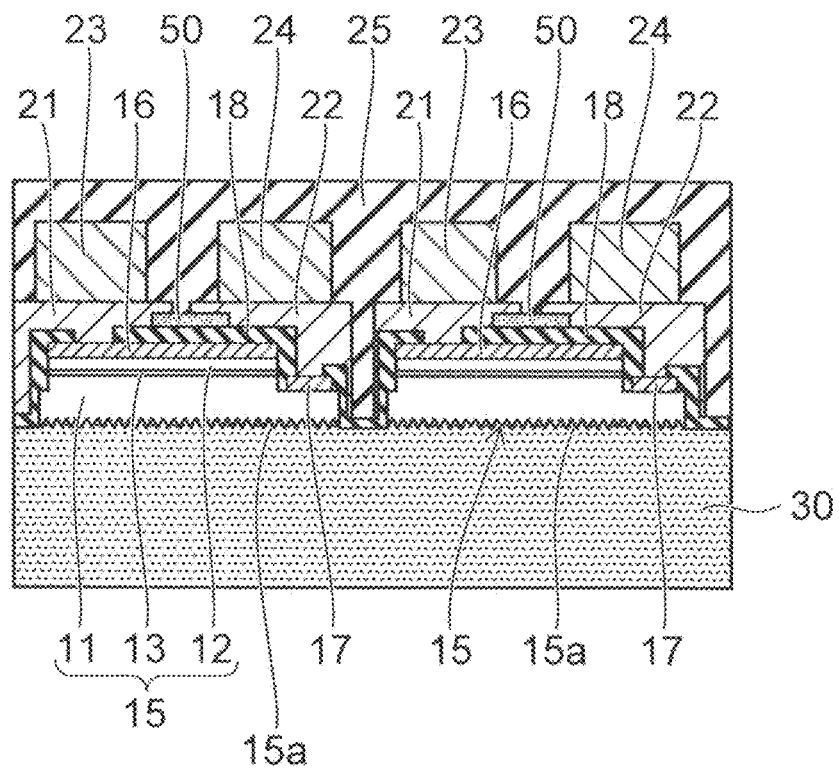

As shown in FIG. 19B, the fluorescer layer 30 is formed on the first surface 15a with a not-shown insulating film interposed. The fluorescer layer 30 is formed by a method such as, for example, screen printing, potting, molding, compression molding, etc. Or, the fluorescer layer 30 that has a film configuration is adhered to the first surface 15a with a not-shown insulating film interposed. The insulating film between the first surface 15a and the fluorescer layer 30 may be omitted if necessary.

After forming the fluorescer layer 30, the p-type metal pillar 23 and the n-side metal pillar 24 are exposed from the resin layer 25 as shown in FIG. 20A by polishing the surface of the resin layer 25 (in FIG. 20B, the upper surface) using, for example, a back side grinder, etc. The exposed surface of the p-type metal pillar 23 is used as the p-side external terminal 23a; and the exposed surface of the n-side metal pillar 24 is used as the n-side external terminal 24a.

Figure 21A:
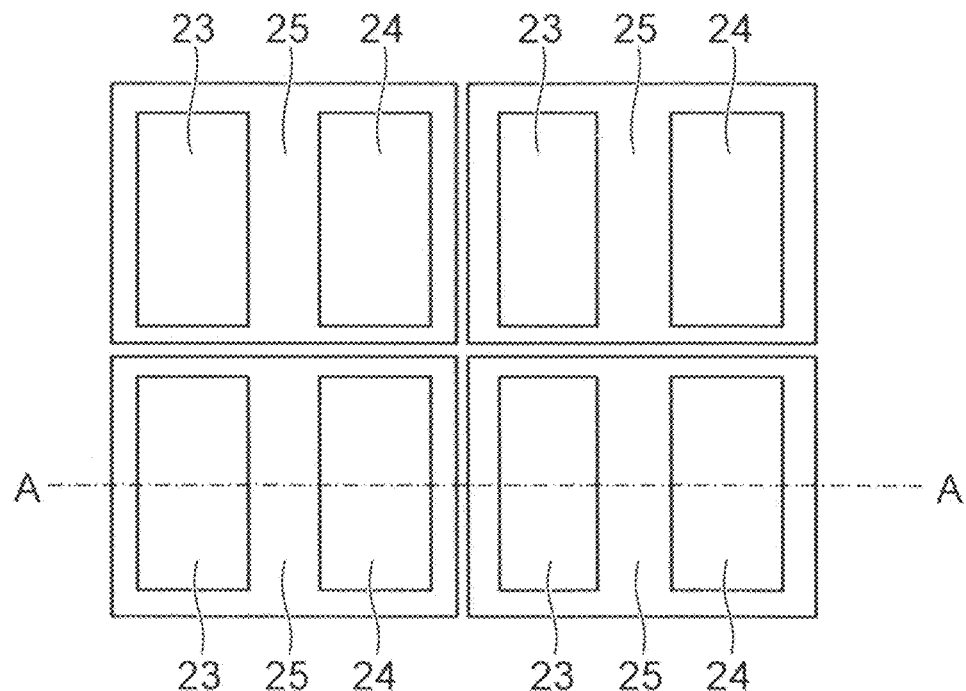
Figure 21B:
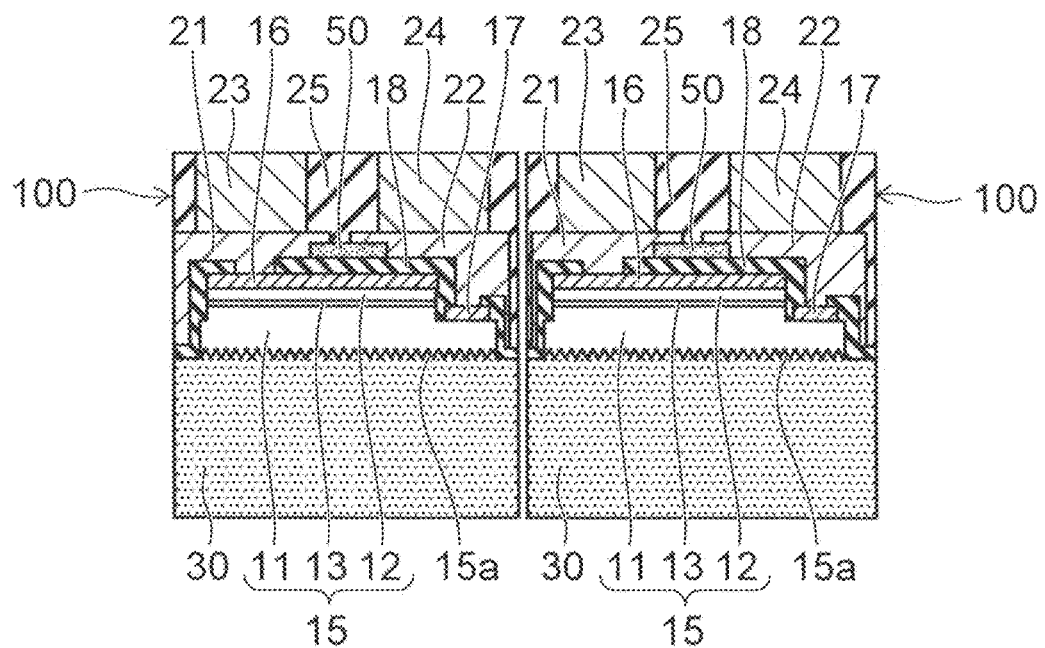

Then, as shown in FIGS. 21A and 21B, dicing of the wafer is performed in the region where the trench 91 described above that divides the multiple semiconductor layers 15 is made. In other words, the fluorescer layer 30, the insulating film 18, and the resin layer 25 are cut. These components are cut by, for example, a dicing blade or laser light. The semiconductor layer 15 is not damaged by the dicing because the semiconductor layer 15 does not exist in the dicing region.

The processes described above prior to the singulation are performed in the wafer state that includes many semiconductor layers 15. The wafer is singulated into semiconductor light emitting devices including at least one semiconductor layer 15 each. The semiconductor light emitting device may have a single-chip structure including one semiconductor layer 15; or a multi-chip structure including multiple semiconductor layers 15 may be used.

Because the processes described above prior to the singulation can be performed collectively in the wafer state, it is unnecessary to perform the formation of the interconnect layers, the formation of the pillars, the packaging with the resin layer, and the formation of the fluorescer layer for every singulated individual device; and a drastic cost reduction is possible.

Because the support body 100 and the fluorescer layer 30 are cut after being formed in the wafer state, the side surface of the fluorescer layer 30 is aligned with the side surface of the support body 100 (the side surface of the resin layer 25); and these side surfaces form the side surface of the singulated semiconductor light emitting device. And, because there is no substrate 10, a small semiconductor light emitting device having a chip size package structure can be provided.

Figure 1B:
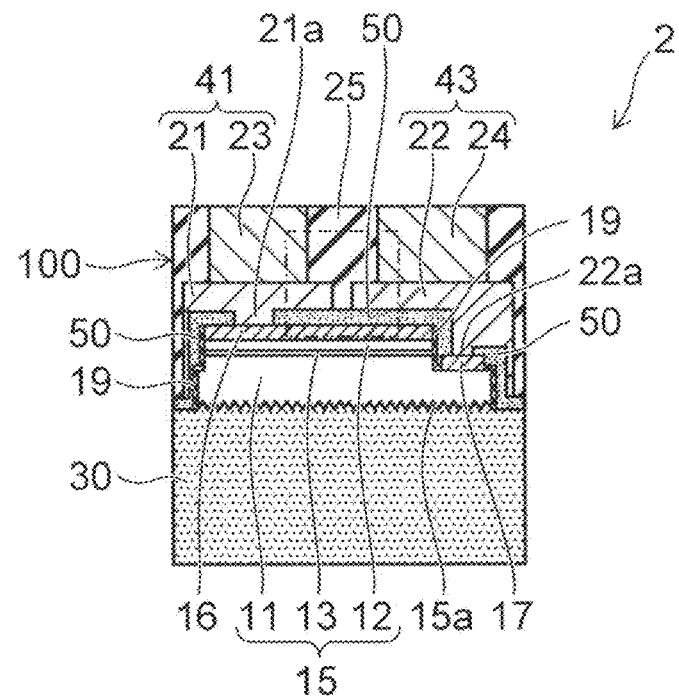

FIG. 1B is a schematic cross-sectional view of a semiconductor light emitting device 2 according to a modification of the first embodiment.

Figure 5:
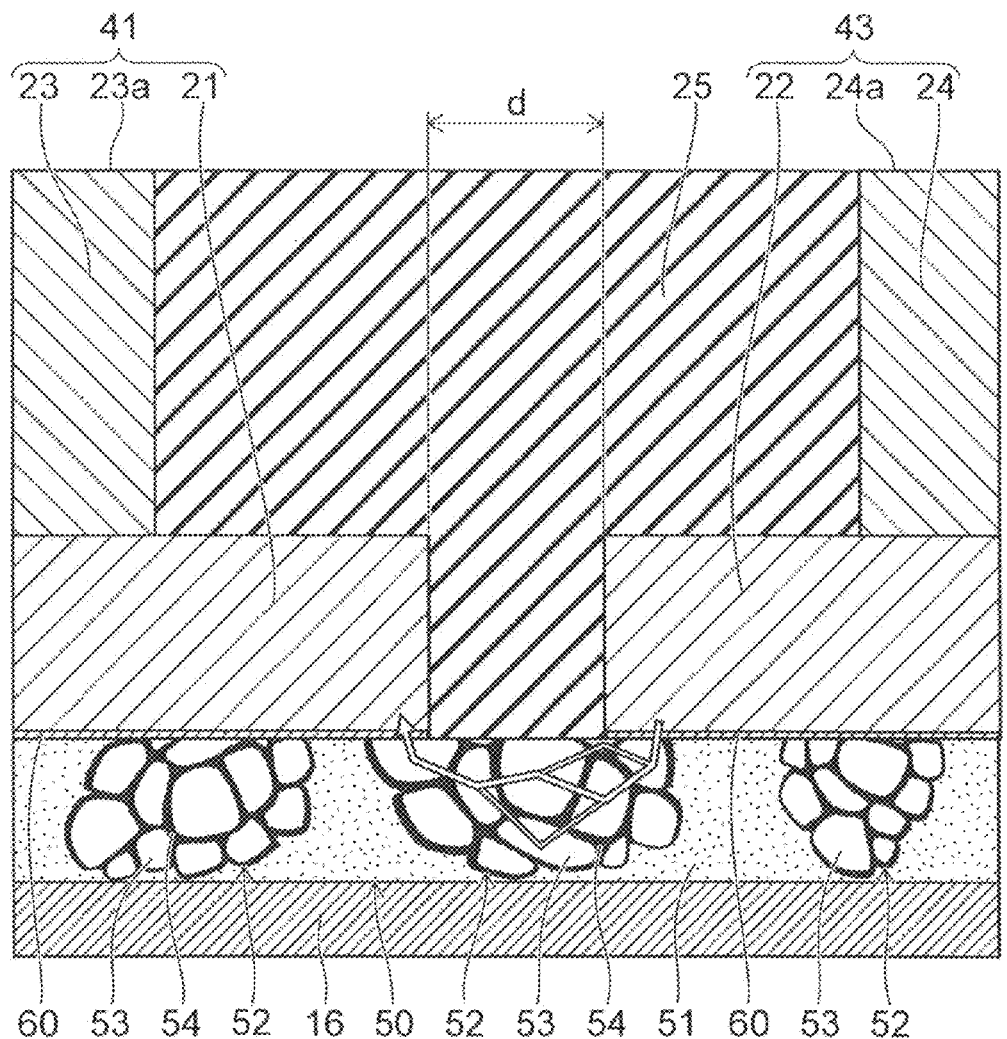

FIG. 5 is a schematic enlarged cross-sectional view of the portion of FIG. 1B surrounded with the double dot-dash line.

According to the semiconductor light emitting device 2, the composite resin 50 that has the varistor characteristic described above is provided on the second surface side of the semiconductor layer 15. The composite resin 50 covers the second surface of the semiconductor layer 15, the p-side electrode 16, and the n-side electrode 17.

An inorganic insulating film 19 such as, for example, a silicon oxide film, etc., is provided as a passivation film on the side surface of the semiconductor layer 15. The composite resin 50 is provided also on the side surface of the semiconductor layer 15 with the inorganic insulating film 19 interposed.

The p-side interconnect layer 21 and the n-side interconnect layer 22 are provided on the composite resin 50 to be separated from each other. The p-side interconnect layer 21 is electrically connected to the p-side electrode 16 by the via 21a that pierces the composite resin 50. The n-side interconnect layer 22 is electrically connected to the n-side electrode 17 by the via 22a that pierces the composite resin 50.

As shown in FIG. 5, the foundation metal film 60 of the p-side interconnect unit 41 and the foundation metal film 60 of the n-side interconnect unit 43 directly contact the first powder body 52 without the resin component 51 interposed. Therefore, the contact resistance between the p-side interconnect unit 41 and the first powder body 52 and the contact resistance between the n-side interconnect unit 43 and the first powder body 52 can be low; and a path that has low resistance when releasing the surge is obtained.

The foundation metal films 60 of the p-side interconnect unit 41 and the n-side interconnect unit 43 have surface contact with the surface of the composite resin 50 having the film configuration. In other words, the foundation metal films 60 can have surface contact with the multiple primary particles 53. Therefore, the multiple primary particles 53 are connected in parallel between the foundation metal films 60; and the surge immunity of the path itself is increased.

In the semiconductor light emitting device 2 as well, the semiconductor layer 15 and the first powder body 52 are connected in parallel between the p-side external terminal 23a and the n-side external terminal 24a; and the first powder body functions as a protection element that protects the semiconductor layer 15 from the surge voltage. The surge current can flow between the p-side external terminal 23a and the n-side external terminal 24a via the first powder body 52 without passing through the semiconductor layer 15.

In the normal operation in which a power supply voltage of the rated voltage or less is applied between the p-side external terminal 23a and the n-side external terminal 24a, the first powder body 52 is in a high resistance state due to the Schottky barrier of the grain boundary 54 vicinity; and the p-side interconnect unit 41 and the n-side interconnect unit 43 are not shorted via the first powder body 52.

The sizes of the primary particles 53 are less than the minimum distance d between the p-side interconnect layer 21 and the n-side interconnect layer 22 on the composite resin 50. Therefore, a bridge is not formed between the p-side interconnect layer 21 and the n-side interconnect layer 22 by only one primary particle 53.

Also, because the size of the first powder body 52 is greater than the minimum distance d between the p-side interconnect layer 21 and the n-side interconnect layer 22, a surge path that directly bridges the minimum distance d can be formed of the first powder body 52 as shown in FIG. 5.

There is always at least one grain boundary 54 having a Schottky barrier characteristic that exists in the path between the p-side interconnect layer 21 and the n-side interconnect layer 22 bridged by the polycrystalline first powder body 52 in which the multiple primary particles 53 are bound via the grain boundary 54. Accordingly, in the normal operation, the p-side interconnect layer 21 and the n-side interconnect layer 22 are not shorted.

Also, the spacing between the p-side interconnect layer 21 and the n-side interconnect layer 22 on the composite resin 50 can be constant due to the patterning of the resist film.

The multiple first powder bodies 52 can exist along the longitudinal direction (in FIG. 5, the direction piercing the page surface) in the region of the constant spacing to bridge the spacing recited above. By adjusting the particle diameters of the primary particles 53 of the first powder body 52 to have little fluctuation, multiple paths having equal numbers of the grain boundaries 54 in series are formed; and the surge immunity of the path itself improves.

The composite resin 50 having the varistor characteristic is built-into the semiconductor light emitting device 2. Accordingly, it is unnecessary to connect an external static electricity protection circuit to the semiconductor light emitting device 2. In other words, it is unnecessary to mount a Zener diode as an ESD protection element of the LED. Accordingly, the semiconductor light emitting device 2 having excellent electrostatic immunity can be provided without impeding the downsizing of the semiconductor light emitting device 2 in a chip size package structure.

Second Embodiment

In a second embodiment as well, a semiconductor light emitting device (an LED device) is described as an example of an electronic device.

Figure 22:
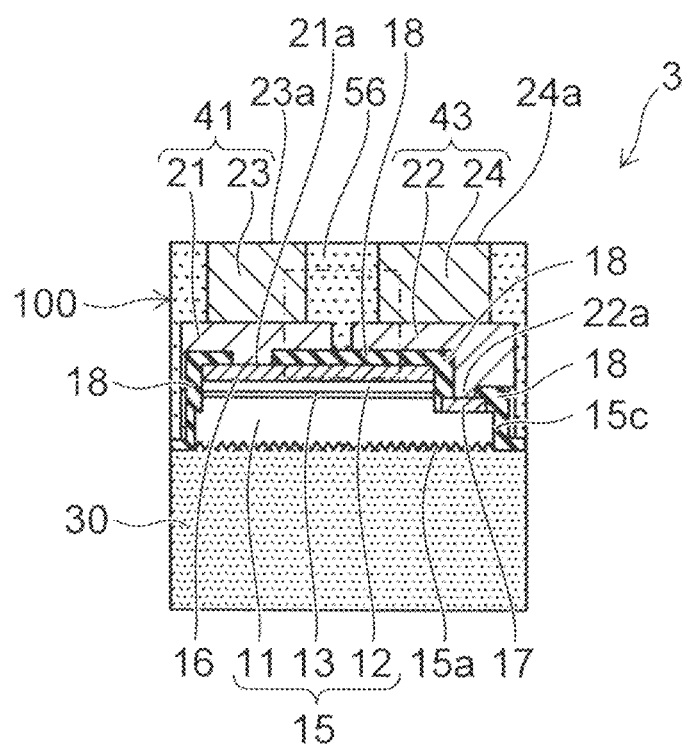
FIG. 22 to FIG. 25 are schematic cross-sectional views of a semiconductor light emitting device of a second embodiment.

FIG. 22 is a schematic cross-sectional view of the semiconductor light emitting device 3 of the second embodiment.

According to the semiconductor light emitting device 3 of the second embodiment, a resin layer 56, which is included in the support body 100 with the interconnect units 41 and 43, is a composite resin having a varistor characteristic. Otherwise, the configuration is the same as that of the semiconductor light emitting device of the first embodiment; and a detailed description is omitted.

According to the semiconductor light emitting device 3 of the second embodiment, the resin layer (composite resin) 56 is provided between the p-side interconnect unit 41 and the n-side interconnect unit 43. The resin layer 56 is provided between the p-type metal pillar 23 and the n-side metal pillar 24 to contact the side surface of the p-type metal pillar 23 and the side surface of the n-side metal pillar 24. In other words, the resin layer 56 is filled between the p-type metal pillar 23 and the n-side metal pillar 24.

The resin layer 56 is provided also between the p-side interconnect layer 21 and the n-side interconnect layer 22 on the insulating film 18. The resin layer 56 is provided around the p-type metal pillar 23 and around the n-side metal pillar 24 to cover the side surface of the p-type metal pillar 23 and the side surface of the n-side metal pillar 24.

The resin layer 56 is provided also in the region around the side surface of the semiconductor layer 15 to cover the side surface of the semiconductor layer 15 with the insulating film 18 and the p-side interconnect layer 21 interposed or with the insulating film 18 and the n-side interconnect layer 22 interposed.

The end portion (the surface) of the p-type metal pillar 23 on the side opposite to the p-side interconnect layer 21 is exposed from the resin layer 56 and functions as the p-side external terminal 23a that is connectable to an external circuit such as a mounting substrate, etc. The end portion (the surface) of the n-side metal pillar 24 on the side opposite to the n-side interconnect layer 22 is exposed from the resin layer 56 and functions as the n-side external terminal 24a that is connectable to an external circuit such as a mounting substrate, etc. The p-side external terminal 23a and the n-side external terminal 24a are bonded to a land pattern of the mounting substrate via, for example, solder or a bonding agent that is conductive.

Figure 33A:
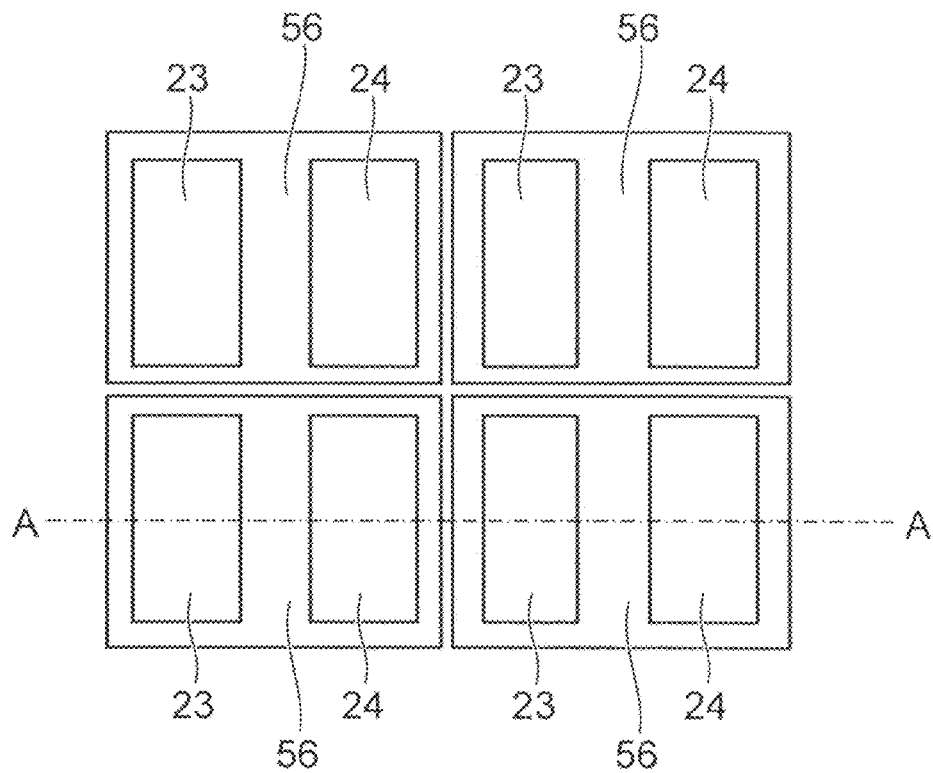

As shown in FIG. 33A, the p-side external terminal 23a and the n-side external terminal 24a are formed to be arranged in the same surface of the resin layer 56 to be separated from each other. The spacing between the p-side external terminal 23a and the n-side external terminal 24a is wider than the spacing between the p-side interconnect layer 21 and the n-side interconnect layer 22 on the insulating film 18.

The spacing between the p-side external terminal 23a and the n-side external terminal 24a is set to be larger than the spread of the solder in the mounting. Thereby, shorts between the p-side external terminal 23a and the n-side external terminal 24a via the solder can be prevented.

Conversely, the spacing between the p-side interconnect layer 21 and the n-side interconnect layer 22 can be reduced to the process limits. Therefore, the surface area of the p-side interconnect layer 21 and the contact surface area between the p-side interconnect layer 21 and the p-type metal pillar 23 can be increased. Thereby, the dissipation of the heat of the light emitting layer 13 can be promoted.

The thickness (the thickness in the direction connecting the p-side interconnect layer 21 and the p-side external terminal 23a) of the p-type metal pillar 23 is thicker than the thickness of the p-side interconnect layer 21. The thickness (the thickness in the direction connecting the n-side interconnect layer 22 and the n-side external terminal 24a) of the n-side metal pillar 24 is thicker than the thickness of the n-side interconnect layer 22. The thicknesses of the p-type metal pillar 23, the n-side metal pillar 24, and the resin layer 56 are thicker than the semiconductor layer 15.

The thickness of the support body 100 that includes the p-side interconnect layer 21, the n-side interconnect layer 22, the p-type metal pillar 23, the n-side metal pillar 24, and the resin layer 56 is thicker than the thickness of the LED chip that includes the semiconductor layer 15, the p-side electrode 16, and the n-side electrode 17.

The semiconductor layer 15 is formed by epitaxial growth on a substrate. The substrate is removed after forming the support body 100; and the semiconductor layer 15 does not include a substrate on the first surface 15a side. The semiconductor layer 15 is supported not by a substrate that is rigid and has a plate configuration but by the support body 100 which is a compound body including the metal pillars and the resin layer 56.

For example, copper, gold, nickel, silver, etc., may be used as the material of the p-side interconnect unit 41 and the n-side interconnect unit 43. Among these, good thermal conductivity, high migration resistance, and better adhesion with insulating materials can be obtained when copper is used.

The resin layer 56 reinforces the p-type metal pillar 23 and the n-side metal pillar 24. Also, the resin layer 56 may have light-shielding to the light emitted by the light emitting layer 13 by including a powder body that is light-absorbing such as carbon black, etc., or a powder body that is light-reflective such as metal, alloy, etc., in the resin that is used as the base of the resin layer 56. Thereby, the light leakage from the side surface and mounting surface side of the support body 100 can be suppressed.

The stress that is caused by the solder, etc., that bonds the p-side external terminal 23a and the n-side external terminal 24a to the lands of the mounting substrate is applied to the semiconductor layer 15 by the thermal cycles in the mounting of the semiconductor light emitting device 3. The stress is absorbed and relaxed by the p-type metal pillar 23, the n-side metal pillar 24, and the resin layer 56. In particular, the stress relieving effect can be increased by using the resin layer 56 that is more flexible than the semiconductor layer 15 as a portion of the support body 100.

The fluorescer layer 30 is limited to being provided on the first surface 15a of the semiconductor layer 15 and on the region around the side surface 15c of the semiconductor layer 15 and is not formed to extend around to the second surface side of the semiconductor layer 15, around the metal pillars 23 and 24, or around to the side surface of the support body 100. The side surface of the fluorescer layer 30 and the side surface of the support body 100 (the side surface of the resin layer 56) are aligned.

In other words, the semiconductor light emitting device 3 of the second embodiment also is an extremely small semiconductor light emitting device having a chip size package structure. Therefore, the degrees of freedom of, for example, light fixture designs are higher in applications for light fixtures for illumination, etc.

In the second embodiment as well, color breakup and uneven color due to the light of the light emitting layer 13 that has a strong tint leaking from the substrate side surface can be prevented because there is no substrate between the first surface 15a and the fluorescer layer 30.

Further, according to the embodiment, the light that is traveling from the light emitting layer 13 toward the side surface 15c of the semiconductor layer 15 does not leak to the outside because the resin layer 56 that is light-shielding and includes the reflective metal (the aluminum film 61) described above is provided at the side surface 15c of the semiconductor layer 15. Therefore, in addition to the feature of having no substrate on the first surface 15a side, color breakup and uneven color due to the light leakage from the side surface of the semiconductor light emitting device 3 can be prevented.

The composite resin 56 will now be described.

Figure 23:
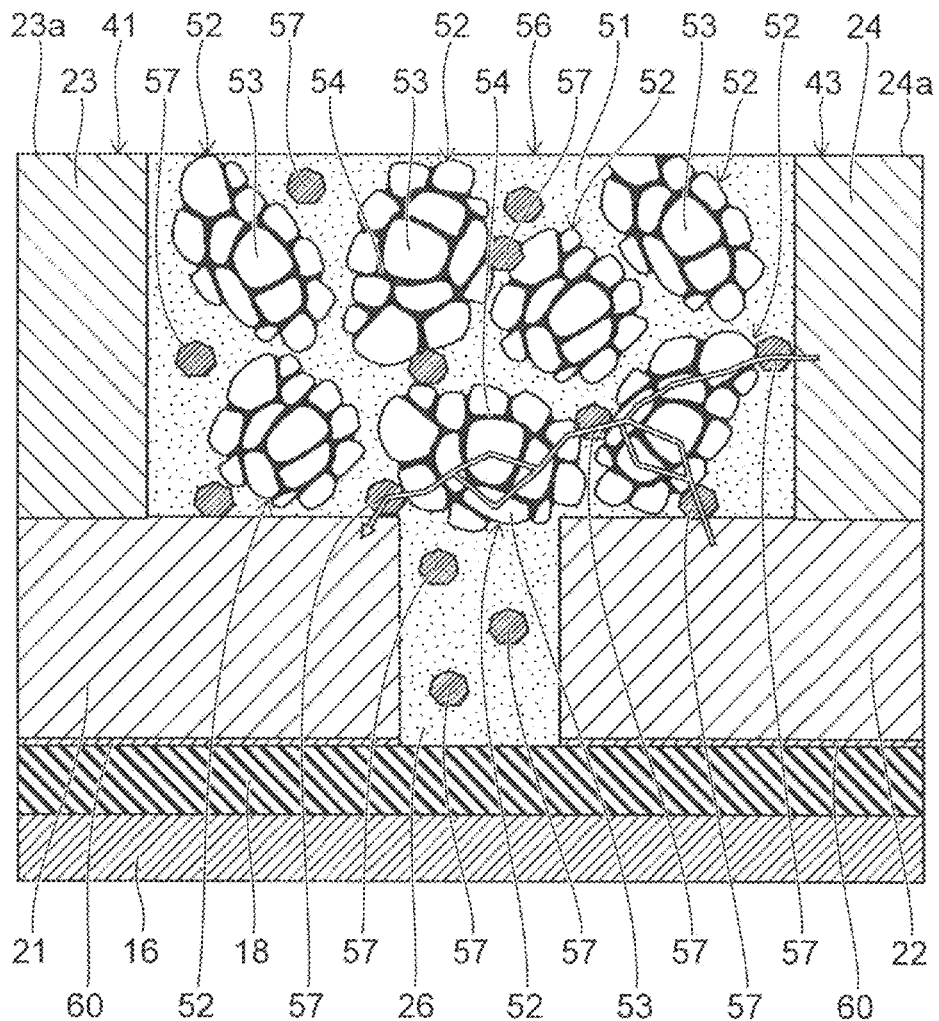

FIG. 23 is a schematic enlarged cross-sectional view of the portion of FIG. 22 surrounded with the double dot-dash line.

The composite resin 56 includes the resin component 51 that is insulative, and the multiple first powder bodies 52 that are dispersed in the resin component 51. The first powder body 52 is a polycrystalline powder body in which the multiple primary particles 53 are bound via the grain boundary 54.

The primary particle 53 includes, for example, zinc oxide as a major component. A component that is different from the major component of the primary particle 53 segregates in the grain boundary 54. For example, at least one selected from bismuth oxide and praseodymium oxide segregates in the grain boundary 54.

As shown in FIG. 38, the first powder body 52 has a nonlinear current-voltage characteristic in which the resistance decreases as the applied voltage increases, i.e., a varistor characteristic.

At least one selected from cobalt, manganese, chrome, antimony, strontium, lead, barium, and magnesium is added to the first powder body 52. These additives can cause the resistance change to be abrupt.

In the composite resin 56 of the second embodiment, multiple second powder bodies 57 that are conductive are dispersed in the resin component 51.

The second powder body 57 is a metal particle that is smaller than the first powder body 52. The second powder body 57 is a metal that does not oxidize easily such as, for example, gold or platinum. Or, the second powder body 57 is a low melting-point metal such as tin, bismuth, indium, etc. Or, the second powder body 57 is a low cost metal such as copper or nickel. Or, the second powder body 57 is an alloy-based metal such as a 42 alloy, invar, kovar, etc. that does not oxidize easily and has characteristic of a small coefficient of thermal expansion.

Figure 24:
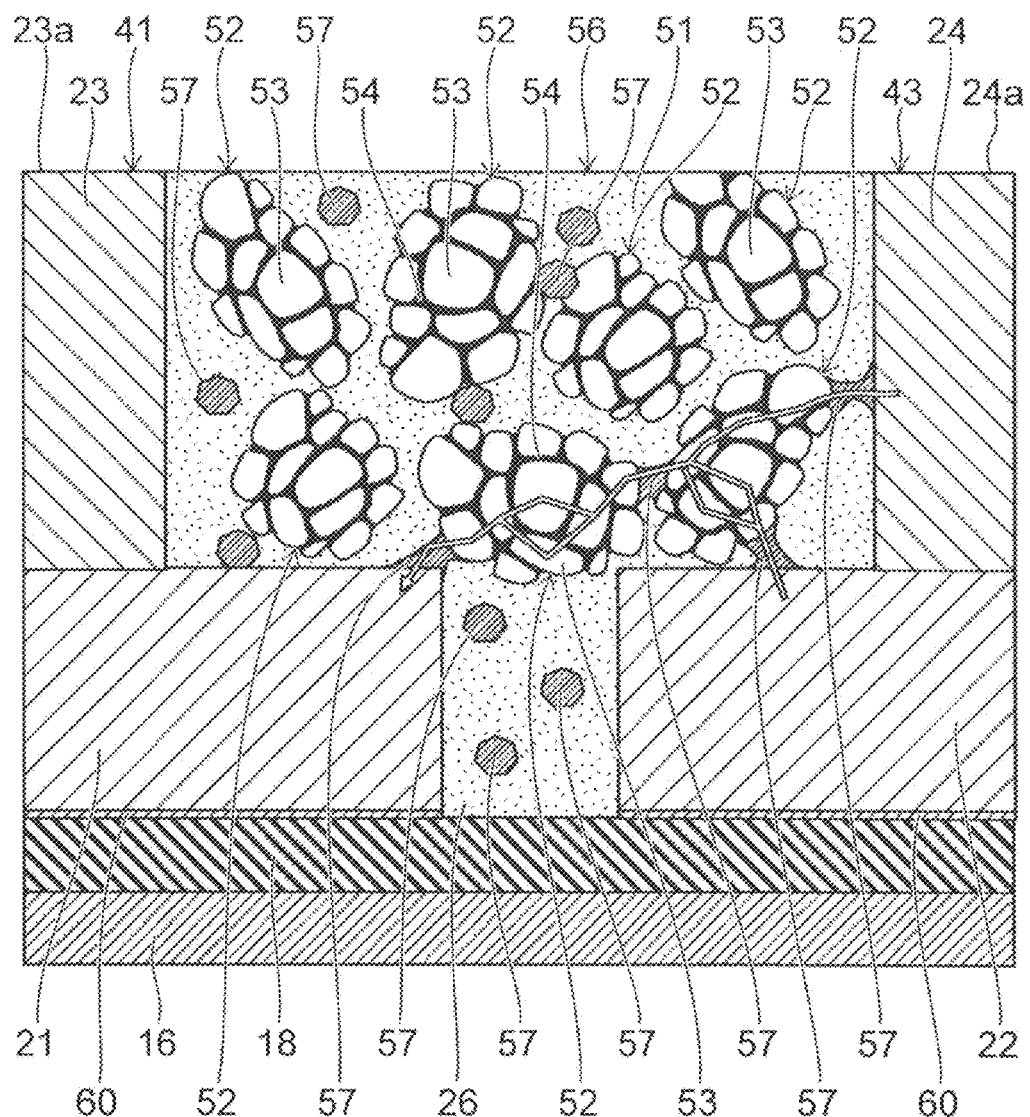
Figure 25:
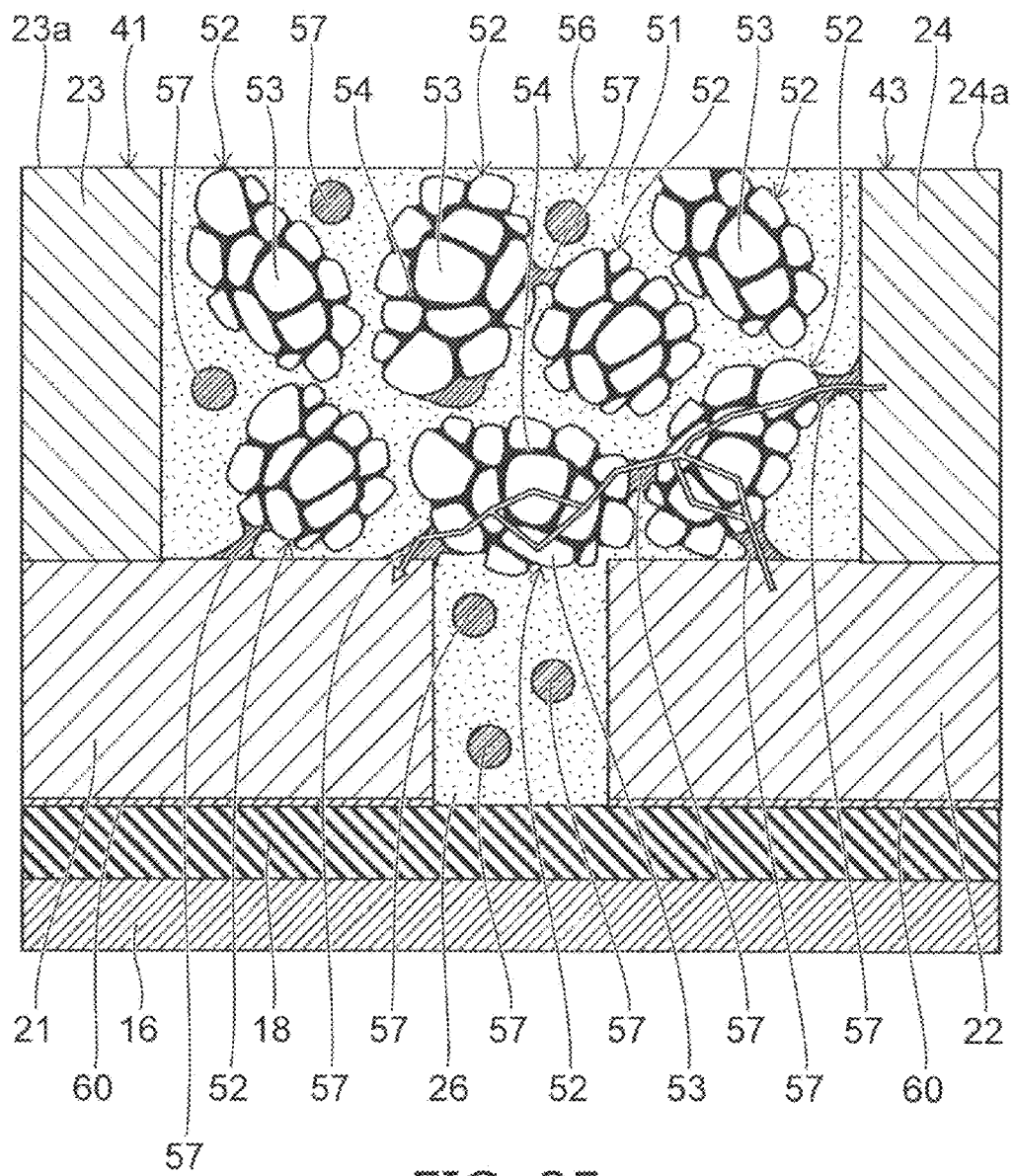

Similarly to the first embodiment, although the first powder body 52 is an insulator at or below the rated voltage, the resistance of the first powder body 52 decreases when a high voltage such as a surge, etc., is applied; and a bypass path (a short-circuit path) that releases the surge is formed in the first powder body 52. In FIG. 23 to FIG. 25, the bypass path of the surge is illustrated schematically by white arrows with black outlines. The voltage (the breakdown voltage) at which the resistance decreases abruptly is proportional to the number of the grain boundaries 54 existing in series in the surge bypass path.

The surface of the p-side interconnect unit 41 and the surface of the n-side interconnect unit 43 are connected to the first powder body 52 via the second powder body 57 that is conductive. Therefore, the resistance between the p-side interconnect unit 41 and the first powder body 52 and the resistance between the n-side interconnect unit 43 and the first powder body 52 can be low; and a bypass path that has low resistance when releasing the surge is obtained.

The multiple first powder bodies 52 are dispersed at a high density such that the spacing where the multiple first powder bodies 52 are proximal to each other is not more than the size of the second powder body 57. Therefore, the second powder body 57 is interposed between the first powder bodies 52 that are proximal to each other to contact the first powder bodies 52; and the resistance between the first powder bodies 52 that are proximal to each other also can be reduced.

The composite resin 56 is formed, for example, in a liquid state including a solvent and subsequently cured. Therefore, the second powder bodies 57 contact the first powder bodies 52 and the interconnect units 41 and 43 more easily due to the contraction in the curing and/or when the solvent evaporates.

In the state in which the volume of the resin component 51 prior to the contraction in the curing and/or solvent evaporation is large, the resin layer 55 can have low viscosity; and the resin layer (composite resin) 56 is easy to form.

In the second embodiment as well, the semiconductor layer 15 and the first powder body 52 are connected in parallel between the p-side external terminal 23a and the n-side external terminal 24a that are exposed to the outside in the state prior to mounting; and the first powder body 52 functions as a protection element that protects the semiconductor layer 15 from the surge voltage. The surge current can flow between the p-side external terminal 23a and the n-side external terminal 24a via the first powder body 52 without passing through the semiconductor layer 15.

In the normal operation in which a power supply voltage of the rated voltage or less is applied between the p-side external terminal 23a and the n-side external terminal 24a, the first powder body 52 is in a high resistance state due to the Schottky barrier of the grain boundary 54 vicinity; and the p-side interconnect unit 41 and the n-side interconnect unit 43 are not shorted via the first powder body 52.

The sizes of the primary particles 53 are less than the minimum distance between the p-side interconnect layer 21 and the n-side interconnect layer 22 on the insulating film 18. Therefore, a bridge is not formed between the p-side interconnect layer 21 and the n-side interconnect layer 22 by only one primary particle 53.

A surge path that directly bridges the minimum distance can be formed of the first powder body 52 because the size of the first powder body 52 is greater than the minimum distance between the p-side interconnect layer 21 and the n-side interconnect layer 22.

Accordingly, there is always at least one grain boundary 54 having a Schottky barrier characteristic that exists in the path between the p-side interconnect layer 21 and the n-side interconnect layer 22 bridged by the polycrystalline first powder body 52 in which the multiple primary particles 53 are bound via the grain boundary 54. Accordingly, in the normal operation, the p-side interconnect layer 21 and the n-side interconnect layer 22 are not shorted.

Also, because the sizes of the second powder bodies 57 are less than the minimum distance between the p-side interconnect layer 21 and the n-side interconnect layer 22, shorts in which the second powder bodies 57 form bridges do not occur between the p-side interconnect layer 21 and the n-side interconnect layer 22.

Because the compounding ratio of the multiple second powder bodies 57 in the resin component 51 is set low enough that the second powder bodies 57 are not bridged to each other, a short-circuit path of only the second powder bodies 57 is not made.

Because the sizes of the second powder bodies 57 are less than the minimum distance between the p-side interconnect layer 21 and the n-side interconnect layer 22 as described previously, bridges between the second powder bodies 57 do not occur easily as long as the compounding ratio of the plurality of second powder bodies 57 to the resin component 51 is extremely large. On the other hand, because the number of surge paths increases as the compounding ratio of the plurality of second powder bodies 57 to the resin component 51 increases, the compounding ratio is preferred to be large. In that case, the influence of the characteristics of the second powder bodies 57 itself increases to the characteristics of the composite resin 56. Because the coefficient of thermal expansion of the composite resin 56 is necessary to be small in order to suppress warpage of a device or wafer, it is favorable to use a material with a low coefficient of thermal expansion such as the 42 alloy, invar, kovar, etc. for the second powder bodies 57.

The coefficient of thermal expansion of the second powder bodies 57 is favorable to be not more than the coefficient of thermal expansion (a-axis direction) 5.5 ppm of gallium nitride, for example. In this case, the coefficient of thermal expansion of the whole composite resin 56 is closer to that of gallium nitride forming the light emitting element by addition of the second powder bodies 57.

For example, the 42 alloy has the coefficient of thermal expansion of approximately 4.5 to 6.5 ppm, and kovar has the coefficient of thermal expansion of approximately 5 ppm.

Furthermore, the coefficient of thermal expansion of the second powder bodies 57 is more preferable to be not more than the coefficient of thermal expansion (c-axis direction) 3.9 ppm of zinc oxide which is the first powder body 52. In this case, the coefficient of thermal expansion of the whole composite resin 56 can be further less than that for combination of only the first powder body 52 and the resin component 51.

Invar made of iron 65% and nickel 35% has the coefficient of thermal expansion of 1.2 ppm and stainless invar made of iron 64%, nickel 32% and cobalt 4% added with super invar or chromium has the coefficient of thermal expansion of 0 ppm.

Because an epoxy resin used for the resin component 51 generally has a large coefficient of thermal expansion of approximately 60 ppm, it is difficult to reduce the coefficient of thermal expansion of the whole composite resin 56 to the coefficient of thermal expansion 5.5 ppm of gallium nitride even if using zinc oxide with the coefficient of thermal expansion 3.9 ppm for the first powder body 52. Here, the coefficient of thermal expansion of the whole composite resin 56 can be closer to the coefficient of thermal expansion 5.5 ppm of gallium nitride by using the second powder bodies 57 having small coefficient of thermal expansion.

Furthermore, when the coefficient of thermal expansion of the second powder bodies 57 is less than the coefficient of thermal expansion 3.9 of zinc oxide, for example, even if small diameter particles of the first powder body 52 exist at the vicinity of the second powder bodies 57, a conductive path is formed easily by the second powder bodies 57. This is because the second powder bodies 57 become relatively large in comparison with the small diameter particles of the first powder body 52 by temperature fall of the composite resin 56 to room temperature after thermal curing.

According to the second embodiment, the composite resin 56 having a varistor characteristic is provided as a sealing resin of the semiconductor light emitting device 3. Accordingly, it is unnecessary to connect an external static electricity protection circuit to the semiconductor light emitting device 3. In other words, it is unnecessary to mount a Zener diode as an ESD protection element of the LED. Accordingly, according to the second embodiment, the semiconductor light emitting device 3 having excellent electrostatic immunity can be provided without impeding the downsizing of the semiconductor light emitting device 3 in a chip size package structure.

Also, a powder body that is light-absorbing such as carbon black, etc., or the powder body 26 that is light-shielding such as a powder body that is light-reflective such as metal, alloy, etc., may be included inside the resin component 51 of the composite resin 56. In other words, the composite resin 56 is light-shielding to the light emitted by the light emitting layer 13. Thereby, it is possible to protect the first powder body 52 from the light emitted by the light emitting layer 13; and misoperations, etc., of the first powder body 52 can be suppressed.

As shown in FIG. 24, after forming the composite resin 56, the second powder bodies 57 that exist inside the surge bypass path can be melted and fused to the surfaces of the first powder bodies 52 and/or the surfaces of the interconnect units 41 and 43 by the heat generation due to the surge applied between the p-side interconnect unit 41 and the n-side interconnect unit 43.

In other words, the second powder bodies 57 are melted into a configuration of wetting onto the surfaces of the first powder bodies 52 and/or the surfaces of the interconnect units 41 and 43 to contact the surfaces of the first powder bodies 52 and/or the surfaces of the interconnect units 41 and 43. Therefore, the contact resistance between the second powder body 57 and the first powder body 52 and the contact resistance between the second powder body 57 and the interconnect units 41 and 43 can be reduced.

By using a metal that has a melting point lower than the tolerable temperature of the resin component 51 as the second powder bodies 57, the second powder bodies 57 can melt and fuse to the surfaces of the first powder bodies 52 and/or the surfaces of the interconnect units 41 and 43 as shown in FIG. 25 by the heating when forming the composite resin 56 or in previous or subsequent processes. Thereby, the contact resistance between the second powder body 57 and the first powder body 52 and/or the contact resistance between the second powder body 57 and the interconnect units 41 and 43 can be reduced.

Figure 26A:
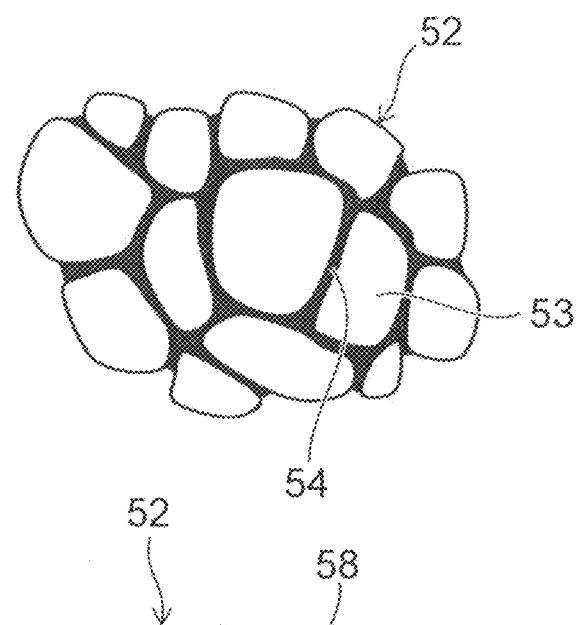
FIG. 26A to FIG. 26C are schematic views of the first powder bodies.
Figure 26B:
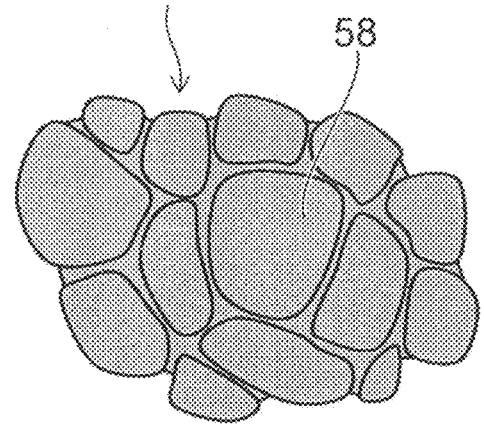
Figure 26C:
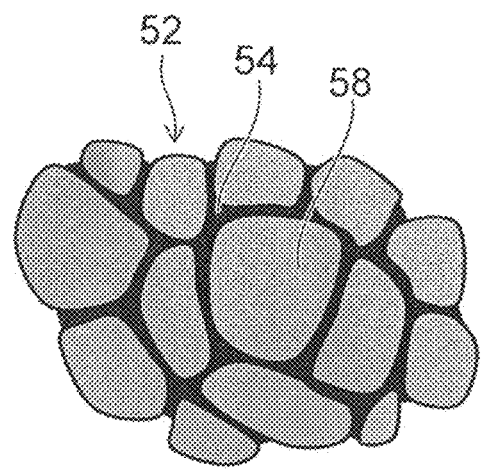

In the case where a thin metal film 58 is formed discontinuously on the surface of the first powder body 52 as shown in FIG. 26C, defects in which the metal film 58 forms a short-circuit path at the surface of the first powder body 52 do not occur even though the contact resistance between the first powder body 52 and the second powder body 57 is reduced.

FIGS. 26A to 26C are schematic views showing a method for forming the discontinuous metal film 58 on the surface of the first powder body 52.

The first powder body 52 that has the primary particles 53 exposed at the surface of the first powder body 52 can be manufactured by, for example, the methods of FIG. 6, FIG. 7, and FIG. 8 described above.

The metal film 58 is formed by, for example, sputtering, etc., on the surface of the first powder body 52. At this point in time, as shown in FIG. 26B, the metal film 58 is formed continuously on the surfaces of the primary particles 53 and the surface of the grain boundary 54.

Then, the metal film 58 that is formed on the surface of the grain boundary 54 is melted by heating to at least the melting point of the bismuth oxide or praseodymium oxide segregated at the grain boundary 54 in the state in which the first powder bodies 52 are scattered in the vapor of an inert atmosphere.

Thereby, as shown in FIG. 26C, the metal film 58 remains discontinuously at only the surfaces of the primary particles 53.

Here, use of a metal being reflective to light emitted from the light emitting layer 13 as the discontinuous metal film 58 allows the composite resin to be light-reflective. The light-reflective metal like this can be based on, for example, silver, aluminum, platinum or the like.

The composite resin being light-reflective makes it possible to protect the first powder body 52 from the light emitted by the light emitting layer 13. Thereby, misoperations (for example, variation of the current-voltage characteristics or emission of long wavelength light due to excitation of electrons inside the powder body 52 by incident light) of the first powder body 52 can be suppressed.

For example, when light-reflective powder such as titanium oxide or silver is dispersed into the resin component, the composite resin is allowed to be light-reflective, however in the case of the device of the above embodiment, titanium oxide is dispersed so as to be sufficiently reflective, the composite resin is insulative, alternatively silver is dispersed so as to be sufficiently reflective, the composite resin is conductive, and thus varistor characteristic of the embodiment feature is damaged.

However, as described above, when the discontinuous metal film 58 is formed in the powder 52 itself, the composite resin being light-reflective can be obtained without damage of the varistor characteristic.

As a formation method of the discontinuous reflection film 58, electroless plating can be used as well. The primary particle (for example, main component is zinc oxide) 53 is an n-type semiconductor, and thus electrons exist in a conduction band. On the other hand, the grain boundary 54 and its vicinity form an energy barrier, and thus electrons do not exist in the conduction band. If the electrons in the primary particle 53 are transferred to metal ion to reduce, growth as the metal film 58 is possible. In this case, because electrons do not exist at the grain boundary 54 and its vicinity, the discontinuous metal film 58 covering only the primary particle surface can be obtained.

Metals which can be formed by electroless plating may include, for example, silver, gold, nickel or the like. In particular, silver being highly reflective is preferable.

By the primary particle being irradiated with light as necessary, it is possible to excite the electrons to the conduction band and improve plating efficiency as well. It is also possible to put additive such as reductant in plating liquid in order to transfer effectively the electrons in the conduction band to the metal ion in the plating liquid. The additive may be based on, for example, EDTA (ethylenediaminetetraacetic acid) or the like.

It is also possible to form an extremely thin transparent insulating film after forming the discontinuous metal film 58. A method such as sputtering or the like can be used for formation of the insulating film. If the insulating film is sufficiently thin, or material with many defects and material easy to absorb moisture, a necessary serge current path can be confirmed by applying electric field to the composite resin and breakdown. No current other than the serge current flows, and thus the insulating film remains, and thereby corrosion of the metal film 58 and decrease of reflectivity due to sulfurization or the like do not occur easily.

A method for manufacturing the semiconductor light emitting device 3 of the second embodiment will now be described with reference to FIG. 27A to FIG. 33B.

FIG. 27B, FIG. 28B, FIG. 29B, FIG. 30B, FIG. 32B, and FIG. 33B correspond to the A-A cross sections of FIG. 27A, FIG. 28A, FIG. 29A, FIG. 30A, FIG. 32A, and FIG. 33A, respectively.

Namely, FIG. 27A, FIG. 28A, FIG. 29A, FIG. 30A, FIG. 32A, and FIG. 33A are top views of FIG. 27B, FIG. 28B, FIG. 29B, FIG. 30B, FIG. 32B, and FIG. 33B, respectively. These top views show partial regions of a circular wafer.

The processes up to the process of forming the p-side interconnect layer 21 and the n-side interconnect layer 22 by plating proceed similarly to those of the first embodiment described above. However, in the second embodiment, the composite resin is not formed on the insulating film 18.

Figure 27A:
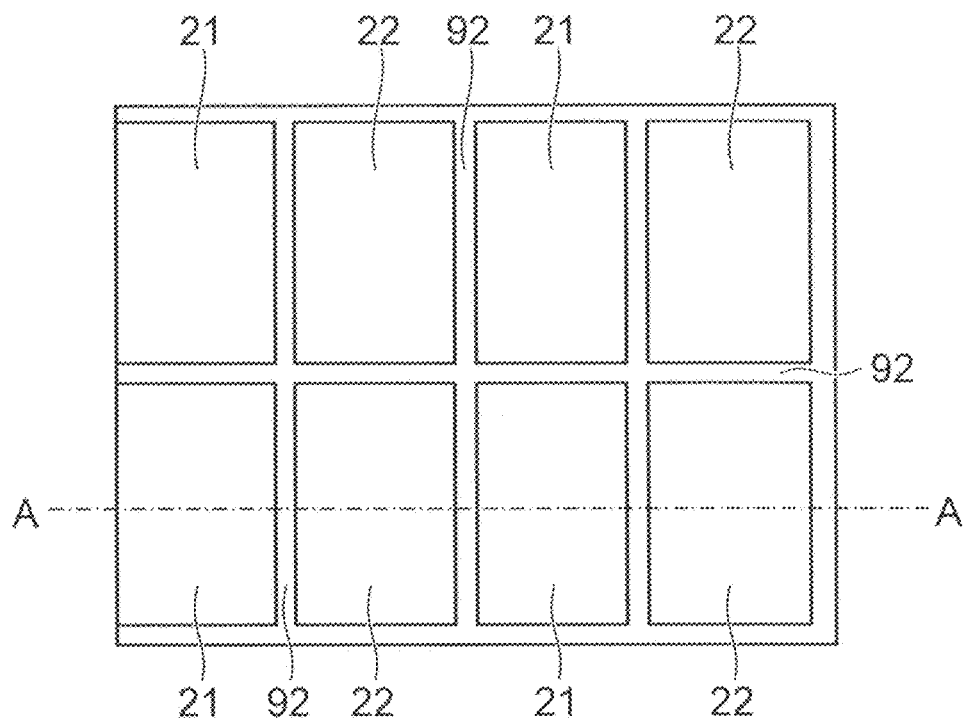
FIG. 27A to FIG. 33B are schematic views showing a method for manufacturing the semiconductor light emitting device of the second embodiment.
Figure 27B:
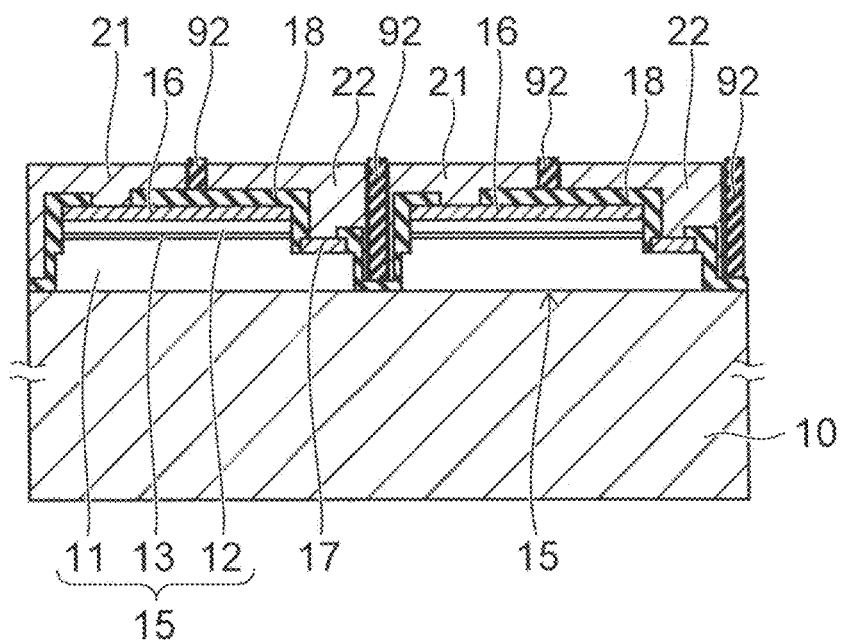
Figure 28A:
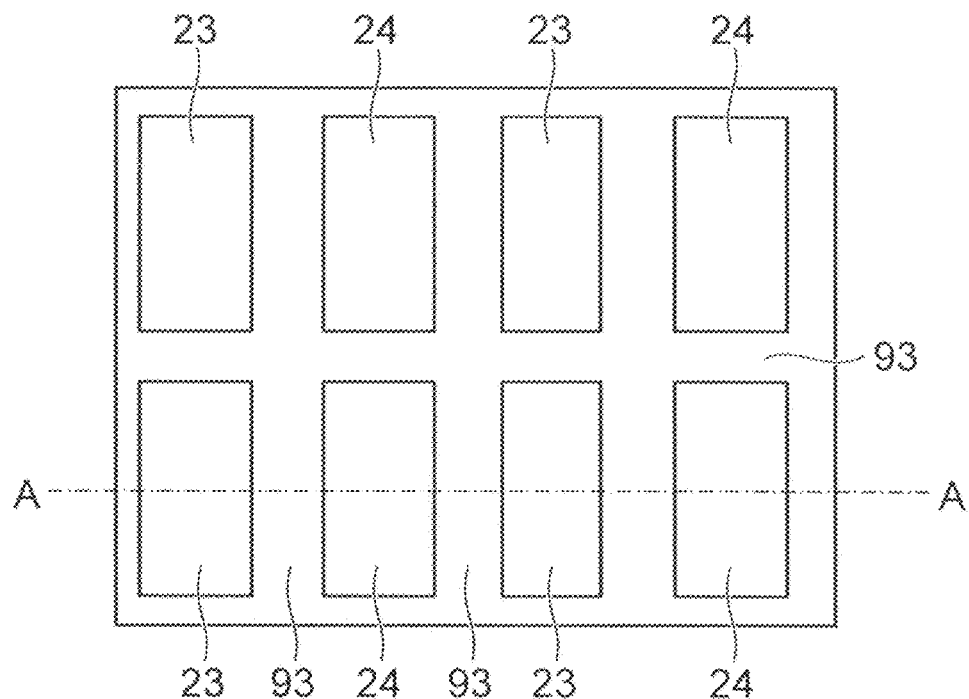
Figure 28B:
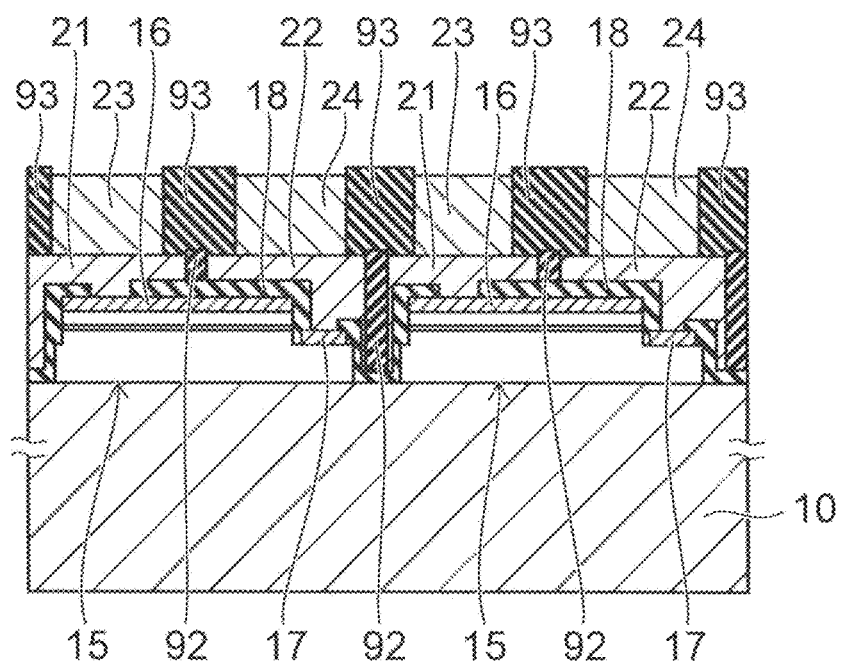

After forming the p-side interconnect layer 21 and the n-side interconnect layer 22 as shown in FIGS. 27A and 27B, the resist mask 93 is formed selectively on the interconnect layers 21 and 22 as shown in FIGS. 28A and 28B. Subsequently, the p-type metal pillar 23 and the n-side metal pillar 24 are formed by copper electroplating using the p-side interconnect layer 21 and the n-side interconnect layer 22 as a seed layer.

The p-type metal pillar 23 is formed on the p-side interconnect layer 21. The p-side interconnect layer 21 and the p-type metal pillar 23 are formed in a single body of the same copper material. The n-side metal pillar 24 is formed on the n-side interconnect layer 22. The n-side interconnect layer 22 and the n-side metal pillar 24 are formed in a single body of the same copper material.

The resist masks 92 and 93 are removed using, for example, a solvent or oxygen plasma.

At this point in time, the p-side interconnect layer 21 and the n-side interconnect layer 22 are bound to each other via the foundation metal film 60. Therefore, the foundation metal film 60 that is between the p-side interconnect layer 21 and the n-side interconnect layer 22 is removed by etching. Thereby, the electrical connection between the p-side interconnect layer 21 and the n-side interconnect layer 22 is broken.

Figure 29A:
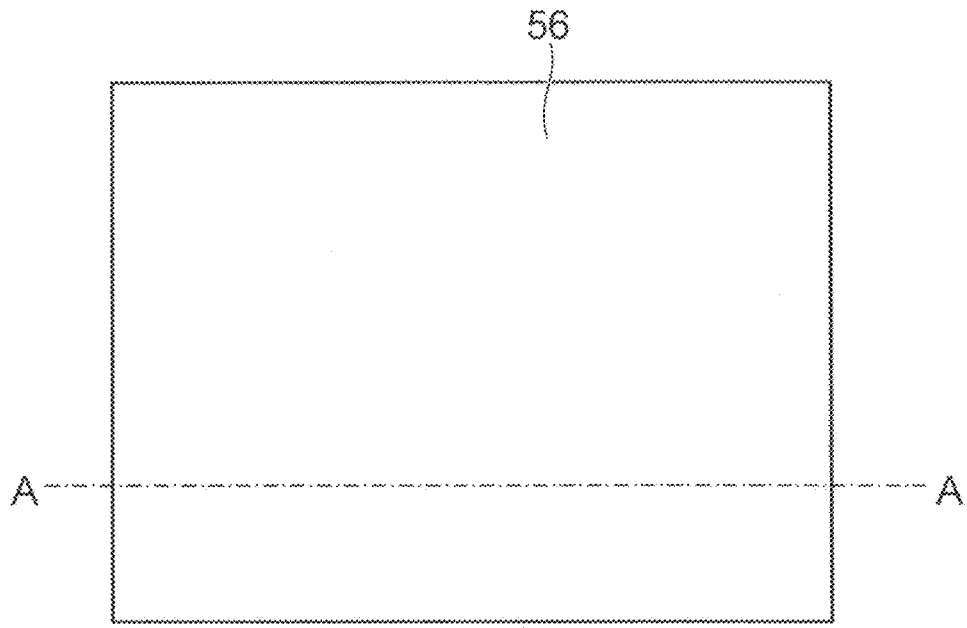
Figure 29B:
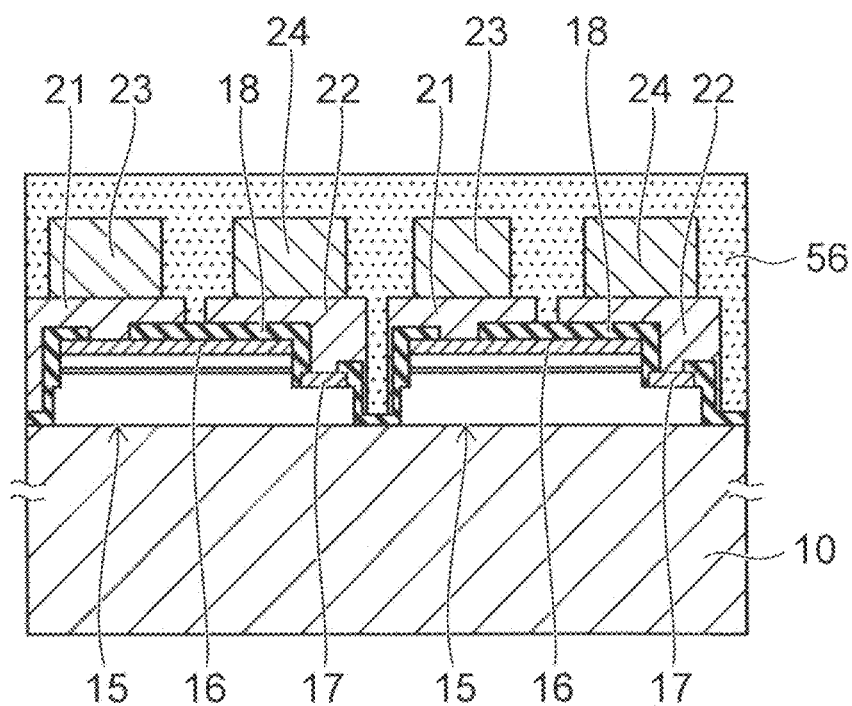

Then, as shown in FIGS. 29A and 29B, the composite resin 56 described above is formed on the structural body obtained in the processes described above. The composite resin 56 covers the p-side interconnect unit 41 and the n-side interconnect unit 43. The composite resin 56 is formed by, for example, screen printing, compression molding, etc.

Figure 30A:
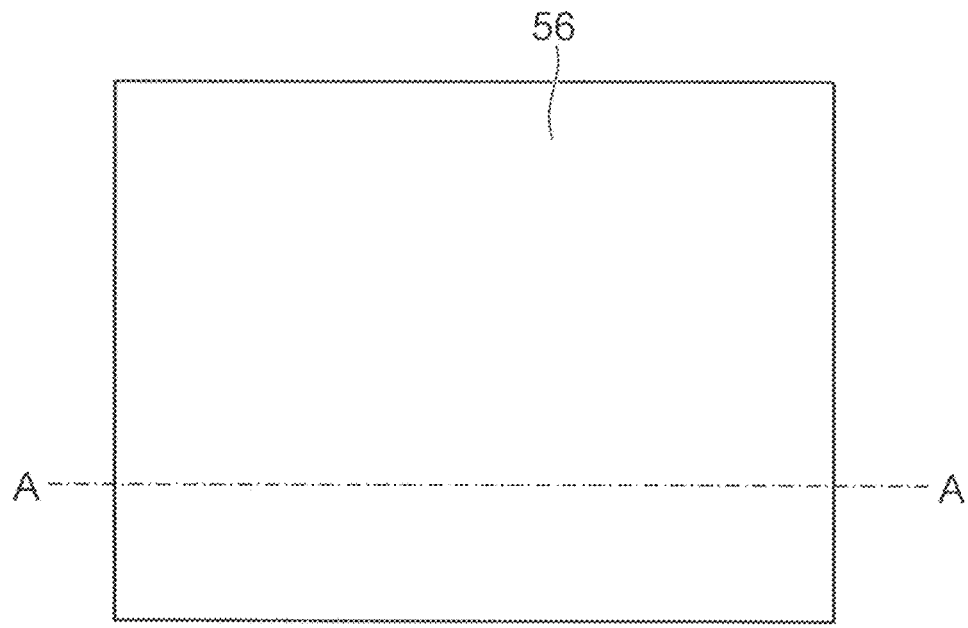
Figure 30B:
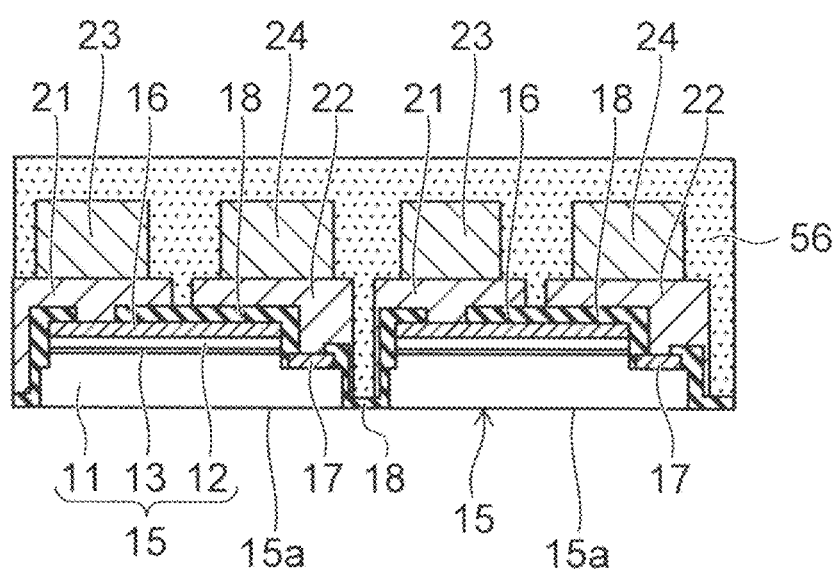

The composite resin 56 is included in the support body 100 with the p-side interconnect unit 41 and the n-side interconnect unit 43. As shown in FIGS. 30A and 30B, the substrate 10 is removed in the state in which the semiconductor layer 15 is supported by the support body 100.

For example, the substrate 10 which is a silicon substrate is removed by wet etching. Or, in the case where the substrate 10 is a sapphire substrate, the substrate 10 can be removed by laser lift-off.

There are cases where the semiconductor layer 15 that is epitaxially grown on the substrate 10 has a large internal stress. Also, the p-type metal pillar 23, the n-side metal pillar 24, and the composite resin 56 are materials that are more flexible than the semiconductor layer 15 that is made of, for example, a GaN-based material. Accordingly, the p-type metal pillar 23, the n-side metal pillar 24, and the composite resin 56 absorb the stress even in the case where the internal stress of the epitaxial growth is relieved all at once when peeling the substrate 10. Therefore, the damage of the semiconductor layer 15 in the process of removing the substrate 10 can be avoided.

Figure 31A:
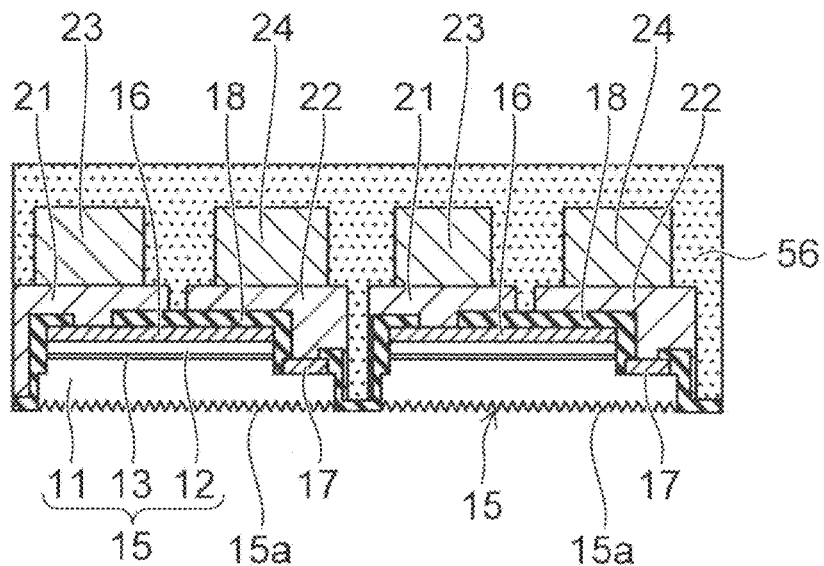

The first surface 15a of the semiconductor layer 15 is exposed by the removal of the substrate 10. As shown in FIG. 31A, a fine unevenness is formed in the first surface 15a that is exposed. For example, wet etching of the first surface 15a is performed using a KOH (potassium hydroxide) aqueous solution, TMAH (tetramethyl ammonium hydroxide), etc. Different etching rates that depend on the crystal plane orientation occur in the etching. Therefore, the unevenness can be formed in the first surface 15a. The extraction efficiency of the radiated light of the light emitting layer 13 can be increased by forming the unevenness in the first surface 15a.

Or, a fine unevenness may be formed in the first surface 15a by etching using a resist film formed by lithography as a mask.

Figure 31B:
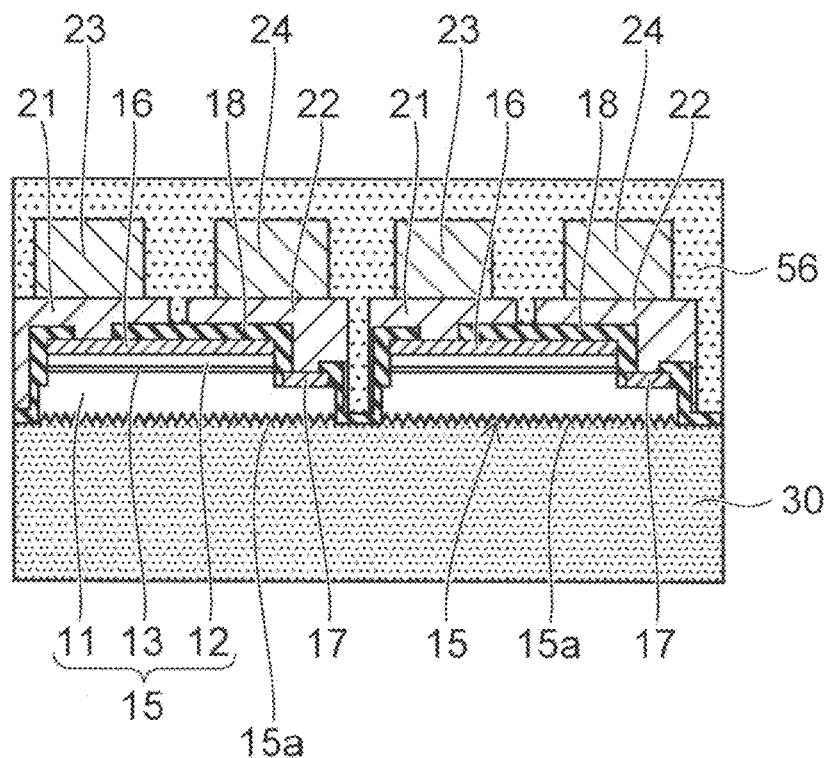

As shown in FIG. 31B, the fluorescer layer 30 is formed on the first surface 15a with a not-shown insulating film interposed. The fluorescer layer 30 is formed by a method such as, for example, screen printing, potting, molding, compression molding, etc. Or, the fluorescer layer 30 that has a film configuration is adhered to the first surface 15a with a not-shown insulating film interposed. The insulating film between the first surface 15a and the fluorescer layer 30 may be omitted if necessary.

Figure 32A:
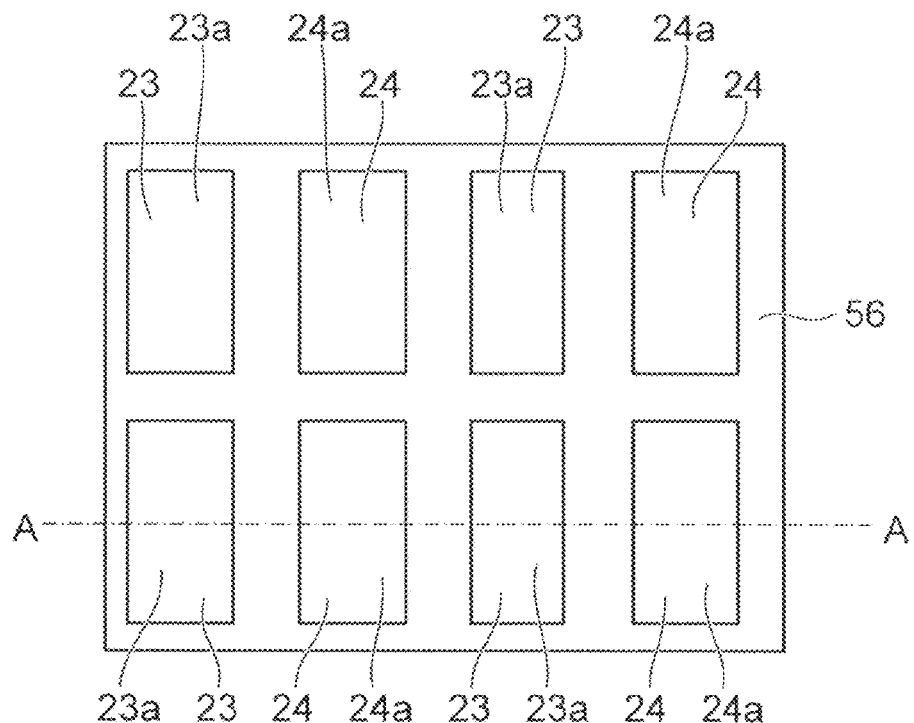

After forming the fluorescer layer 30, the p-type metal pillar 23 and the n-side metal pillar 24 are exposed from the composite resin 56 as shown in FIG. 32A by polishing the surface (in FIG. 32B, the upper surface) of the composite resin 56 using, for example, a back side grinder, etc. The exposed surface of the p-type metal pillar 23 is used as the p-side external terminal 23a; and the exposed surface of the n-side metal pillar 24 is used as the n-side external terminal 24a.

Figure 33B:
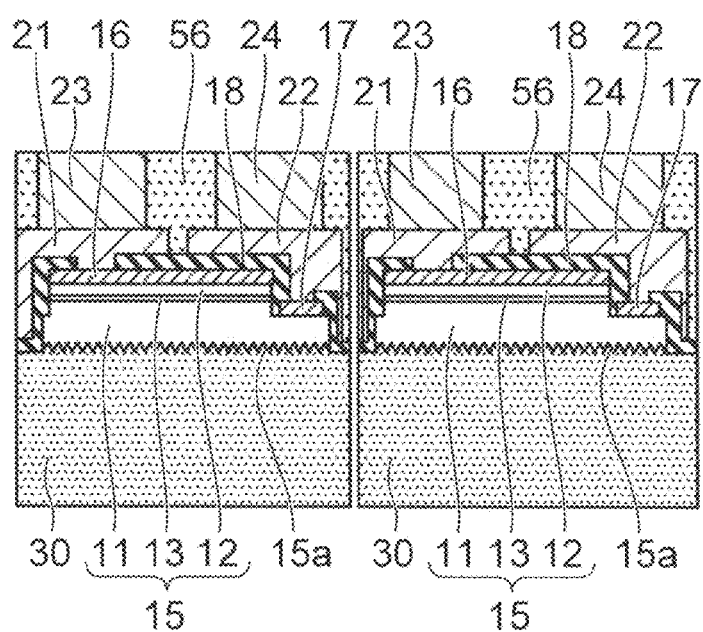

Then, as shown in FIGS. 33A and 33B, dicing of the wafer is performed in the region where the trench 91 described above that divides the multiple semiconductor layers 15 is made. In other words, the fluorescer layer 30, the insulating film 18, and the composite resin 56 are cut. These components are cut by, for example, a dicing blade or laser light. The semiconductor layer 15 is not damaged by the dicing because the semiconductor layer 15 does not exist in the dicing region.

The processes described above prior to the singulation are performed in the wafer state including many semiconductor layers 15. The wafer is singulated into semiconductor light emitting devices including at least one semiconductor layer 15 each. The semiconductor light emitting device may have a single-chip structure including one semiconductor layer 15; or a multi-chip structure including multiple semiconductor layers 15 may be used.

Because the processes described above prior to the singulation can be performed collectively in the wafer state, it is unnecessary to perform the formation of the interconnect layers, the formation of the pillars, the packaging with the resin layer, and the formation of the fluorescer layer for every singulated individual device; and a drastic cost reduction is possible.

Because the support body 100 and the fluorescer layer 30 are cut after forming the support body 100 and the fluorescer layer 30 in the wafer state, the side surface of the fluorescer layer 30 is aligned with the side surface of the support body 100 (the side surface of the composite resin 56); and these side surfaces form the side surface of the singulated semiconductor light emitting device. And, because there is no substrate 10, a small semiconductor light emitting device having a chip size package structure can be provided.

FIG. 39 to FIG. 42 are enlarged schematic cross-sectional views on a mounting surface (surface where the p-side external terminal 23a and the n-side external terminal 24a) side of the semiconductor light emitting device of the second embodiment.

Figure 42:
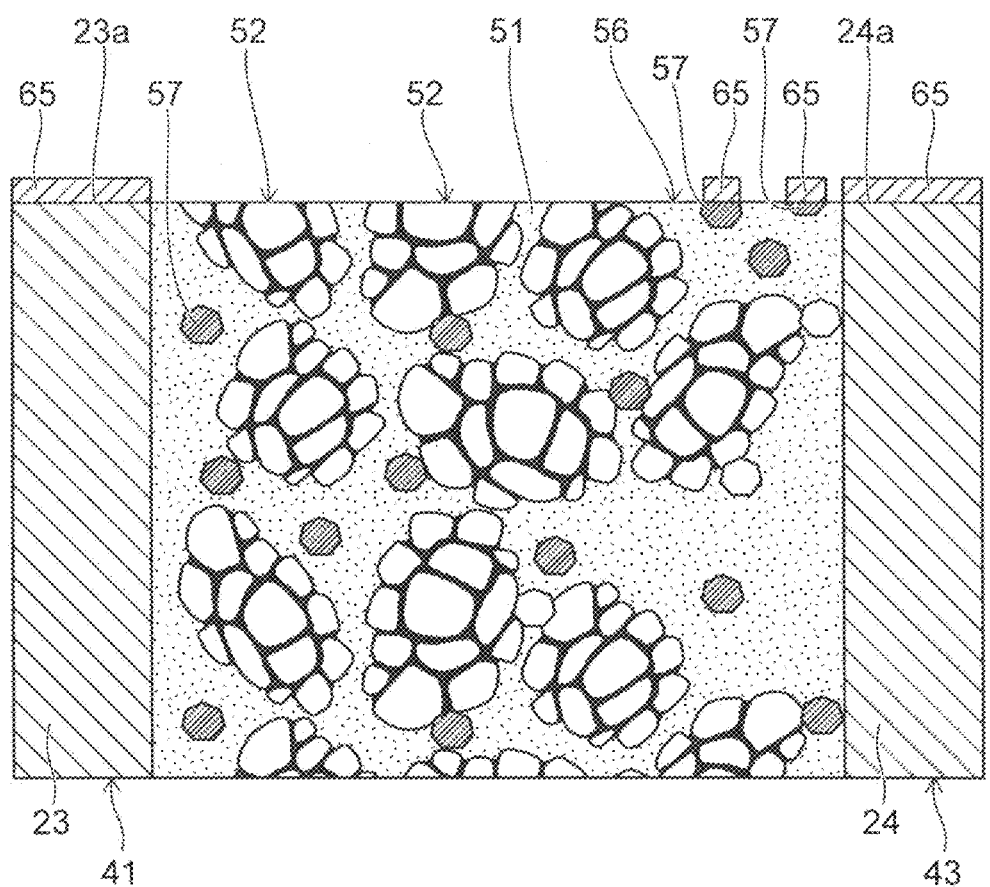

The second powder bodies 57 are, for example, based on metal such as copper or the like. On the other hand, the metal such as copper or the like is used, for example, for surfaces of the p-side external terminal 23a and the n-side external terminal 24a as well. In general, it is known that copper oxidizes naturally and deteriorates wettability with solder. For the measure, covering with a metal film 65 such as gold, for example, may be performed by the electroless plating. However, if the second powder bodies 57 are exposed to the mounting surface side at this time, as shown in FIG. 42, the second powder bodies surfaces are also covered with the metal film 65 by the electroless plating. Because gold has high wettability with solder, if the second powder bodies 57 are scattered about between the external terminal 24a and the external terminal 23a, there is fear that solder bridges between these terminals and short circuit failure occurs.

Figure 32B:
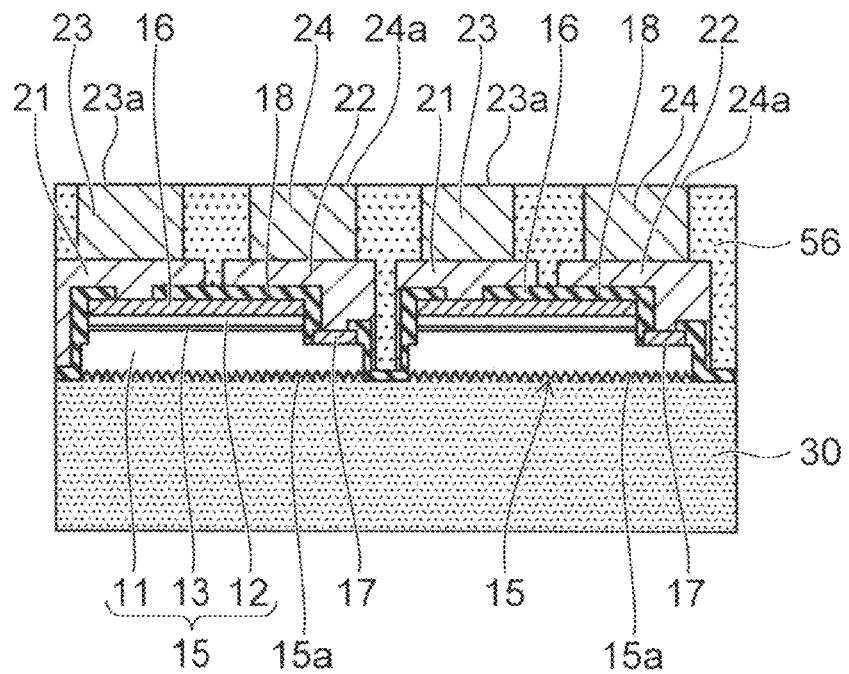
Figure 39:
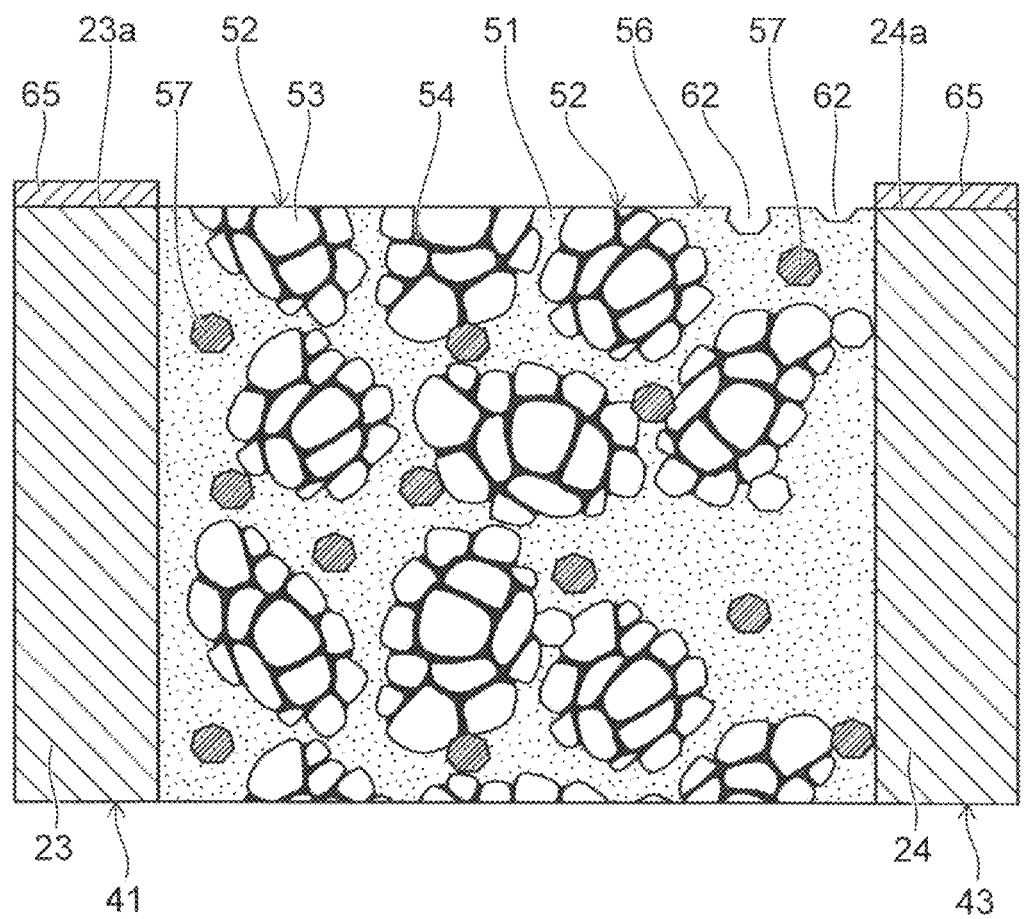
FIG. 39 to FIG. 43 are schematic cross-sectional views of the semiconductor light emitting device of the second embodiment.

Then, after polishing the composite resin 56 in the process shown in FIG. 32B, the second powder bodies 57 exposed to the surface of the composite resin 56 are removed by etching. FIG. 39 shows a state after etching and removal of the second powder bodies 57, and vacant spaces 62 are formed in portions where the second powder bodies 57 are removed.

Figure 40:
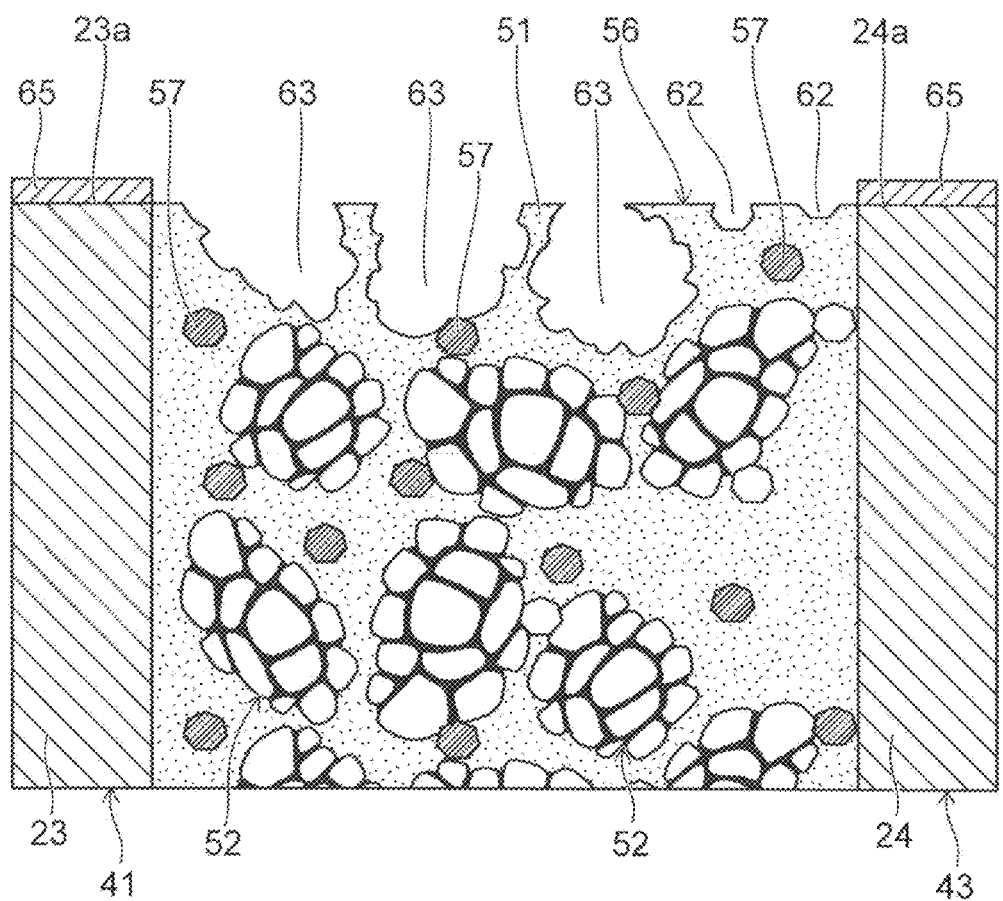

Alternatively, as described previously, the metal film 65 may be formed also on the surfaces of the first powder bodies 52 by the electroless plating. If the metal film is formed on the exposed surfaces on the mounting surface side of the first powder bodies 52, the solder becomes easy to be wet, and the bridge failure possibly occurs, and thus the first powder bodies 52 exposed to the surface of the composite resin 56 may be removed by etching as well as shown in FIG. 40. Vacant spaces 63 are formed in portions where the first powder bodies 52 are removed.

Figure 41:
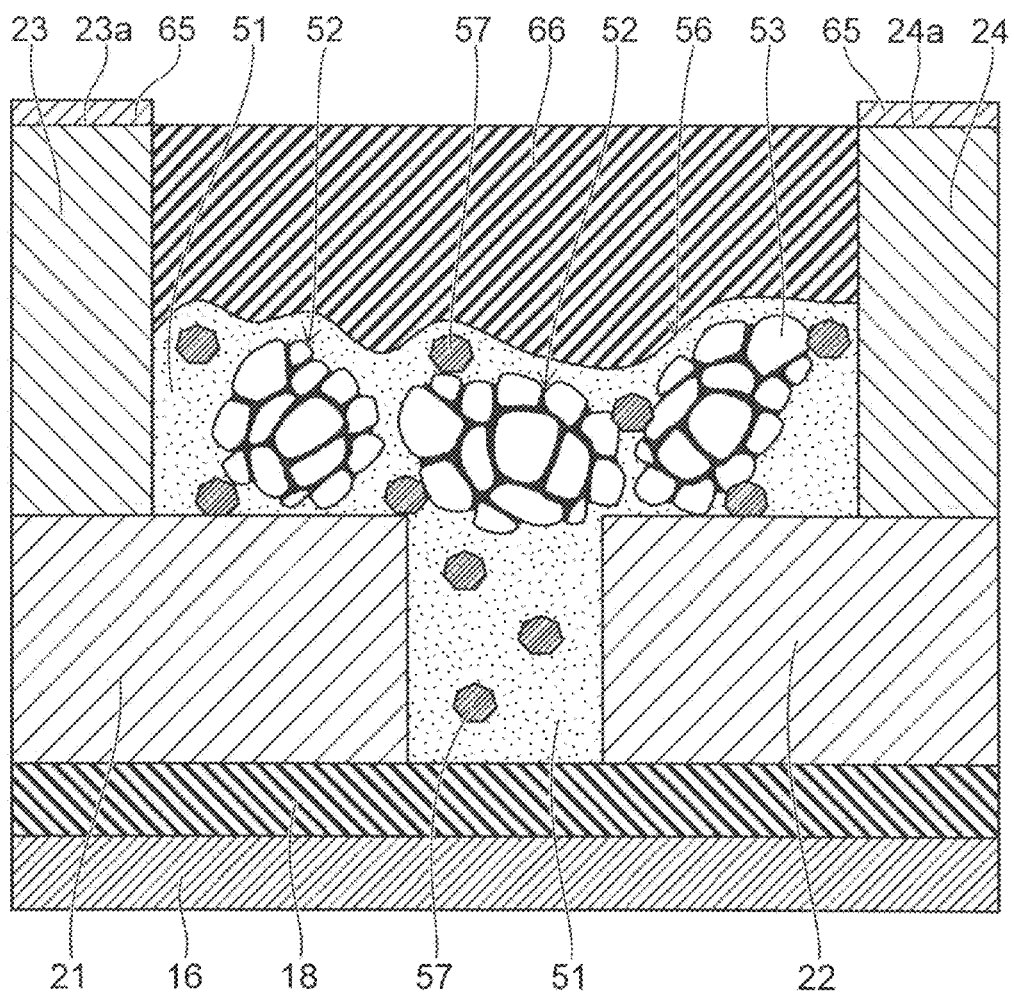

Alternatively, as shown in FIG. 41, a resin 66 is stacked on the composite resin 56 and the surface of the composite resin 56 may be covered with the resin 66. The resin 66 is a general insulative resin without the varistor characteristic. When a resin-base with progressive volume contraction in curing is used as the resin component 51 of the composite resin 56, gentle unevenness is formed on the upper surface (interface between the composite resin 56 and the resin 66) of the composite resin 56.

Figure 43:
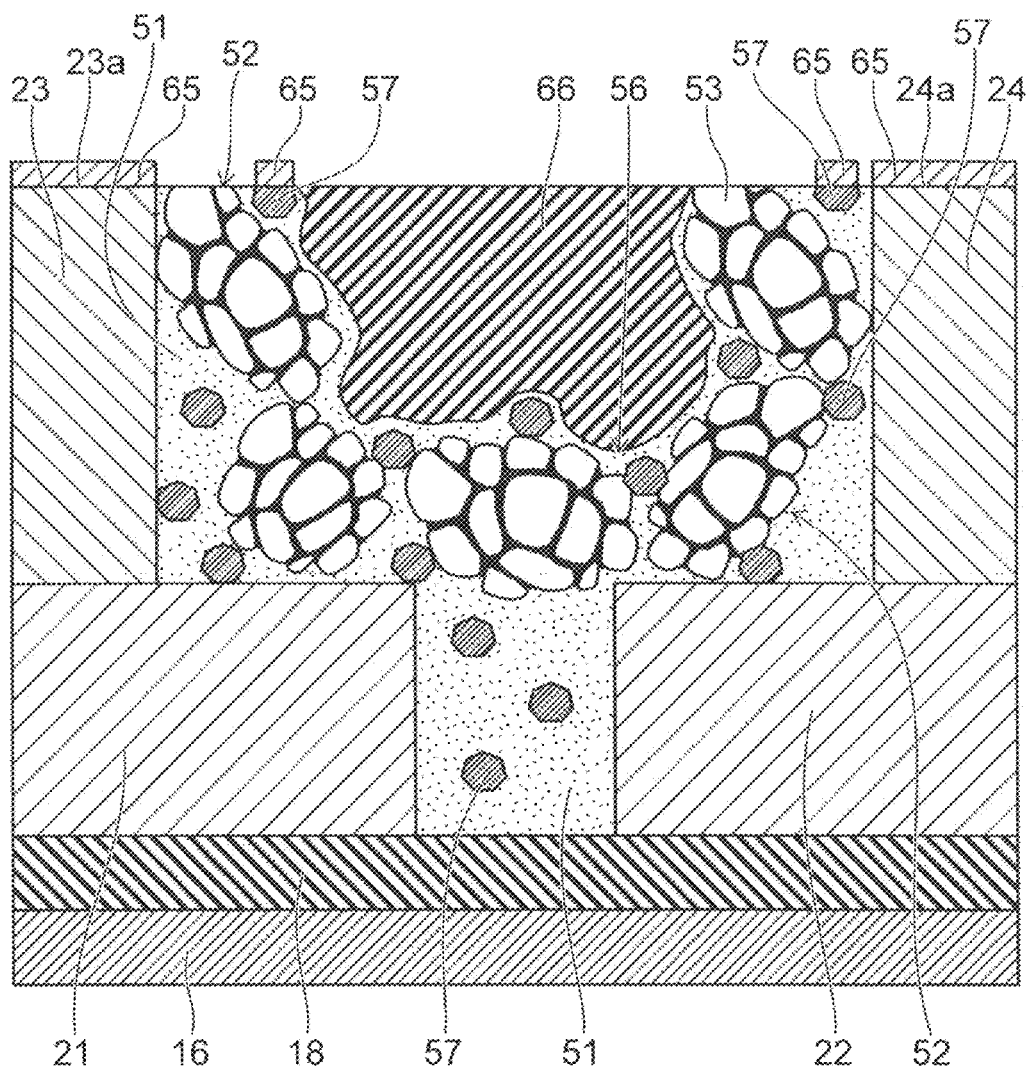

As shown in FIG. 43, the composite resin 56 may be formed on side surfaces of the p-side metal pillar 23 and the n-side metal pillar 24 as well.

After the p-side metal pillar 23 and the n-side metal pillar 24 shown in FIG. 28 are formed, the resist masks 93 and 92 are removed, and then a seed film 60 not shown is removed except portions immediately below the p-side interconnect layer 21 and the n-side interconnect layer 22. After that, the composite resin 56 id formed on the surfaces of the passivation film (insulating film) 18, the p-side interconnect layer 21, the n-side interconnect layer 22, the p-side metal pillar, and the n-side metal pillar, and the resin 66 is formed thereon. After that, the resin 66 is ground until the p-side metal pillar 23 and the n-side metal pillar 24 are exposed, the electroless plating is performed, and thereby the configuration of FIG. 43 can be obtained. The resin 66 is a general insulative resin without the varistor characteristic.

In the case of the structure of FIG. 43, the second powder bodies 57 and the powder bodies 52 in the composite resin 56 have the potential to be exposed to the periphery of the p-side external terminal 23a and the n-ide external terminal 24a, however even if the exposed surfaces are covered with the metal film 65, the p-side external terminal 23a is isolated from the n-side external terminal 24a by the resin 66, and thereby short circuit failure is unlikely to occur.

In the case of structures of FIG. 41 and FIG. 43, because the composite resin is only used partially, adjustment of the mechanical characteristics of the general resin 66 allows the warpage or the like of the device and wafer to be optimized. That is, the electric characteristics of the composite resin 56 can be optimized at the some sacrifice of the mechanical characteristics, and allows a device with excellent performance to be realized.

For example, when the resin-base with progressive volume contraction in curing is used as the resin component 51 of the composite resin 56, the device and wafer have the potential of being warped greatly in the structure of FIG. 39, for example, however in the case of the structures of FIG. 41 and FIG. 43, the warpage has the potential of being adjusted to be small based on the characteristics of the resin 66. If the curing contraction of the resin component 51 forming the composite resin 56 can be larger, a ratio of the resin component 51 in the composite resin 56 after the curing decreases, and a ratio of the powder bodies 52 and the second powder bodies 57 increases relatively, and contact probability between powder bodies and contact probability between the powder bodies and the metal portions 21, 22, 23, 24 increase, and thereby more serge bypass paths can be formed in the composite resin 56 and the electric characteristic is improved.

Furthermore, in the case of the structures of FIG. 41 and FIG. 43, it is only necessary to form the composite resin 56 with a relatively thin thickness before stacking. Therefore, for example, even if the resin component 51 includes a solvent, the solvent can be easily evaporated during the curing, and thereby causing a trouble such as formation of bubbles in the composite resin 56 can be avoided. In general, in the case of a resin including a solvent, it is known that the solvent is removed in the curing, and thereby the volume contraction progresses by the amount. As a result, as described previously, the relative ration of the resin component 51 after the curing decreases and more serge bypass paths can be formed in the composite resin 56.

The semiconductor layer 15 may be irradiated by light having energy higher than a band gap energy of the semiconductor layer 15 immediately before applying the composite resin 56, or after applying the composite resin 56, or before curing the composite resin 56, or during curing the composite resin 56. The light having the energy higher than the band gap energy of the semiconductor layer 15 has, for example, wavelength of 450 nm or less such as blue light, blue-violet light, purple-color light, or ultraviolet light. Photovoltaic power is produced in the semiconductor layer 15 irradiated by the light. The potential difference attracts the first powder body 52 having the varistor characteristic. Therefore, the bridge pass can be densely formed between the p-side interconnect layer 21 and the n-side interconnect layer 22.

The semiconductor layer 15 can be irradiated by the light through the transparent growth substrate 10 such as sapphire, SiC after applying the composite resin 56.

The potential difference between the p-side interconnect layer 21 and the n-side interconnect layer 22 can be produced when voltage is applied to the p-side metal pillar 23 and the n-side metal pillar 24 using a probe.

A semiconductor device that includes an IC (Integrated Circuit) will now be described as an example of an electronic device.

Third Embodiment

Figure 34A:
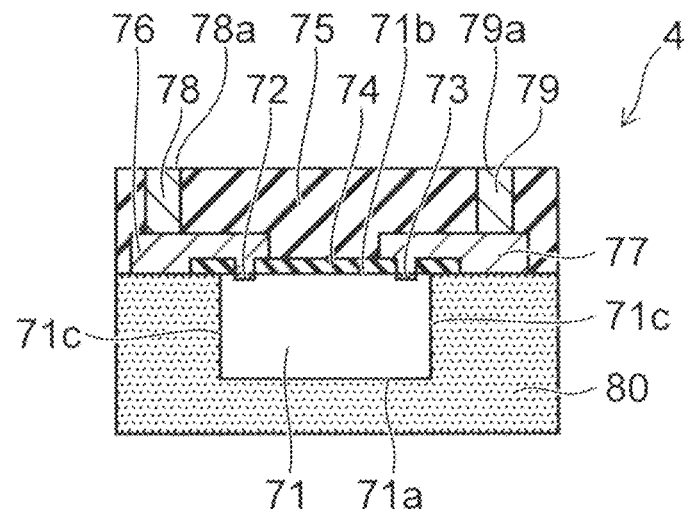
FIGS. 34A and 34B are schematic cross-sectional views of a semiconductor device of a third embodiment.

FIG. 34A is a schematic cross-sectional view of a semiconductor device 4 of a third embodiment.

The semiconductor device 4 includes a semiconductor layer (a semiconductor chip) 71. The semiconductor layer 71 has a first surface 71a, and a second surface 71b on the side opposite to the first surface 71a.

Multiple first electrodes 72 and multiple second electrodes 73 are provided on the second surface 71b.

A resin layer 80 is provided on the first surface 71a side and a side surface 71c side of the semiconductor layer 71. The resin layer 80 covers the first surface 71a and the side surface 71c of the semiconductor layer 71.

An insulating film 74 is provided on the second surface 71b of the semiconductor layer 71. The insulating film 74 is provided also on a portion of the surface of the resin layer 80 provided around the side surface 71c of the semiconductor layer 71.

A first interconnect layer 76 and a second interconnect layer 77 are provided to be separated from each other on the insulating film 74 and on the resin layer 80 around the side surface 71c of the semiconductor layer 71.

The first interconnect layer 76 is connected to the first electrode 72 by a via that pierces the insulating film 74. The second interconnect layer 77 is connected to the second electrode 73 by a via that pierces the insulating film 74.

A first metal pillar 78 that is thicker than the first interconnect layer 76 is provided on the first interconnect layer 76. The first interconnect layer 76 and the first metal pillar 78 are included in the first interconnect unit that is electrically connected to the first electrode 72.

A second metal pillar 79 that is thicker than the second interconnect layer 77 is provided on the second interconnect layer 77. The second interconnect layer 77 and the second metal pillar 79 are included in the second interconnect unit that is electrically connected to the second electrode 73.

A resin layer 75 is provided on the insulating film 74, on the resin layer 80, on the first interconnect layer 76, and on the second interconnect layer 77. The resin layer 75 is provided on the side surface of the first interconnect layer 76, the side surface of the second interconnect layer 77, the side surface of the first metal pillar 78, and the side surface of the second metal pillar 79. The resin layer 75 is filled between the first interconnect layer 76 and the second interconnect layer 77. The resin layer 75 is filled between the first metal pillar 78 and the second metal pillar 79.

An end portion 78a of the first metal pillar 78 that is exposed from the resin layer 75 functions as an external terminal that is connectable to an external circuit such as a mounting substrate, etc. An end portion 79a of the second metal pillar 79 that is exposed from the resin layer 75 functions as an external terminal that is connectable to the external circuit such as the mounting substrate, etc. These external terminals are bonded to a land pattern of the mounting substrate via, for example, solder or a bonding agent that is conductive.

The planar size of the external terminals is larger than the planar size of the electrodes 72 and 73 of the chip; and the pitch between the external terminals is greater than the pitch between the electrodes 72, the pitch between the electrodes 73, and the pitch between the electrodes 72 and 73.

According to the semiconductor device 4 of the third embodiment, the resin layer 80 that seals the first surface 71a and the side surface 71c of the semiconductor layer 71 includes the composite resin 50 of the first embodiment or the composite resin 56 of the second embodiment described above.

The first interconnect layer 76 and the second interconnect layer 77 contact the resin layer 80 having the varistor characteristic in the region around the side surface 71c of the semiconductor layer 71.

Accordingly, the semiconductor layer 71 is connected in parallel with the first powder body 52 of the composite resin between the end portion 78a of the first interconnect unit and the end portion 79a of the second interconnect unit that are exposed to the outside in the state prior to mounting; and the first powder body 52 functions as a protection element that protects the semiconductor layer 71 from the surge voltage. The surge current can flow between the first interconnect unit and the second interconnect unit via the first powder body 52 without passing through the semiconductor layer 71.

In the normal operation in which a power supply voltage of the rated voltage or less is applied between the first interconnect unit and the second interconnect unit, the first powder body 52 is in a high resistance state due to the Schottky barrier of the grain boundary 54 vicinity; and the first interconnect unit and the second interconnect unit are not shorted via the first powder body 52.

According to the third embodiment, an ESD protection element that is externally connected to the semiconductor device 4 is unnecessary. Therefore, the semiconductor device 4 having excellent electrostatic immunity can be provided without impeding the downsizing. Also, the load capacitance of the I/O (input/output) is reduced; and a high-speed operation is possible.

The third embodiment is not limited to an IC and is applicable to a MEMS (Micro Electro Mechanical Systems) device or an RF (Radio Frequency) device. In such an RF device, the parasitic capacitance of the RF signal line can be reduced because the sealing resin has a varistor characteristic and the ESD protection element is unnecessary.

FIG. 35A to FIG. 36C are schematic cross-sectional views showing the method for manufacturing the semiconductor device 4 of the third embodiment.

Figure 35A:
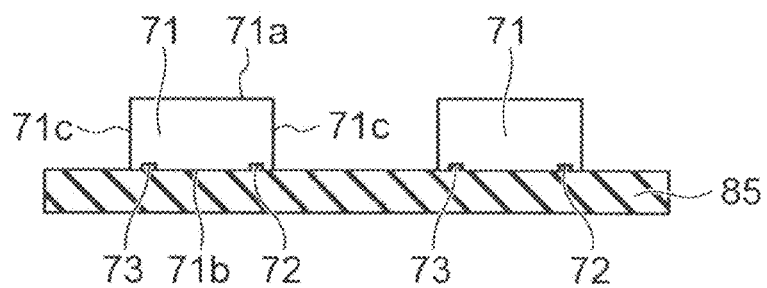
FIG. 35A to FIG. 36C are schematic views showing a method for manufacturing the semiconductor device of the third embodiment.

As shown in FIG. 35A, the semiconductor layers 71 are arranged in a multiple chip configuration to be separated from each other on a heat-resistant film 85. The second surface 71b side of the semiconductor layer 71 where the electrodes 72 and 73 are formed is adhered to the heat-resistant film 85.

Figure 35B:
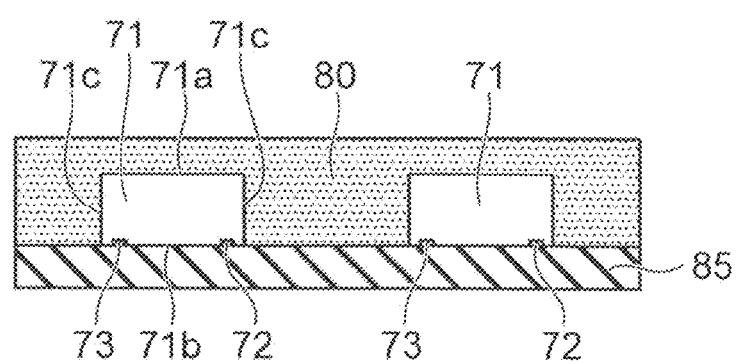

Then, as shown in FIG. 35B, the resin layer 80 that includes the composite resin having the varistor characteristic described above is formed on the heat-resistant film 85. The first surface 71a and the side surface 71c of the semiconductor layer 71 are covered with the resin layer 80. The resin layer 80 is filled also between the multiple semiconductor layers 71.

Figure 35C:
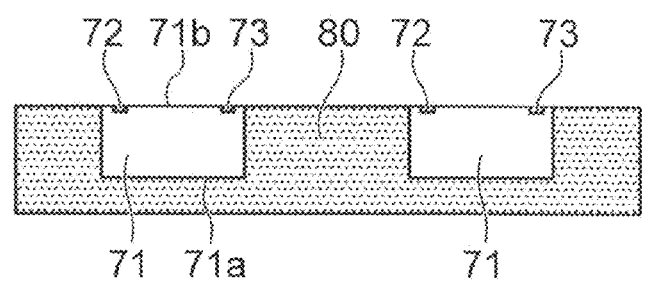

Continuing, the heat-resistant film 85 is peeled. FIG. 35C shows the state in which the heat-resistant film 85 is peeled and the resin layer 80 that seals the multiple semiconductor layers 71 is inverted. For example, the resin component that is on the second surface 71b and the electrodes 72 and 73 is removed by ashing.

Figure 35D:
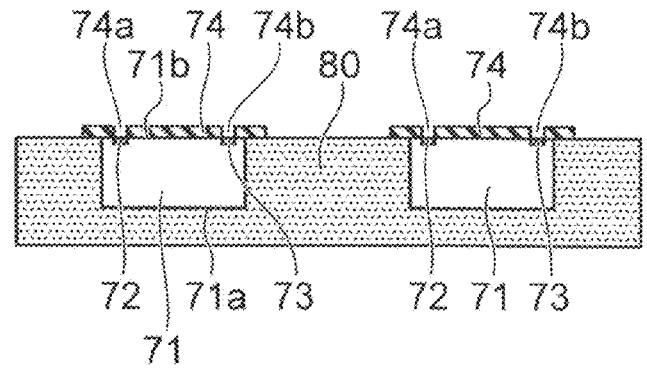

Then, after forming the insulating film 74 on the second surface 71b and on the surface of the resin layer 80, the insulating film 74 is patterned as shown in FIG. 35D. An opening 74a that reaches the first electrode 72 and an opening 74b that reaches the second electrode 73 are made in the insulating film 74.

Figure 36A:
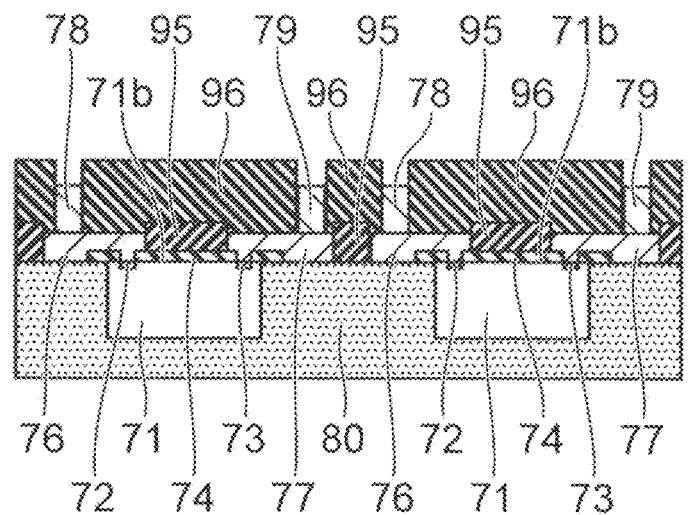

Then, after forming a not-shown metal film, a resist mask 95 is formed; and the first interconnect layer 76 and the second interconnect layer 77 are formed on the second surface 71b side by plating as shown in FIG. 36A. The first interconnect layer 76 is connected to the first electrode 72 via the opening 74a (FIG. 35D). The second interconnect layer 77 is connected to the second electrode 73 via the opening 74b (FIG. 35D).

Then, a resist mask 96 is formed; and plating is performed to form the first metal pillar 78 on the first interconnect layer 76 and the second metal pillar 79 on the second interconnect layer 77.

Figure 36B:
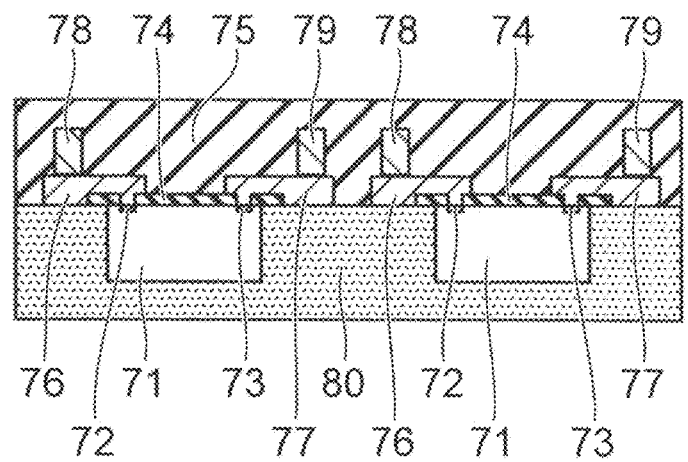

Subsequently, the resist masks 95 and 96 are removed; and the resin layer 75 is formed as shown in FIG. 36B. The resin layer 75 covers the insulating film 74, the first interconnect layer 76, the second interconnect layer 77, the first metal pillar 78, the second metal pillar 79, and the resin layer 80.

Figure 36C:
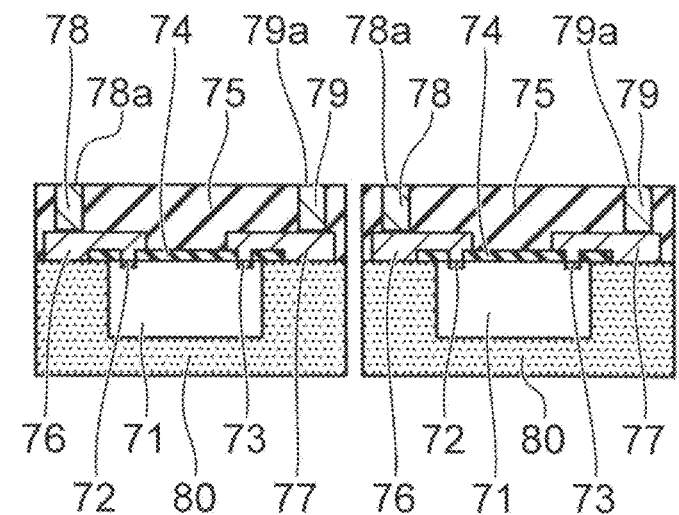

Subsequently, the surface of the resin layer 75 is polished to expose the end portion 78a of the first metal pillar 78 and the end portion 79a of the second metal pillar 79 from the resin layer 75 as shown in FIG. 36C. Then, singulation into multiple semiconductor devices is performed by cutting the resin layer 80 and the resin layer 75. One semiconductor device may have a multi-chip structure including multiple semiconductor layers 71.

Figure 34B:
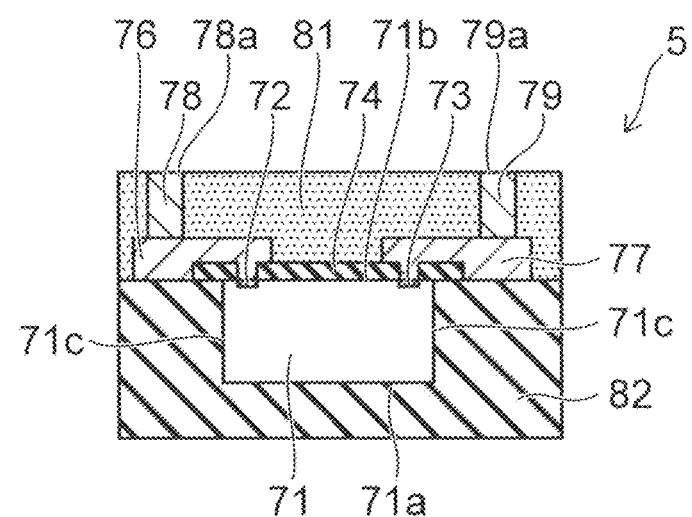

In the third embodiment, the composite resin having the varistor characteristic described above may be included in a resin layer 81 that seals the interconnect unit side as shown in FIG. 34B. The first surface 71a and the side surface 71c of the semiconductor layer 71 are sealed with a resin layer 82 that does not have a varistor characteristic.

Fourth Embodiment

Figure 37A:
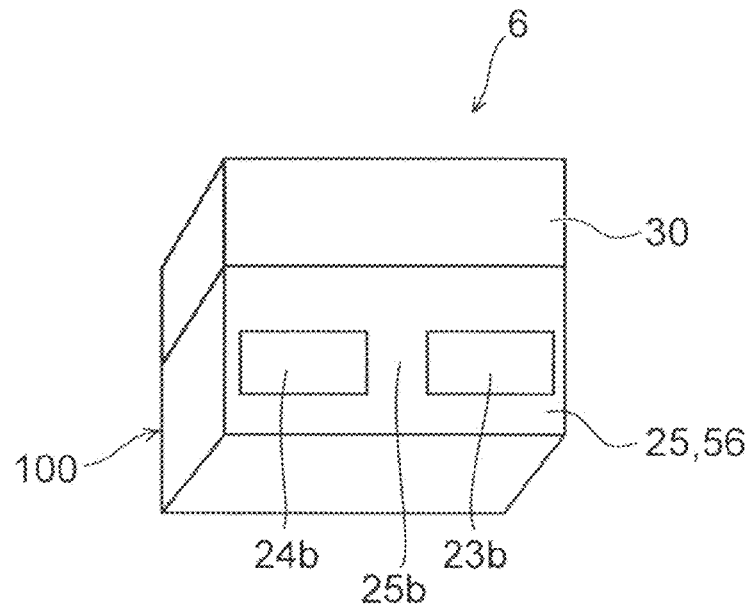
FIGS. 37A and 37B are schematic cross-sectional views of a semiconductor light emitting device of a fourth embodiment.
Figure 37B:
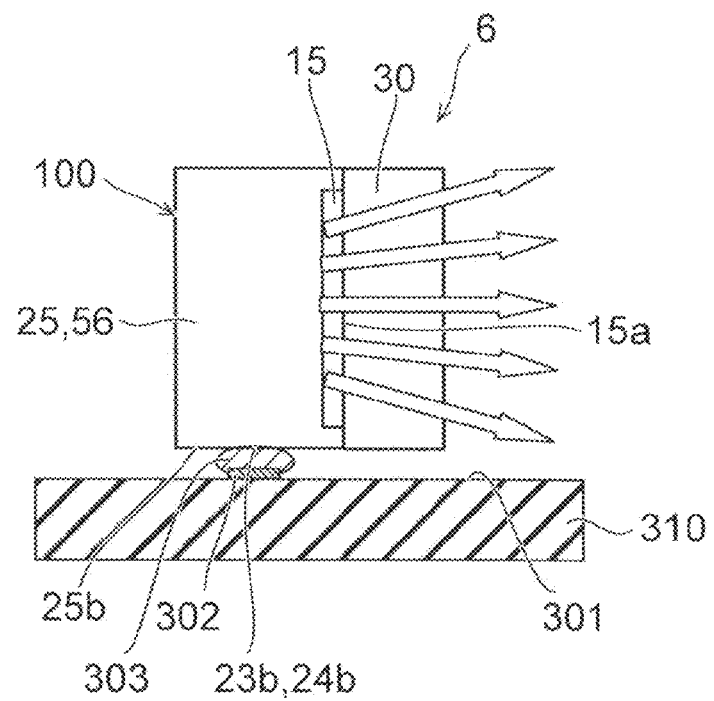

The composite resin having the varistor characteristic described above also is applicable to a side-view type semiconductor light emitting device 6 as shown in FIGS. 37A and 37B.

In the semiconductor light emitting device 6 of the fourth embodiment, the exposed surfaces of the metal pillars 23 and 24 that are exposed from the resin layer 25 (or 55) to provide the connection to the outside differ from those of the first to third embodiments. Otherwise, the configuration is the same as those of the semiconductor light emitting devices of the first and second embodiments.

FIG. 37A is a schematic perspective view of the semiconductor light emitting device 6 of the fourth embodiment.

FIG. 37B is a schematic cross-sectional view of a light emitting module having a configuration in which the semiconductor light emitting device 6 of the fourth embodiment is mounted on a mounting substrate 310.

The side surface of a portion of the p-type metal pillar 23 is exposed from the resin layer 25 (or 56) at a third surface 25b that has a plane orientation that is different from those of the first surface 15a of the semiconductor layer 15 and the second surface 15b of the semiconductor layer 15 on the side opposite to the first surface 15a. The exposed surface functions as a p-side external terminal 23b for mounting to the external mounting substrate 310.

For example, the third surface 25b is a surface substantially perpendicular to the first surface 15a and the second surface 15b of the semiconductor layer 15. The resin layer 25 (or 56) has, for example, four side surfaces having rectangular configurations; and one of the side surfaces is the third surface 25b.

The side surface of a portion of the n-side metal pillar 24 is exposed from the resin layer 25 (or 56) at the same third surface 25b. The exposed surface functions as an n-side external terminal 24b for mounting to the external mounting substrate 310.

The portion of the p-type metal pillar 23 other than the p-side external terminal 23b that is exposed at the third surface 25b is covered with the resin layer 25 (or 56). The portion of the n-side metal pillar 24 other than the n-side external terminal 24b that is exposed at the third surface 25b is covered with the resin layer 25 (or 56).

As shown in FIG. 37B, the semiconductor light emitting device 6 is mounted with an orientation in which the third surface 25b is oriented toward a mounting surface 301 of the substrate 310. The p-side external terminal 23b and the n-side external terminal 24b that are exposed at the third surface 25b are bonded via solder 303 respectively to pads 302 provided in the mounting surface 301. An interconnect pattern that provides a link to, for example, an external circuit is provided in the mounting surface 301 of the substrate 310; and the pads 302 are connected to the interconnect pattern.

The third surface 25b is substantially perpendicular to the first surface 15a which is the main emission surface of the light. Accordingly, the first surface 15a is oriented in a horizontal direction parallel to the mounting surface 301 or a direction tilted with respect to the mounting surface 301 with an orientation in which the third surface 25b is oriented toward the mounting surface 301 side. In other words, the semiconductor light emitting device 6 is a so-called side-view type semiconductor light emitting device; and the light is emitted in the horizontal direction parallel to the mounting surface 301 or a direction oblique to the mounting surface 301.

In the semiconductor light emitting device 6, similarly to the first embodiment, the composite resin 50 having the varistor characteristic is provided on the insulating film 18. Or, the composite resin 50 is provided as the insulating film 18. Or, similarly to the second embodiment, the resin layer 55, which is included in the support body 100 with the interconnect units 41 and 43, includes the composite resin 56.

Accordingly, in the fourth embodiment as well, the semiconductor light emitting device 6 having excellent electrostatic immunity can be provided without impeding the downsizing of the semiconductor light emitting device 6 in a chip size package structure.

In the semiconductor light emitting devices of the first, second, and fourth embodiments, the optical layer that is provided on the first surface 15a side of the semiconductor layer 15 is not limited to being a fluorescer layer and may be a scattering layer. Such a scattering layer includes a scattering member (for example, a titanium compound) having a multiple-particle configuration that scatters the radiated light of the light emitting layer 13, and a binder (e.g., a resin layer) that is formed in a single body with the multiple scattering members to transmit the radiated light of the light emitting layer 13.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

Fifth Embodiment

Figure 44A:
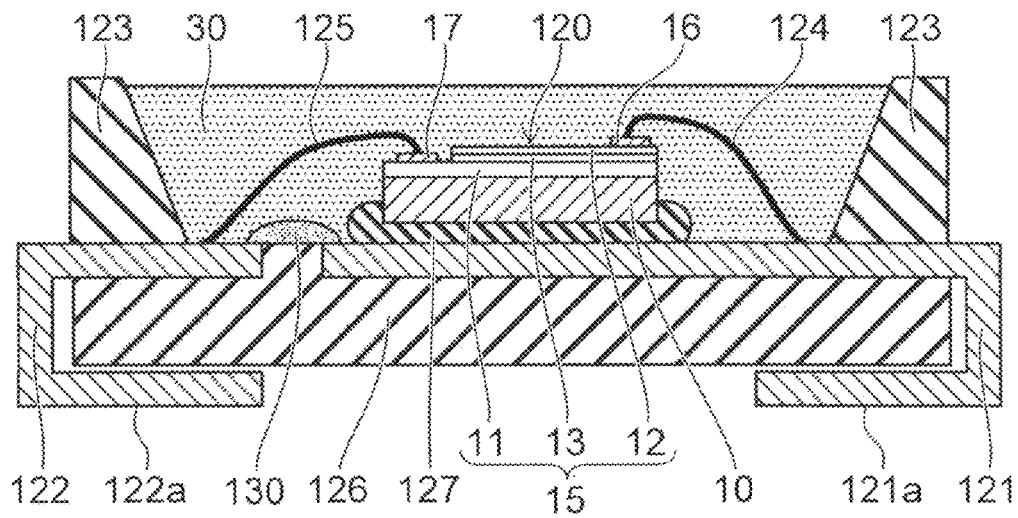
FIGS. 44A and 44B are schematic cross-sectional views of a semiconductor light emitting device of a fifth embodiment.
Figure 44B:
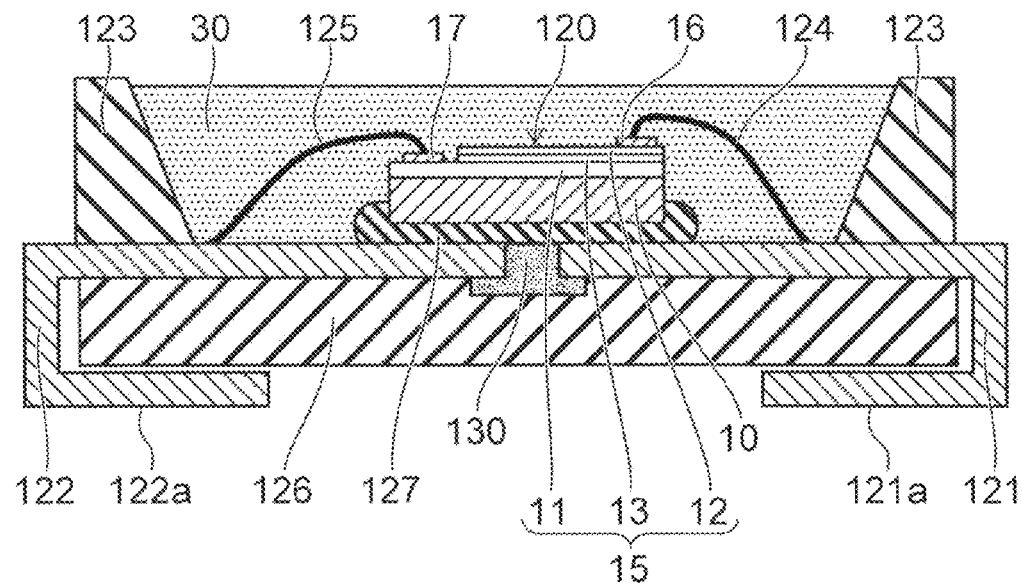

The composite resin having the varistor characteristic described above can be applied to the surface mounting type semiconductor light emitting device shown in FIGS. 44A and 44B as well.

An LED chip 120 is supported by a package which a lead frame (first interconnect unit) 121, a lead frame (second interconnect unit) 122, resins 126, 123 are integrally molded. The resins 126, 123 are white resins being reflective to emitted light from the LED chip 120 and the fluorescer. The resin 123 is provided on the lead frames 121, 122 and surrounds the LED chip 120.

The LED chip 120 includes the semiconductor layer 15, and the substrate (for example, sapphire substrate) 10 used for epitaxial growth of the semiconductor layer 15. The semiconductor layer 15 includes, for example, the first semiconductor layer 11 including n-type GaN, the second semiconductor layer 12 including p-type GaN, and the light emitting layer (active layer) 13 provided between the first semiconductor layer 11 and the second semiconductor layer 12.

The LED chip is mounted in a state of the substrate 10 facing the lead frame 121 side. The first semiconductor layer 11 is provided on the substrate 10, and the stacking film of the light emitting layer and the second semiconductor layer 13 is provided on the first semiconductor layer 11. The n-side electrode 17 is provided on the first semiconductor layer 11 and the p-side electrode 16 is provided on the second semiconductor layer. The transparent electrode connected to the p-side electrode 16 is provided on the upper surface of the second semiconductor layer 12.

The LED chip is mounted in the lead frame 121 via an adhesive 127. The p-side electrode 16 is connected to the lead frame 121 via a wire 124. The n-side electrode 17 is connected to the lead frame 122 via a wire 125. The lead frame 121 and the lead frame 122 are separated with insulation by a resin 126.

A p-side external terminal 121a is formed on a back side of the lead frame 121, and an n-side external terminal 122a is formed on a back side of the lead frame 122. The p-side external terminal 121a and the n-side external terminal 122a are bonded to a circuit board, for example, via the solder.

The fluorescer layer 30 is provided so as to cover the LED chip 120 in a region surrounded by a resin 123 above the lead frames 121, 122.

FIG. 44A shows an embodiment that a composite resin 130 is formed so as to bridge the p-side lead frame 121 to the n-side lead frame 122. The composite resin 130 has the varistor characteristic similar to the embodiment previously described. The composite resin 130 is formed on an upper surface side (fluorescer layer side) of the lead frames 121, 122. This embodiment can be manufactured by dispensing the composite resin 130 before or after the process of installing the LED chip 120.

Also in FIG. 44B, the composite resin 130 is formed so as to bridge the p-side lead frame 121 to the n-side lead frame 122. The composite resin 130 is formed on a white resin 126 side. This embodiment can be manufactured by forming the composite resin 130 after fabricating the lead frames 121, 122, and then shaping the white resin 126 by mold injection or the like. Use of a reflection resin for the adhesive 127 conceals the composite resin 130 behind the adhesive 127, and thereby optical loss can be avoided.

Here, the composite resin 130 includes powder having the varistor characteristic, and the powder is a polycrystalline powder body including, for example, zinc oxide as a main component and having the primary particles aggregated. Furthermore, the sizes of the primary particles are smaller than a gap (minimum distance) between the p-side lead frame (first interconnect unit) 121 and the n-side lead frame (second interconnect unit) 122.

What is claimed is:
1. An electronic device, comprising:
   a semiconductor unit having a first surface and a second surface, the second surface being on a side opposite to the first surface;

a first external terminal provided on the second surface side;

a second external terminal provided on the second surface side to be separated from the first external terminal;

a first interconnect member provided between the first external terminal and the semiconductor unit, the first interconnect member connecting the first external terminal and the semiconductor unit electrically;

a second interconnect member provided between the second external terminal and the semiconductor unit, the second interconnect member connecting the second external terminal and the semiconductor unit electrically;

an inorganic insulating film provided on a side surface of the semiconductor unit and on the second surface;

a sealing resin provided between the first interconnect member and the second interconnect member; and a composite resin provided between the inorganic insulating film and the sealing resin and between the first interconnect member and the second interconnect member, the composite resin provided to contact the first interconnect member and the second interconnect member the composite resin including:
  a resin component; and
  a first powder body dispersed in the resin component, the first powder body having a nonlinear current-voltage characteristic having a decreasing resistance as a voltage increases, the first powder body being a polycrystalline powder body including a plurality of primary particles bound via a grain boundary, a component different from a major component of the primary particles existing in a higher concentration in the grain boundary than in an interior of the primary particles, a path being formed inside the composite resin to connect the first interconnect member to the second interconnect member via the first powder body, the sealing resin not including the first powder body.

2. The device according to claim 1, wherein the first powder body contacts at least one selected from the first interconnect member and the second interconnect member.

3. The device according to claim 1, wherein
a second powder body also is dispersed in the resin component, a size of the second powder body being smaller than a size of the first powder body, the second powder body being conductive, and
a portion of the plurality of first powder bodies is connected to at least one selected from the first interconnect member and the second interconnect member via the second powder body.

4. The device according to claim 3, wherein the size of the second powder body is less than a distance between the first interconnect member and the second interconnect member.

5. The device according to claim 3, wherein the second powder bodies contact the first powder body, the first interconnect member, and the second interconnect member in a configuration of wetting onto the first powder body, the first interconnect member, and the second interconnect member by being melted.

6. The device according to claim 3, wherein the second powder body is not exposed to a surface of the composite resin.

7. The device according to claim 1, wherein the semiconductor unit includes a light emitting layer.

8. The device according to claim 7, wherein a metal film is provided on a surface of the primary particles, the metal film being reflective to light emitted from the light emitting layer.

9. The device according to claim 1, wherein
the first interconnect member includes a first interconnect layer and a first metal pillar provided on the first external terminal side; and
the second interconnect member includes a second interconnect layer and a second metal pillar provided on the second external terminal side.

10. The device according to claim 9, wherein a portion of the first interconnect layer and a portion of the second interconnect layer are provided to extend onto the composite resin.

11. The device according to claim 10, wherein a size of the first powder body is greater than a distance between the portion of the first interconnect layer and the portion of the second interconnect layer extending onto the composite resin.

12. The device according to claim 9, wherein
the composite resin is provided to contact a surface of the first interconnect layer, the surface opposing to the second surface of the semiconductor unit, and a surface of the second interconnect layer, the surface opposing to the second surface of the semiconductor unit.

13. The device according to claim 9, wherein
the composite resin is provided to contact a surface of the first metal pillar side of the first interconnect layer, and a surface of the second metal pillar side of the second interconnect layer.

14. The device according to claim 9, wherein
the composite resin is provided between the inorganic insulating film and the first interconnect layer and between the inorganic insulating film and the second interconnect layer.

15. The device according to claim 1, wherein a size of the primary particles is less than a distance between the first interconnect member and the second interconnect member.

16. The device according to claim 1, wherein the sealing resin is further provided on the side surface of the semiconductor unit.

* * * * *